(12) United States Patent
Murooka

(10) Patent No.: US 9,209,389 B2
(45) Date of Patent: *Dec. 8, 2015

(54) MEMORY DEVICE AND FABRICATING METHOD THEREOF

(71) Applicant: Kabushiki Kaisha Toshiba, Minato-ku (JP)

(72) Inventor: Kenichi Murooka, San Jose, CA (US)

(73) Assignee: Kabushiki Kaisha Toshiba, Minato-ku (JP)

( * ) Notice: Subject to any disclaimer, the term of this patent is extended or adjusted under 35 U.S.C. 154(b) by 114 days.

This patent is subject to a terminal disclaimer.

(21) Appl. No.: 14/038,109

(22) Filed: Sep. 26, 2013

(65) Prior Publication Data

US 2014/0027707 A1 Jan. 30, 2014

Related U.S. Application Data

(63) Continuation of application No. 13/177,857, filed on Jul. 7, 2011, now Pat. No. 8,570,786.

(51) Int. Cl.
*G11C 11/00* (2006.01)
*H01L 45/00* (2006.01)
*H01L 27/24* (2006.01)
*G11C 13/00* (2006.01)

(52) U.S. Cl.
CPC .......... *H01L 45/122* (2013.01); *G11C 13/0002* (2013.01); *H01L 27/2409* (2013.01); *H01L 27/2463* (2013.01); *H01L 27/2481* (2013.01); *H01L 45/04* (2013.01); *H01L 45/124* (2013.01); *H01L 45/146* (2013.01); *H01L 45/147* (2013.01); *H01L 45/1691* (2013.01); *G11C 2213/71* (2013.01)

(58) Field of Classification Search
CPC .......... G11C 13/0069; G11C 13/0004; G11C 13/0007
USPC .......................................... 365/148, 163, 175
See application file for complete search history.

(56) References Cited

U.S. PATENT DOCUMENTS

| | | | |
|---|---|---|---|
| 6,178,112 B1 * | 1/2001 | Bessho et al. | ................. 365/173 |
| 7,719,875 B2 | 5/2010 | Toda et al. | |
| 7,825,408 B2 | 11/2010 | Kaeriyama et al. | |
| 7,859,884 B2 | 12/2010 | Scheuerlein | |

(Continued)

FOREIGN PATENT DOCUMENTS

| | | |
|---|---|---|
| JP | 2009-65184 | 3/2009 |
| JP | 2009-212245 | 9/2009 |

(Continued)

*Primary Examiner* — Son Dinh
(74) *Attorney, Agent, or Firm* — Oblon, McClelland, Maier & Neustadt, L.L.P.

(57) ABSTRACT

According to one embodiment, a memory device includes first interconnects, second interconnects, and a first memory cell. The first memory cell is located in an intersection of one of the first interconnects and one of the second interconnects. The first memory cell includes a first multilayer structure and a first variable resistance layer, the first multilayer structure including a first electrode, a first selector, and a first insulator which are stacked. The first selector and the first variable resistance layer are electrically connected in series between the one of the first interconnect and the one of the second interconnect. The first variable resistance layer is formed on a portion of a side surface of the first insulator to cover the portion without covering a residual portion.

10 Claims, 46 Drawing Sheets

(56) References Cited

U.S. PATENT DOCUMENTS

| | | |
|---|---|---|
| 8,406,034 B2 | 3/2013 | Murooka |
| 2009/0174519 A1 | 7/2009 | Mikawa et al. |
| 2010/0038619 A1 | 2/2010 | Tada et al. |
| 2010/0176365 A1 | 7/2010 | Park et al. |
| 2011/0037046 A1 | 2/2011 | Sato et al. |

FOREIGN PATENT DOCUMENTS

| | | |
|---|---|---|
| JP | 2010-225872 | 10/2010 |
| JP | 2011-18838 | 1/2011 |
| JP | 2011-40483 | 2/2011 |
| JP | 2011-40579 | 2/2011 |

\* cited by examiner

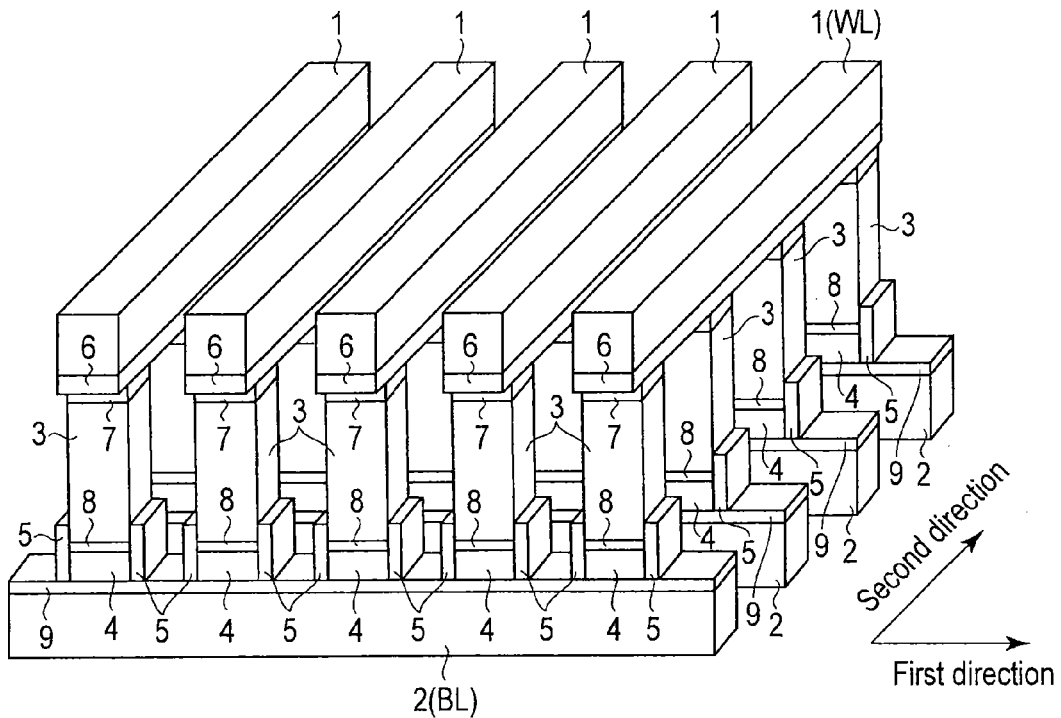
F I G. 1
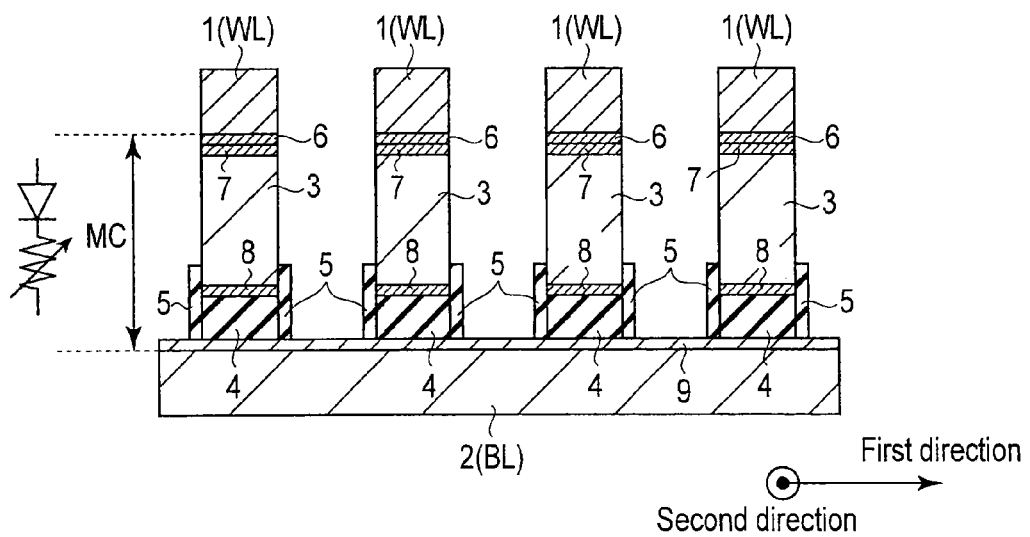
F I G. 2

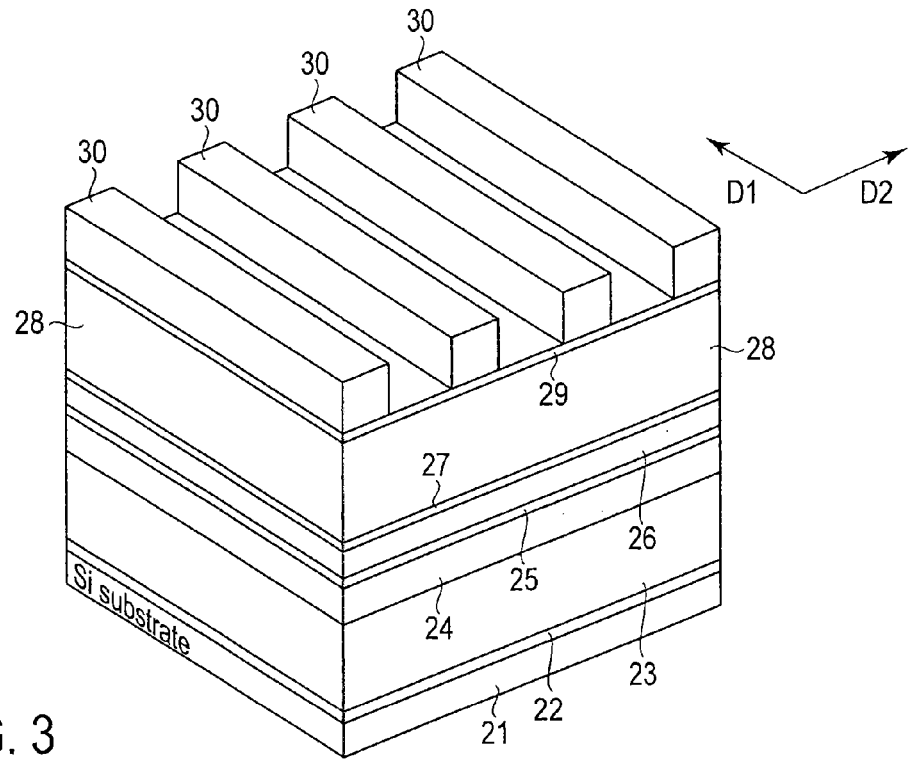
F I G. 3
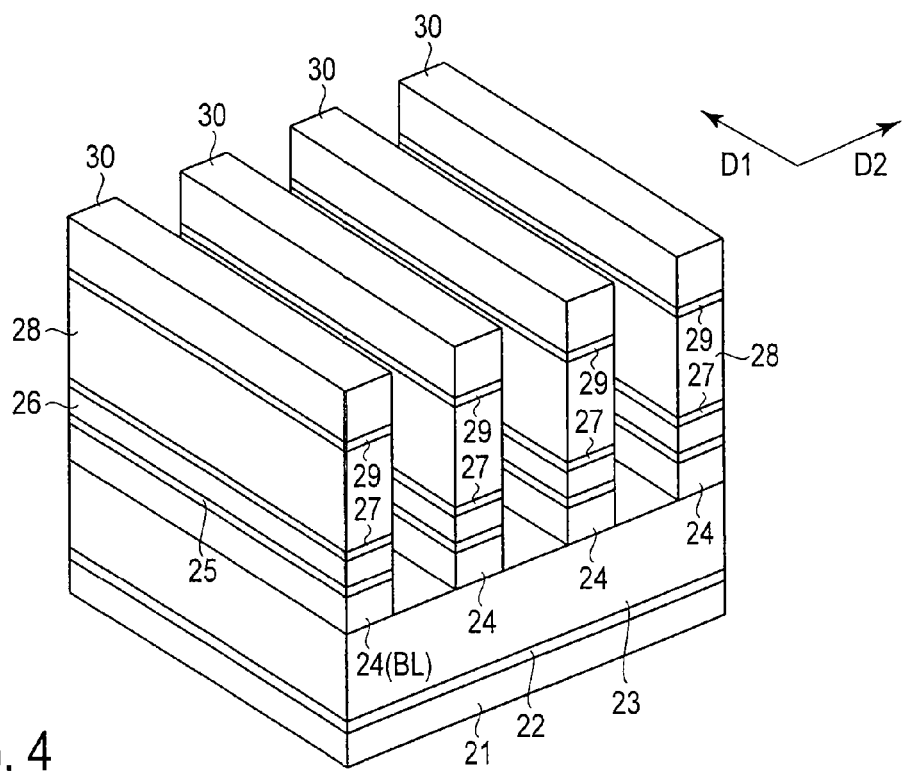
F I G. 4

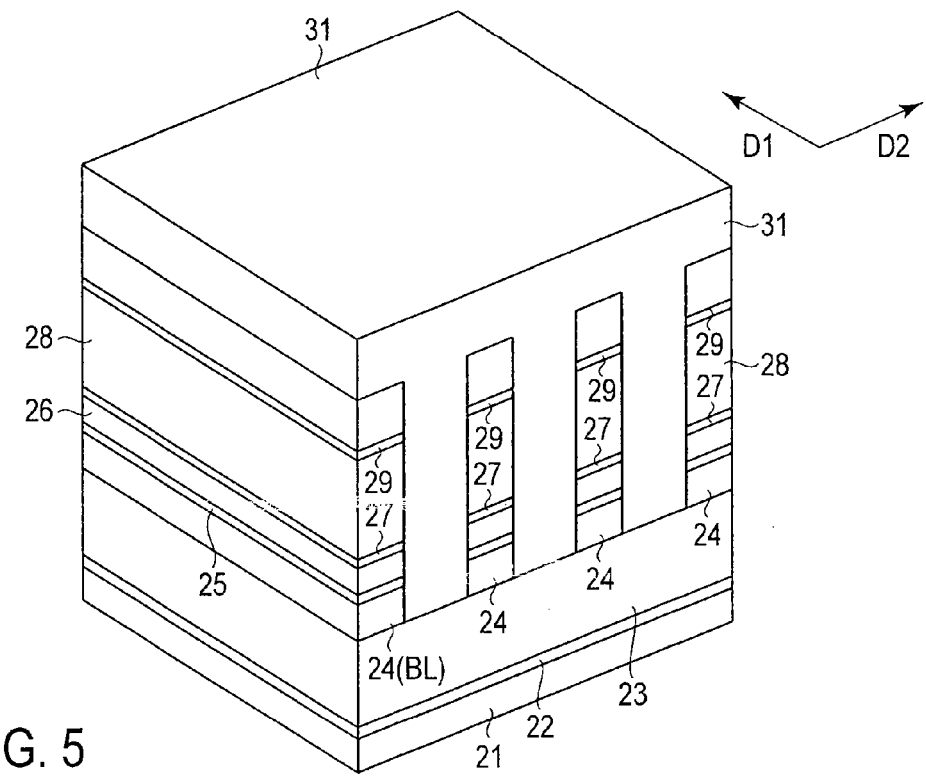
F I G. 5
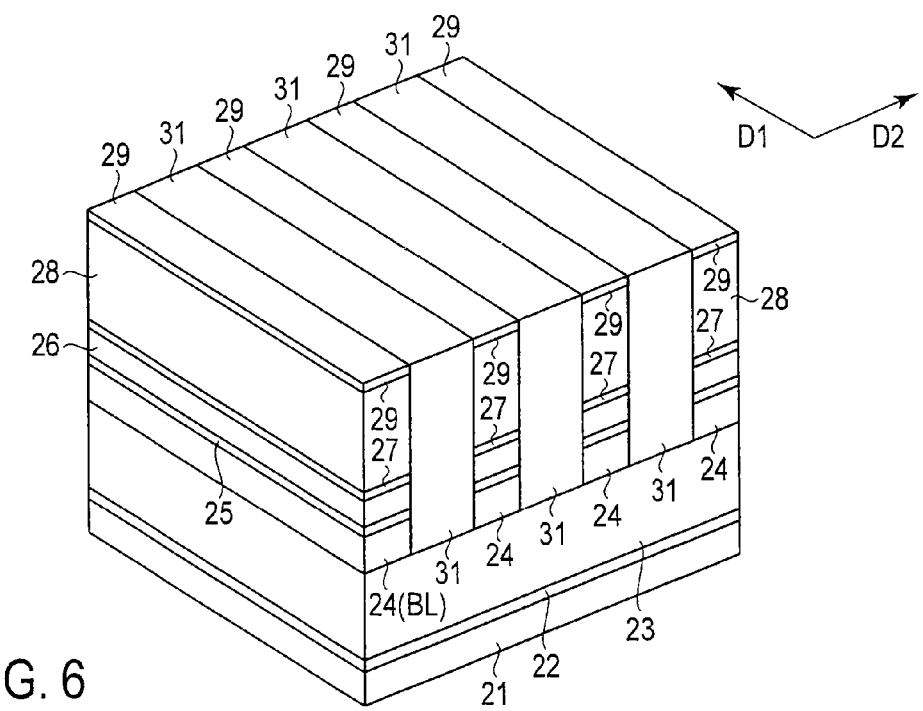
F I G. 6

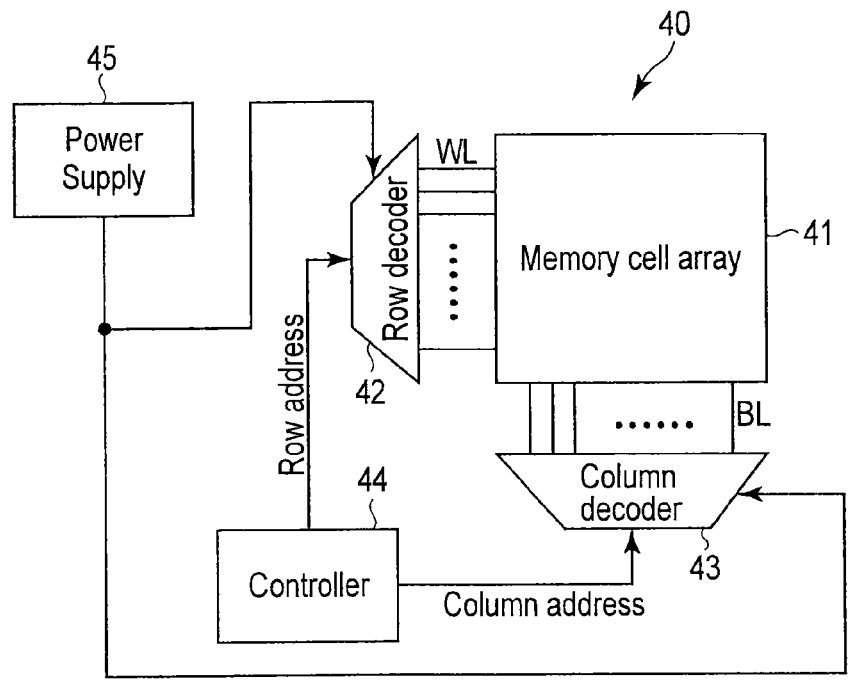
F I G. 11
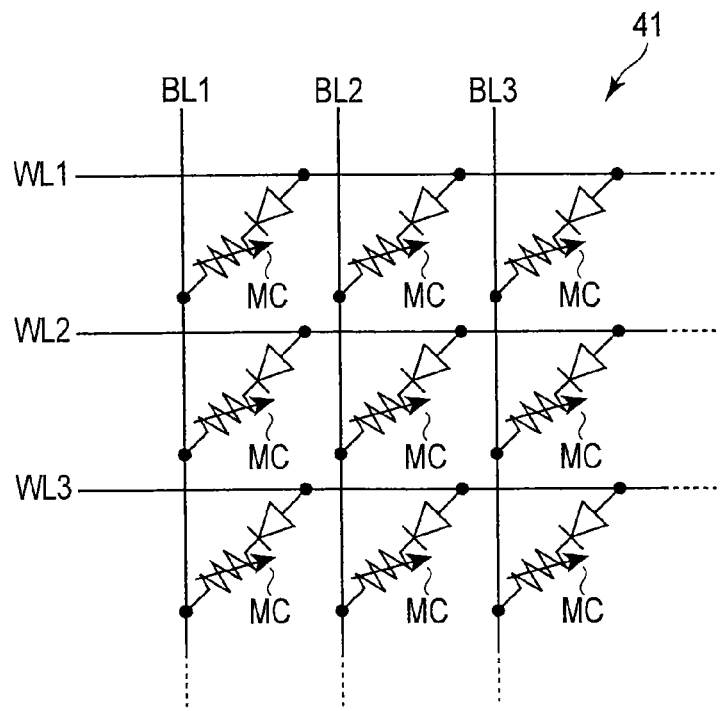
F I G. 12

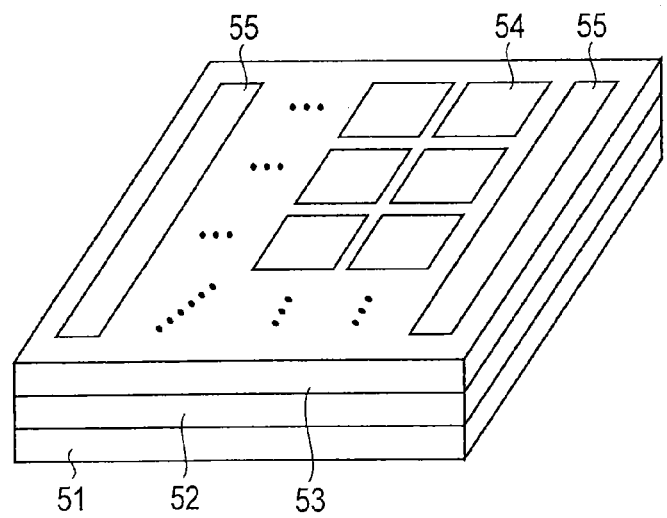
F I G. 13
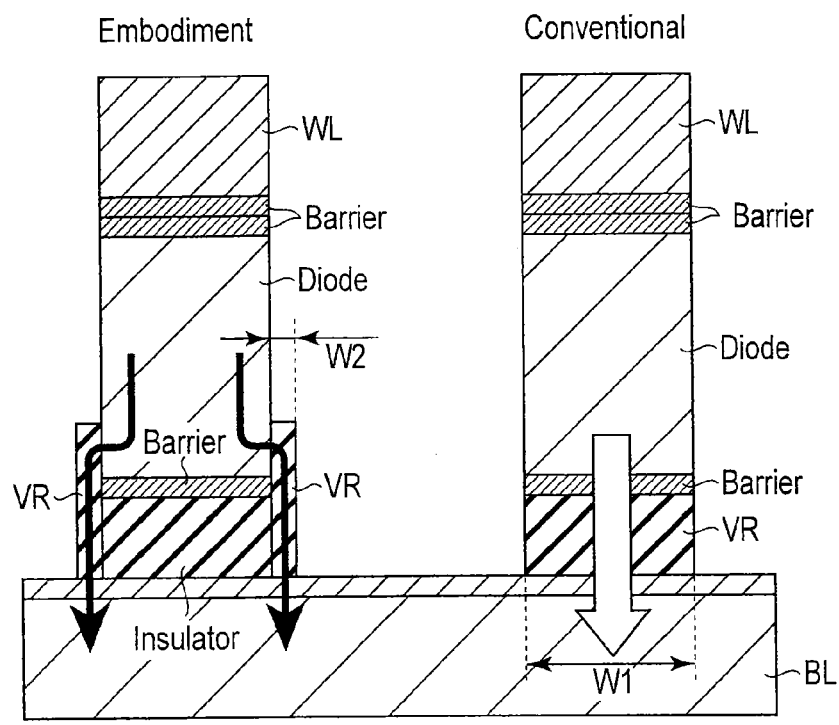
F I G. 14

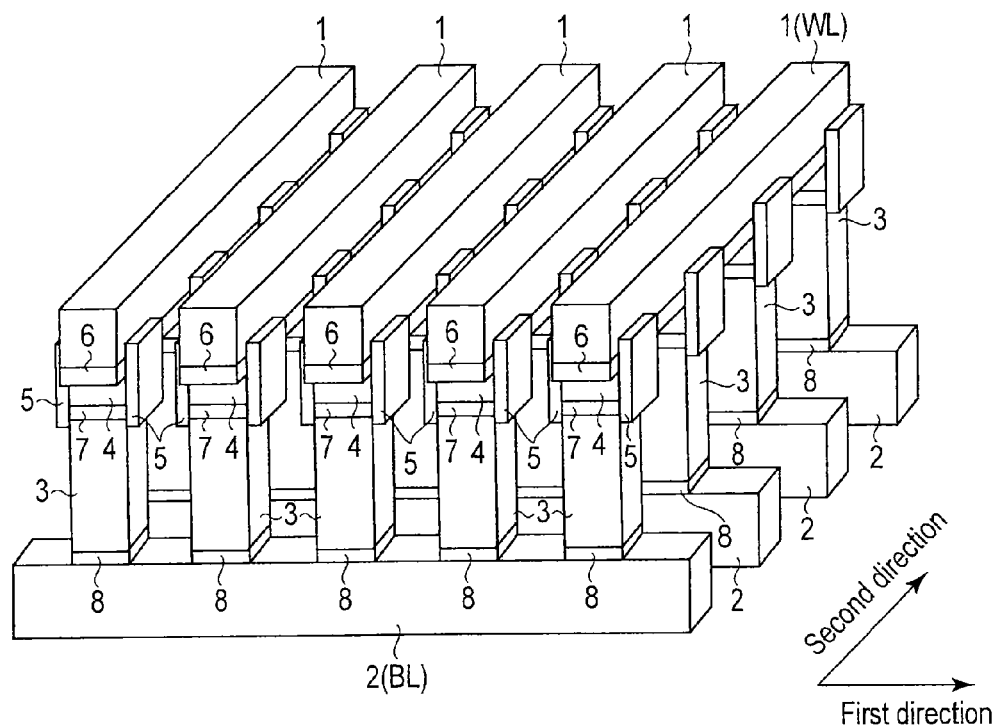
F I G. 2 3
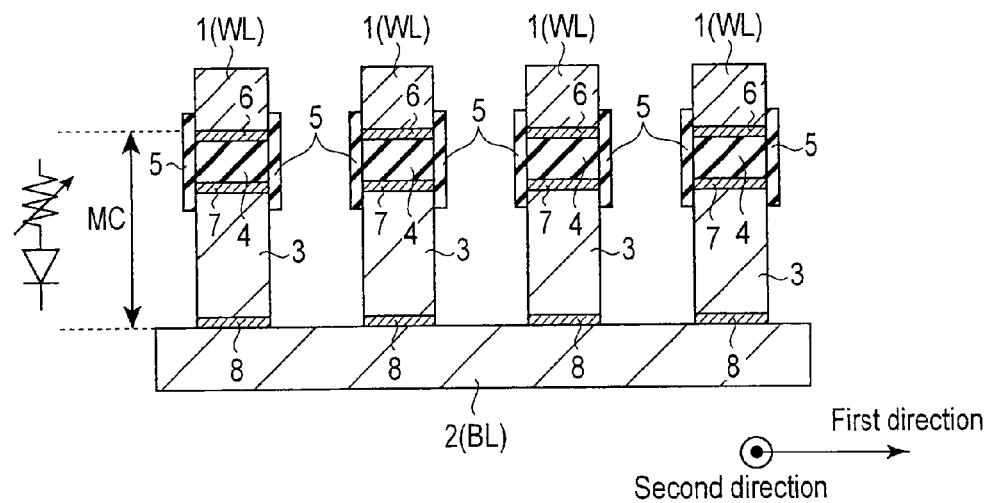
F I G. 2 4

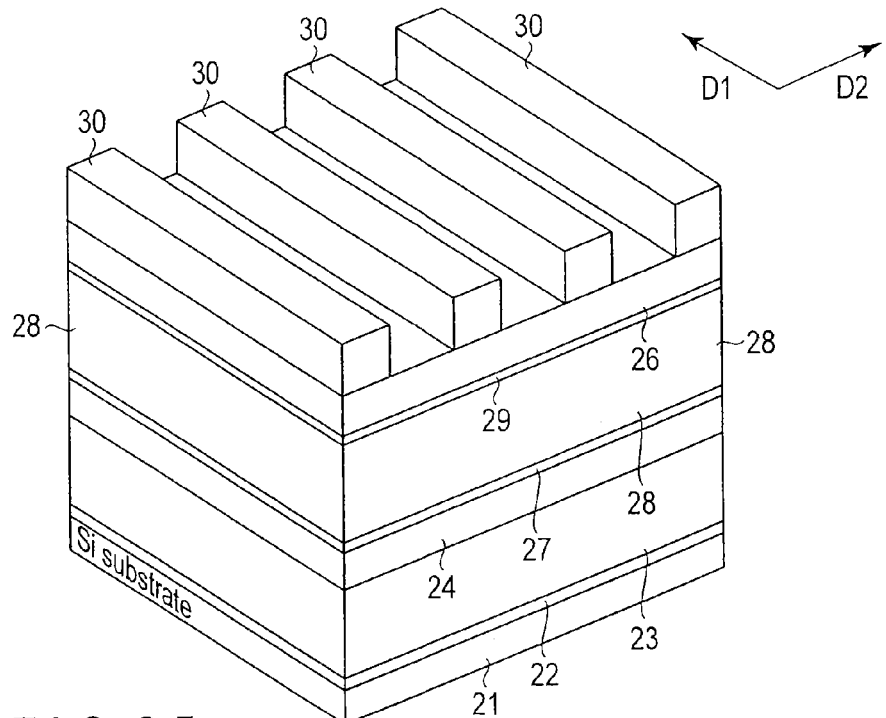
F I G. 25
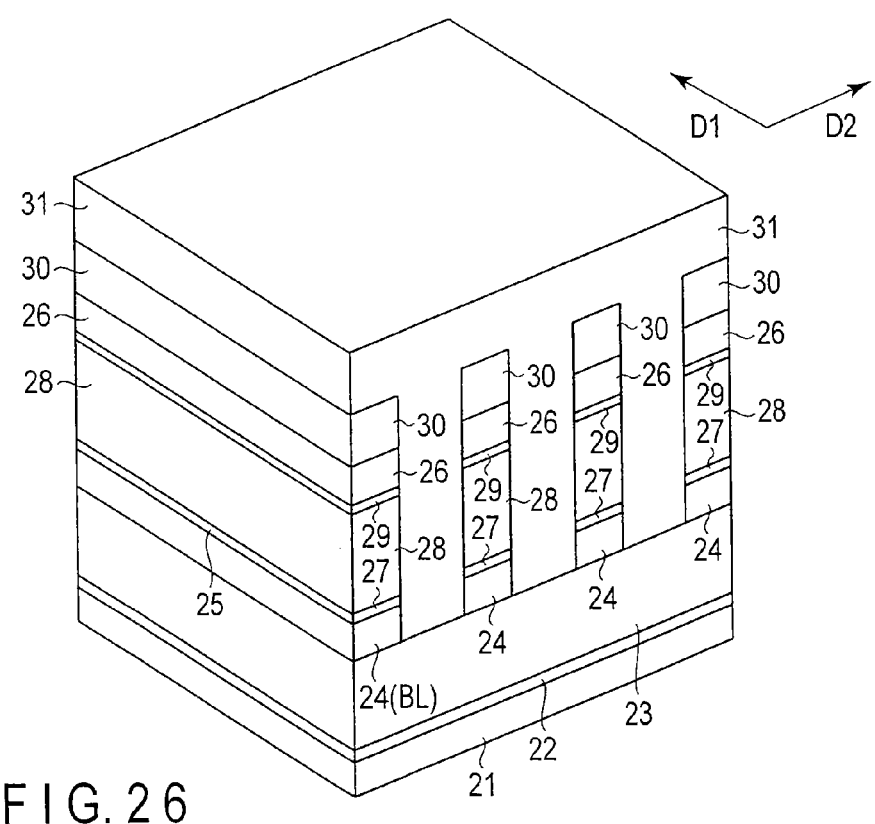
F I G. 26

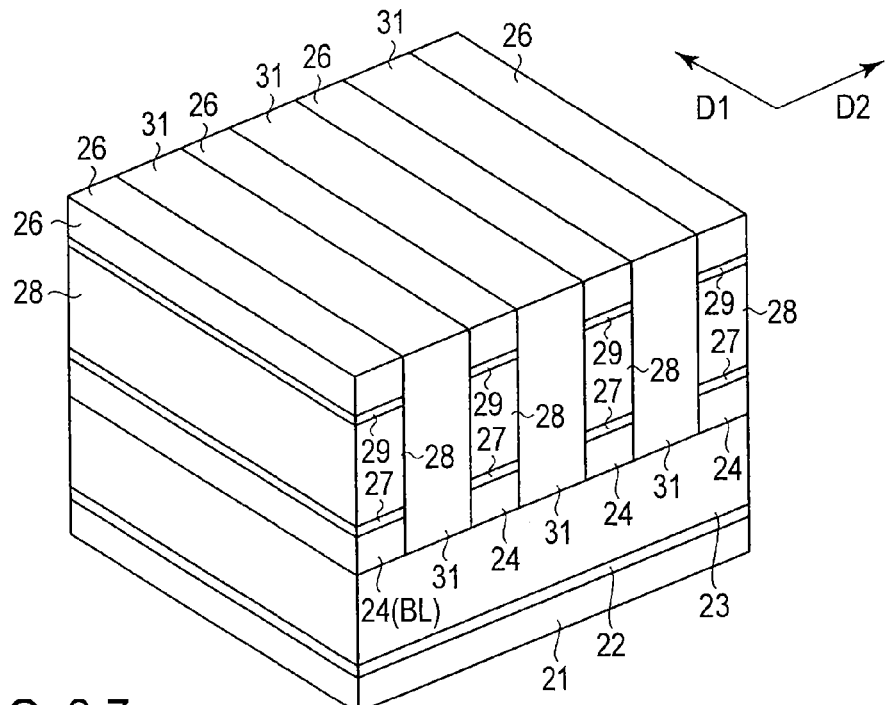
F I G. 2 7
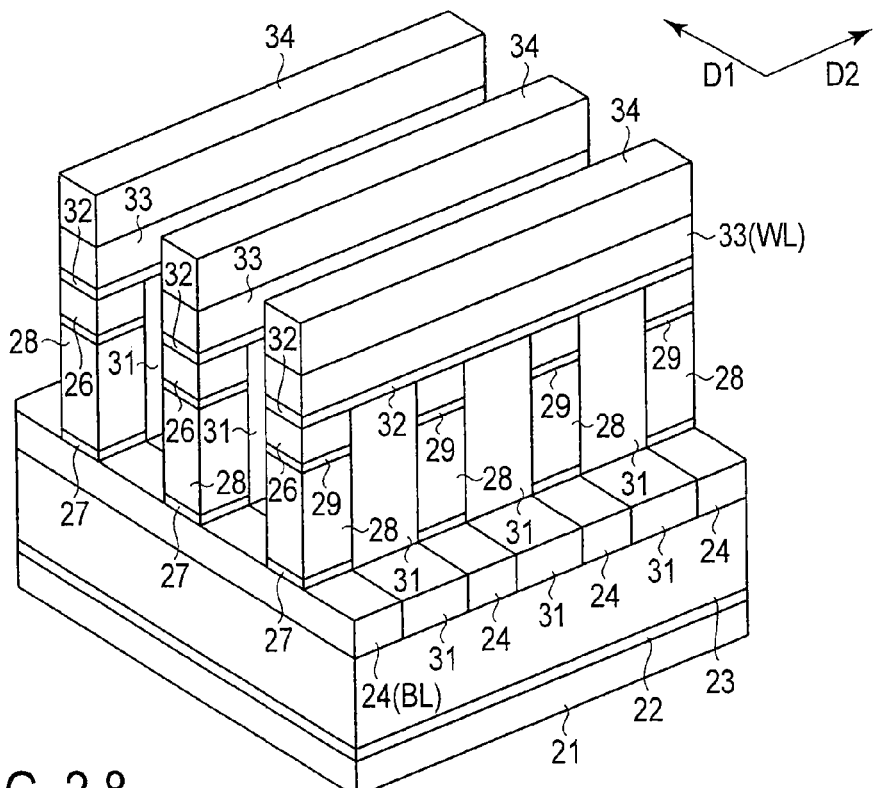
F I G. 2 8

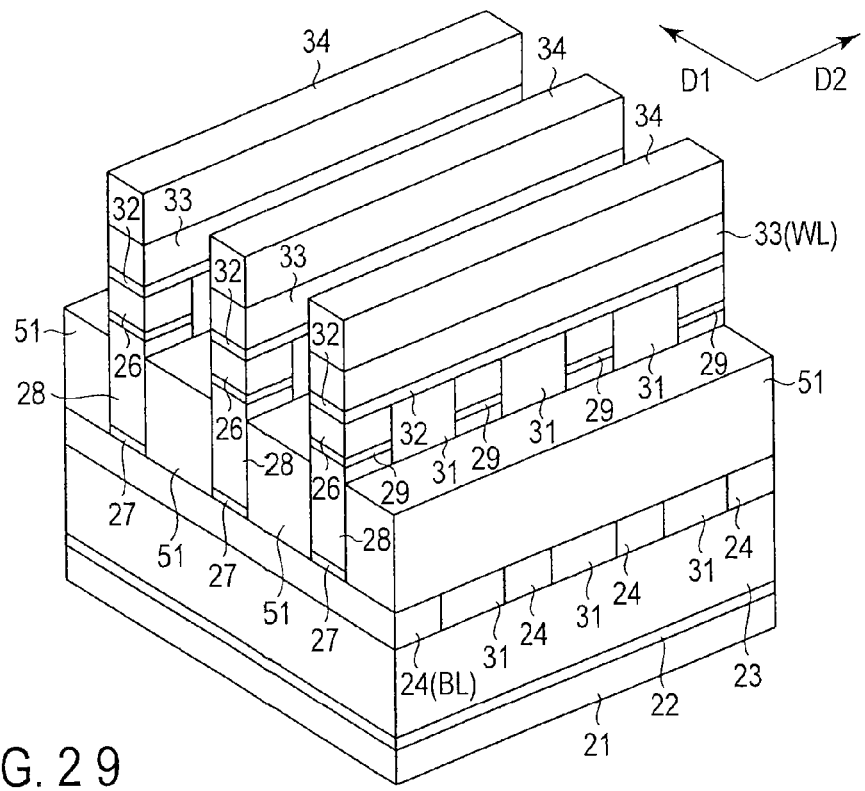
F I G. 29
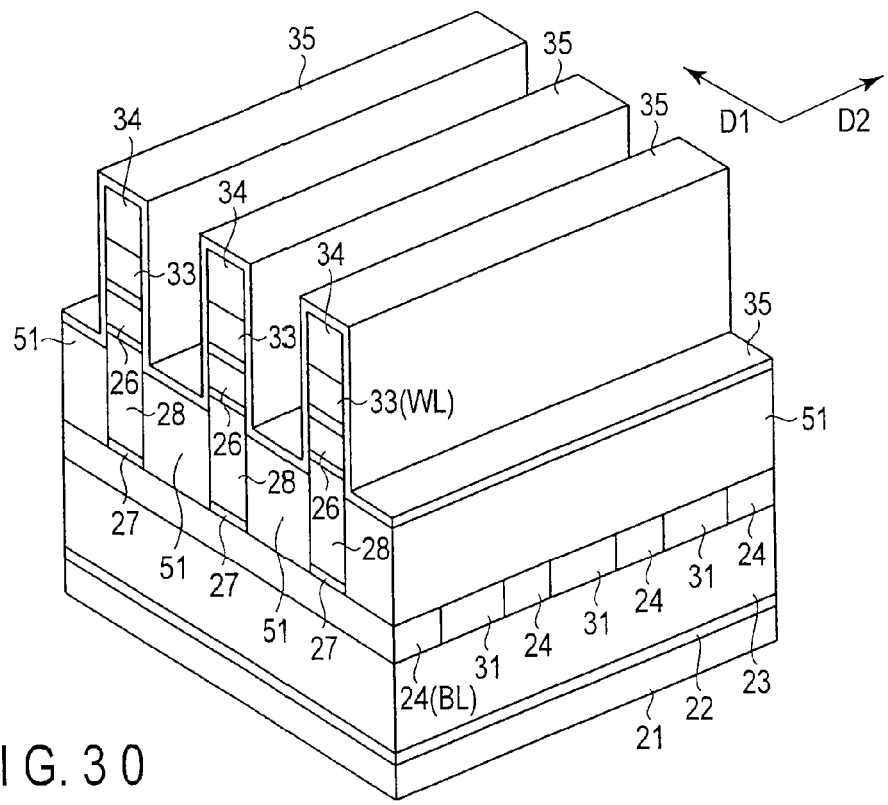
F I G. 30

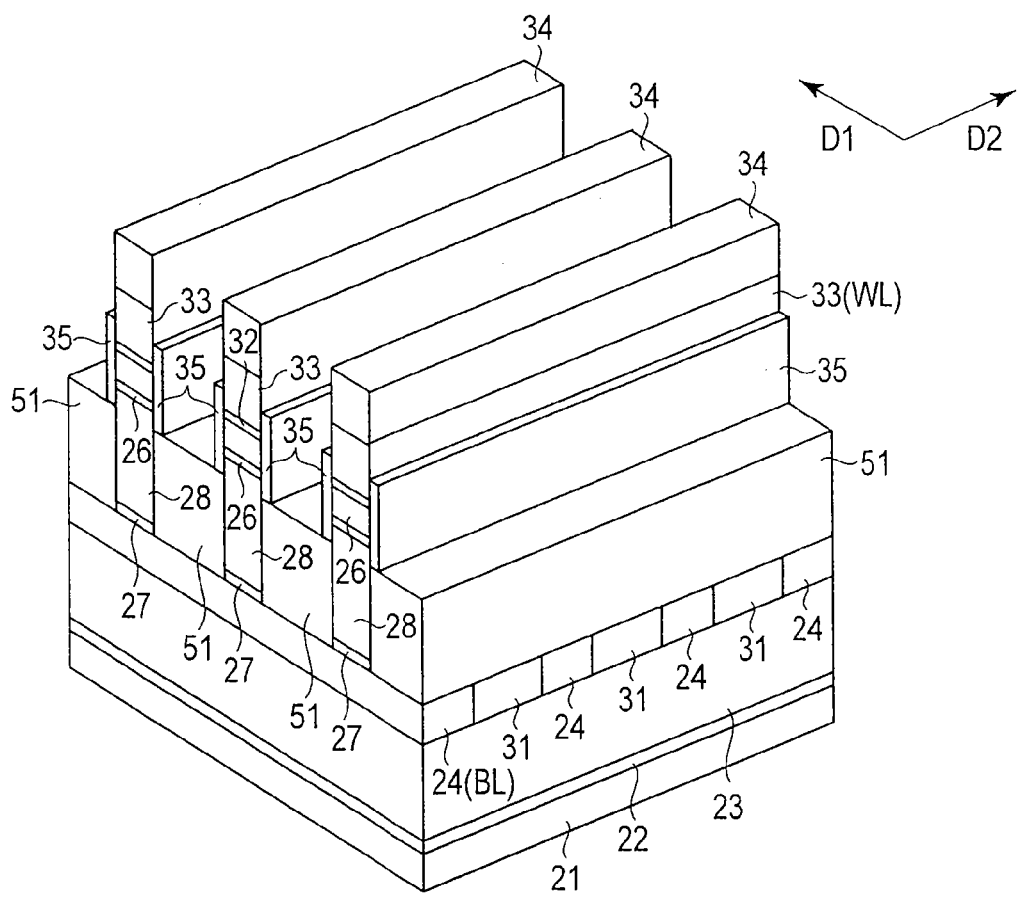
F I G. 3 1

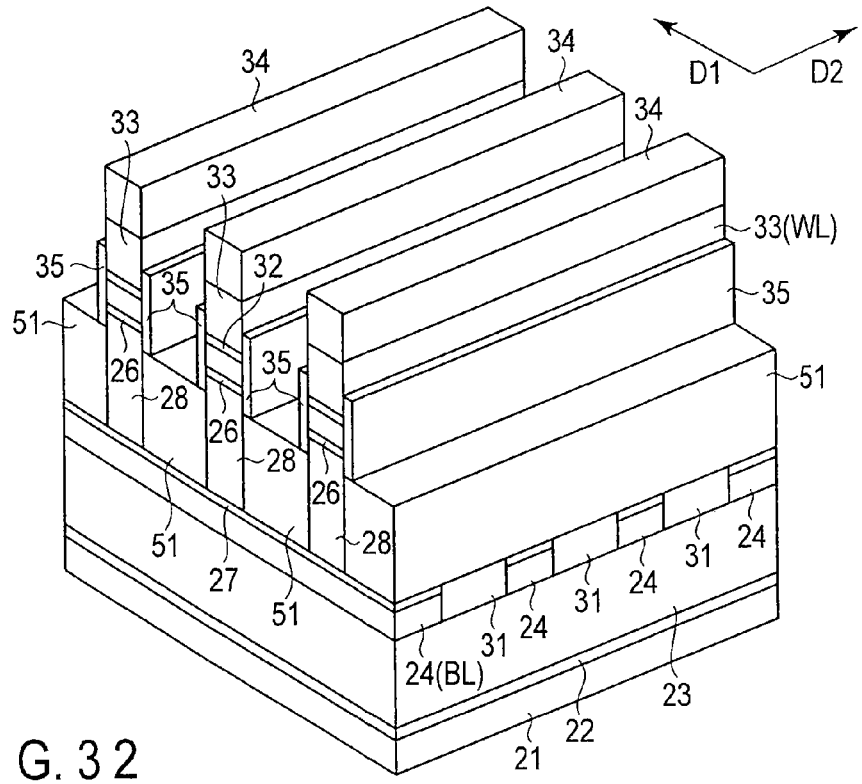
F I G. 3 2
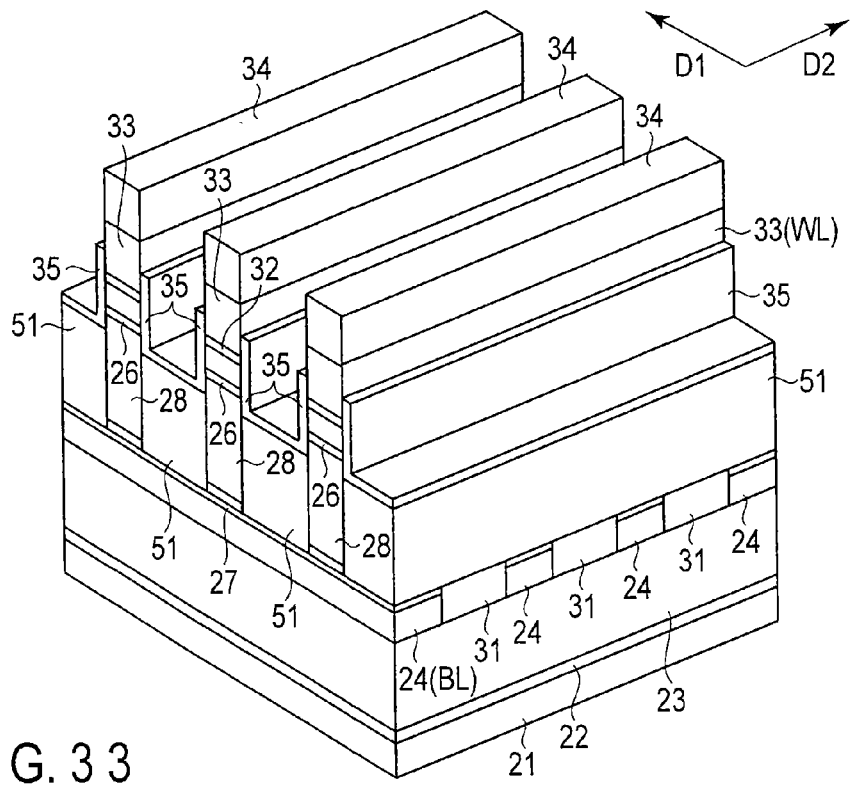
F I G. 3 3

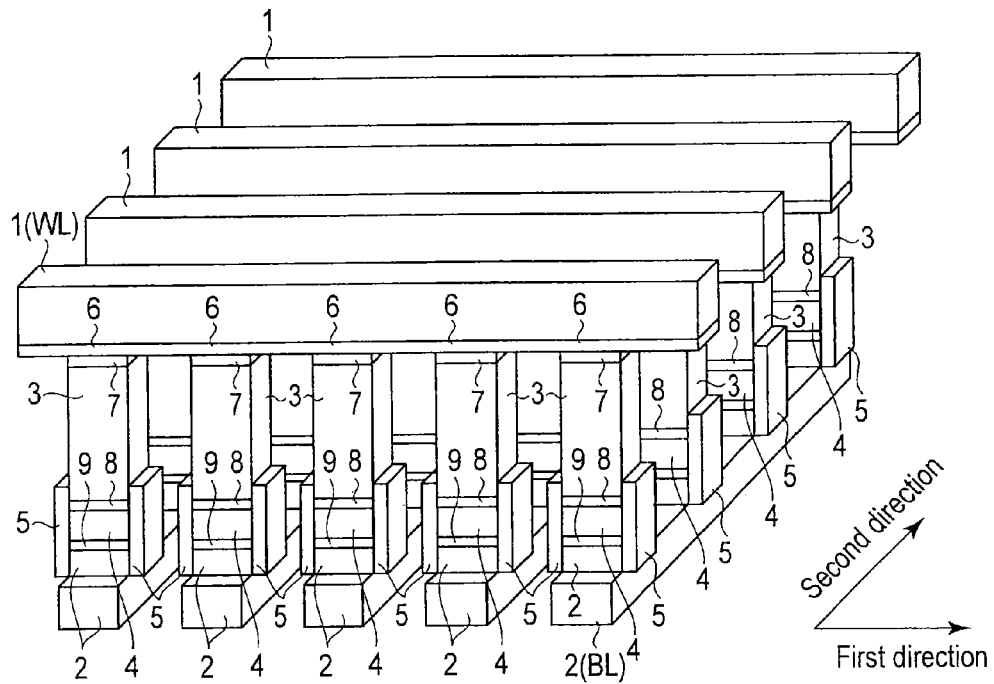
F I G. 34
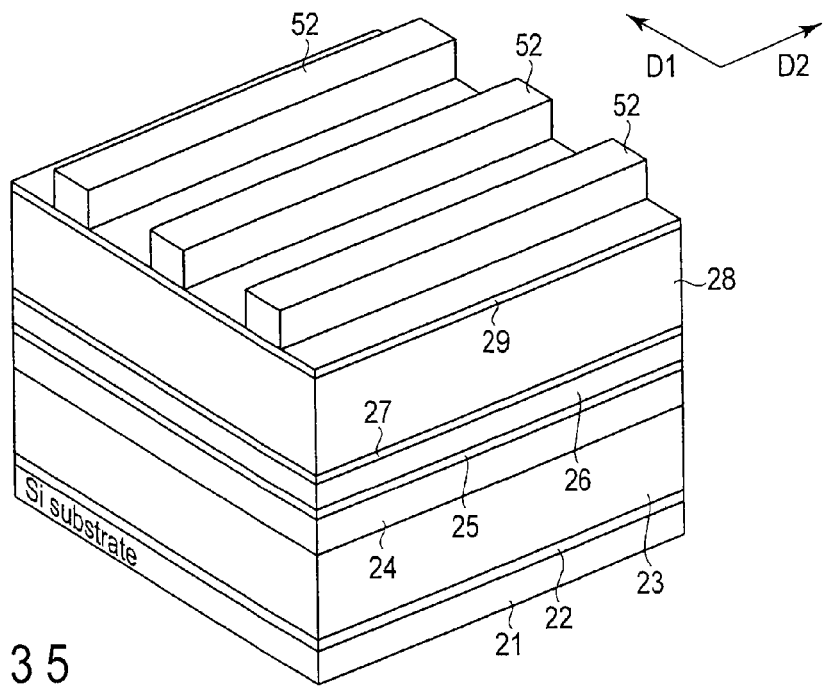
F I G. 35

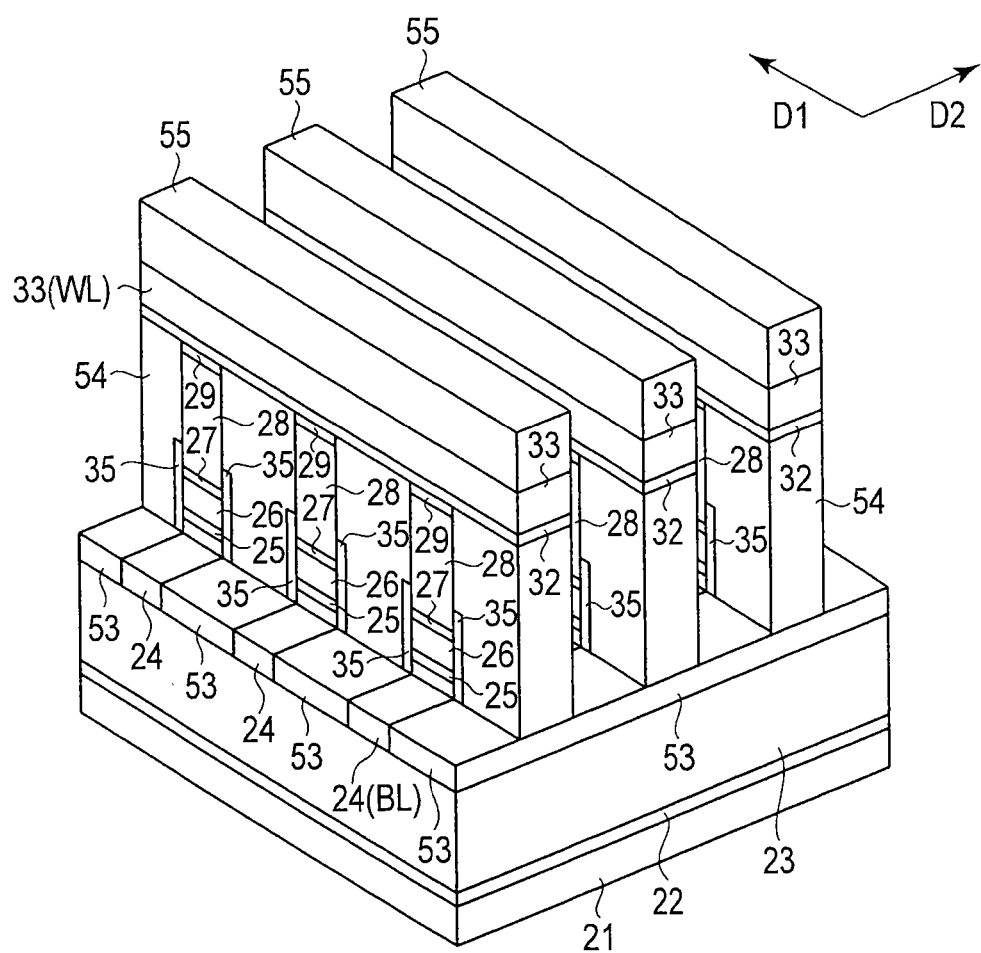
F I G. 4 2

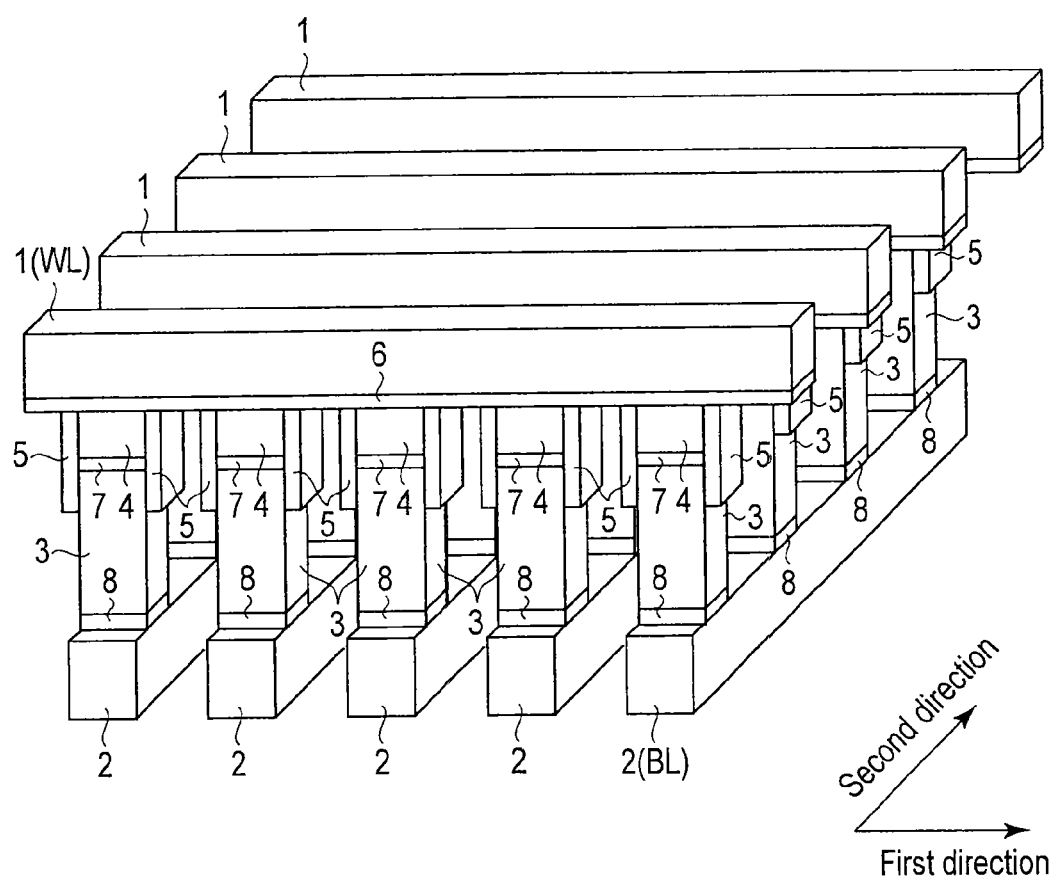
F I G. 43

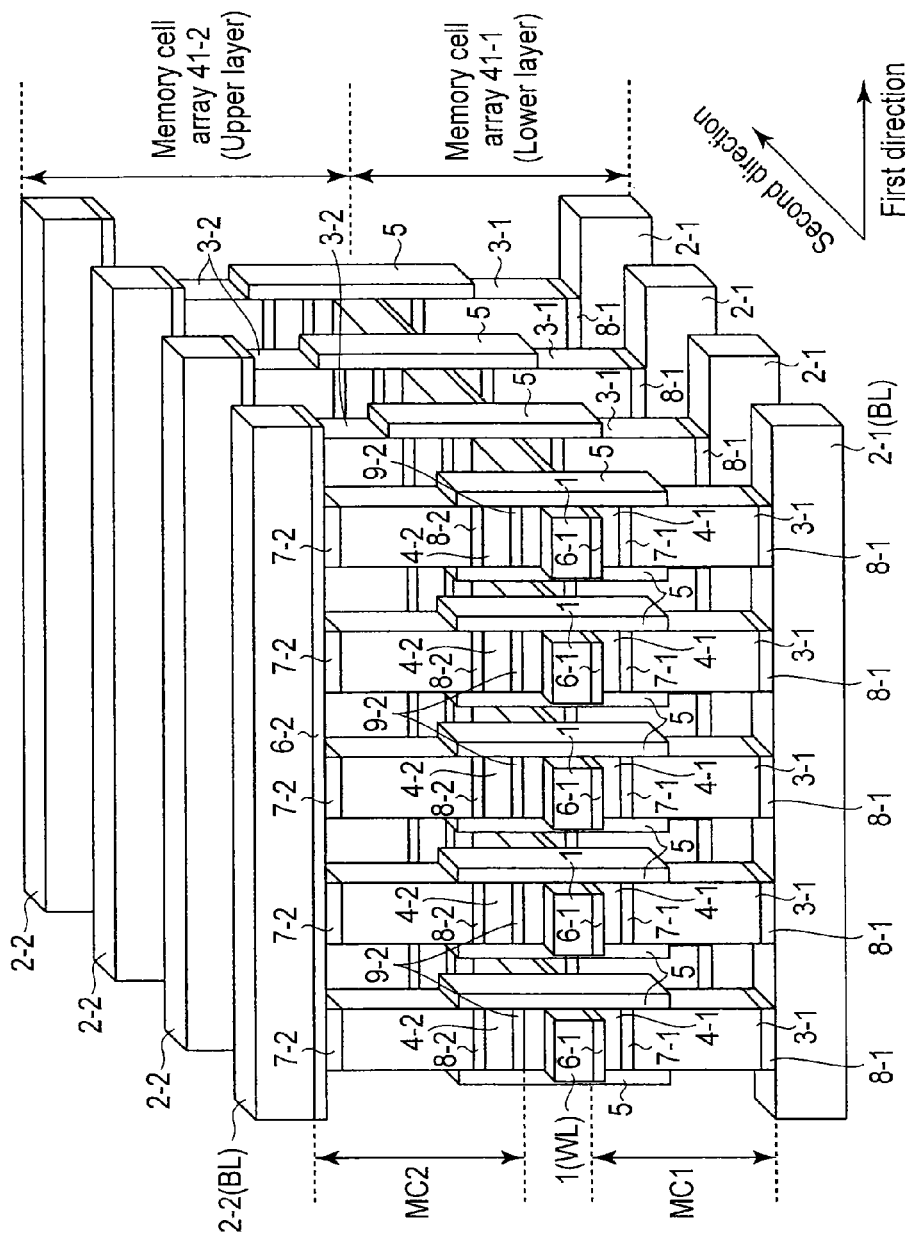
F I G. 44

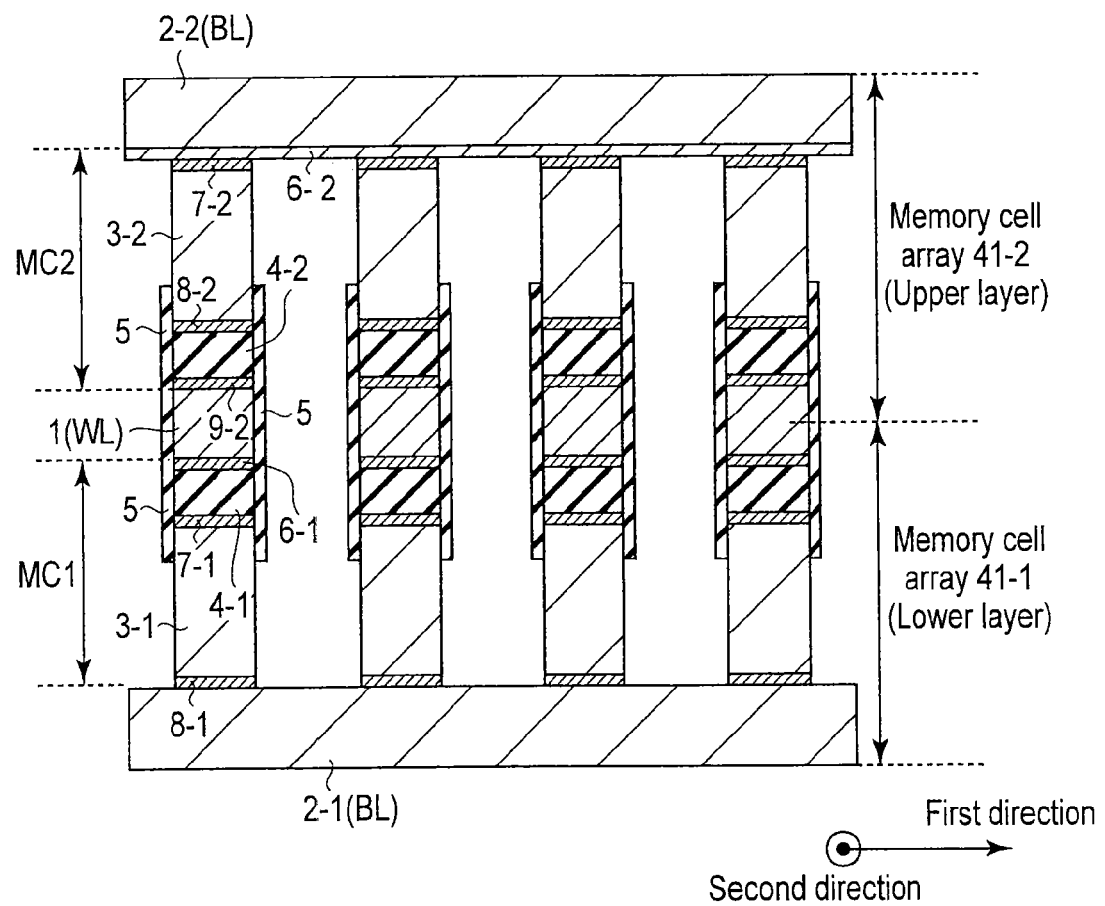
F I G. 45

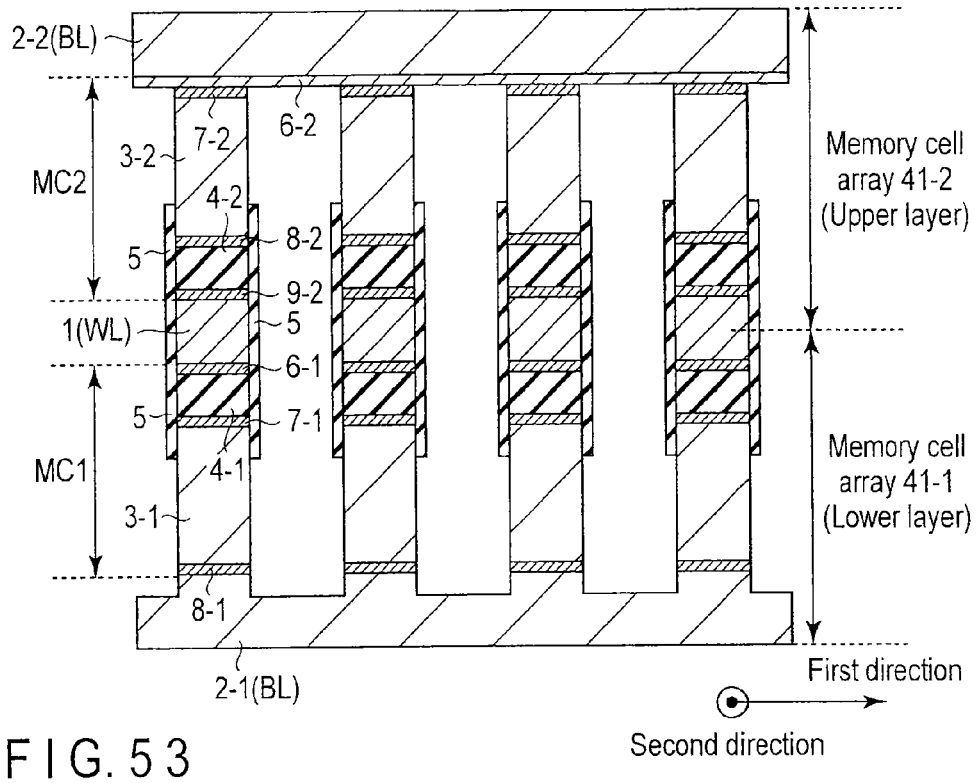
F I G. 5 3
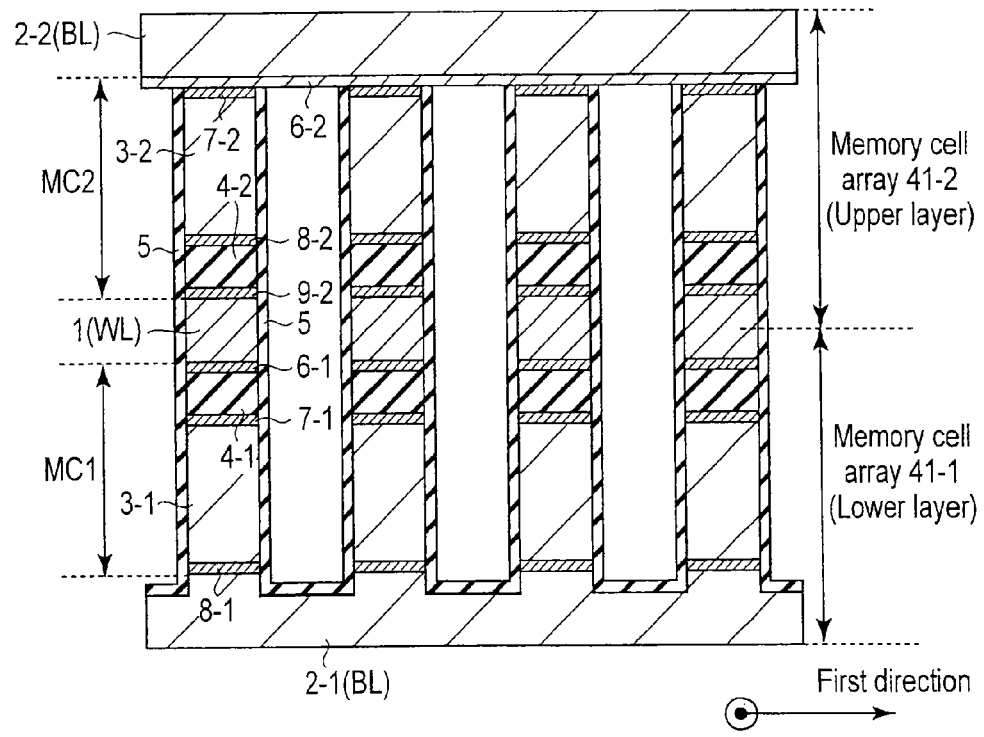
F I G. 5 4

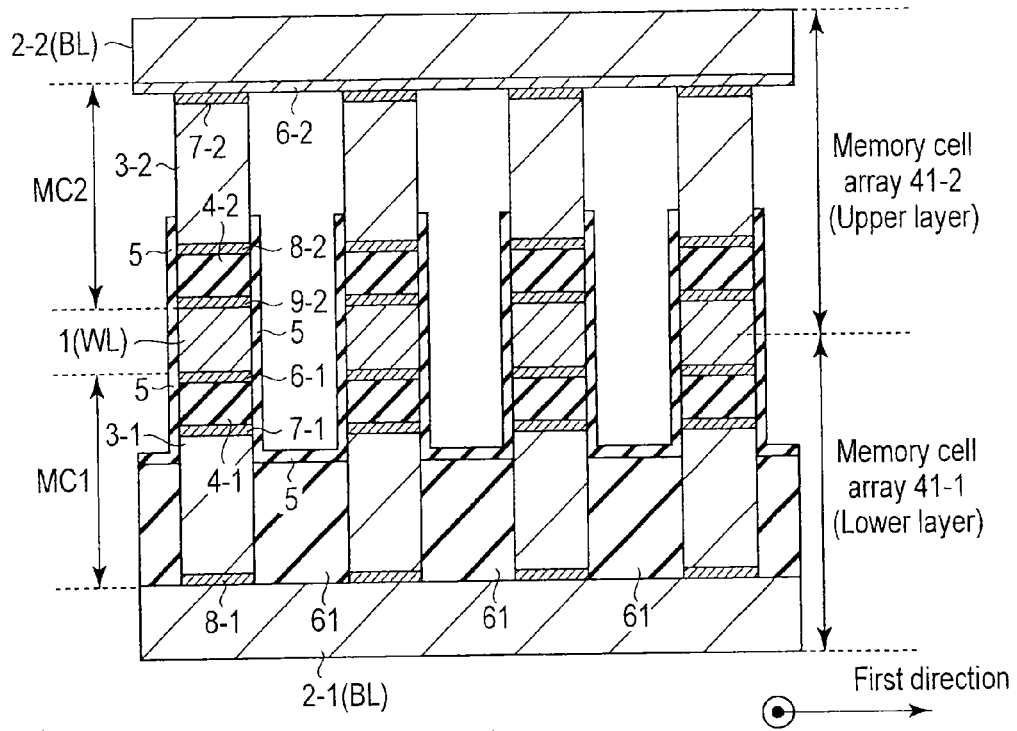
F I G. 5 5
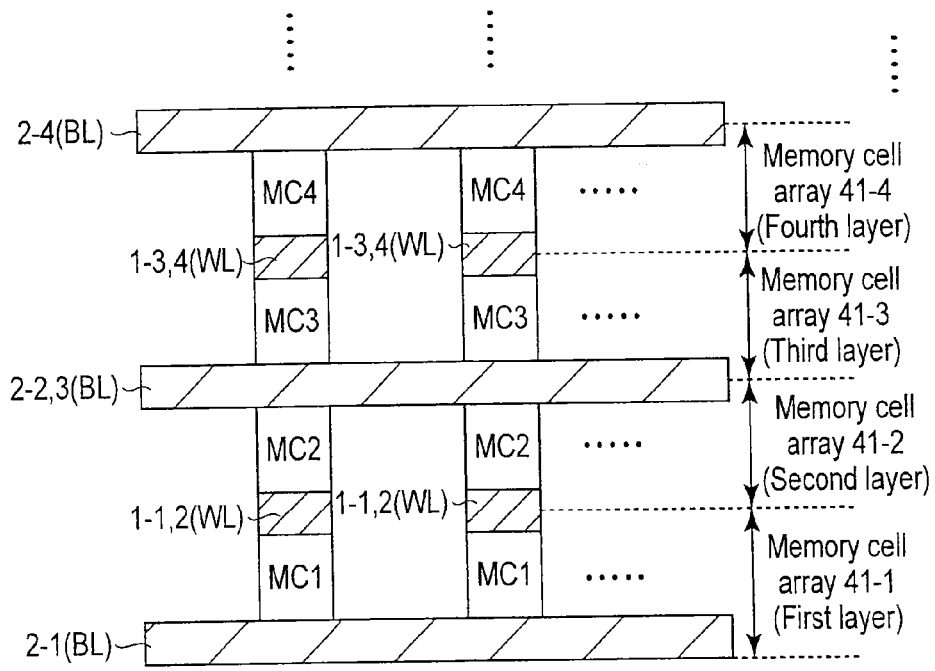
F I G. 5 6

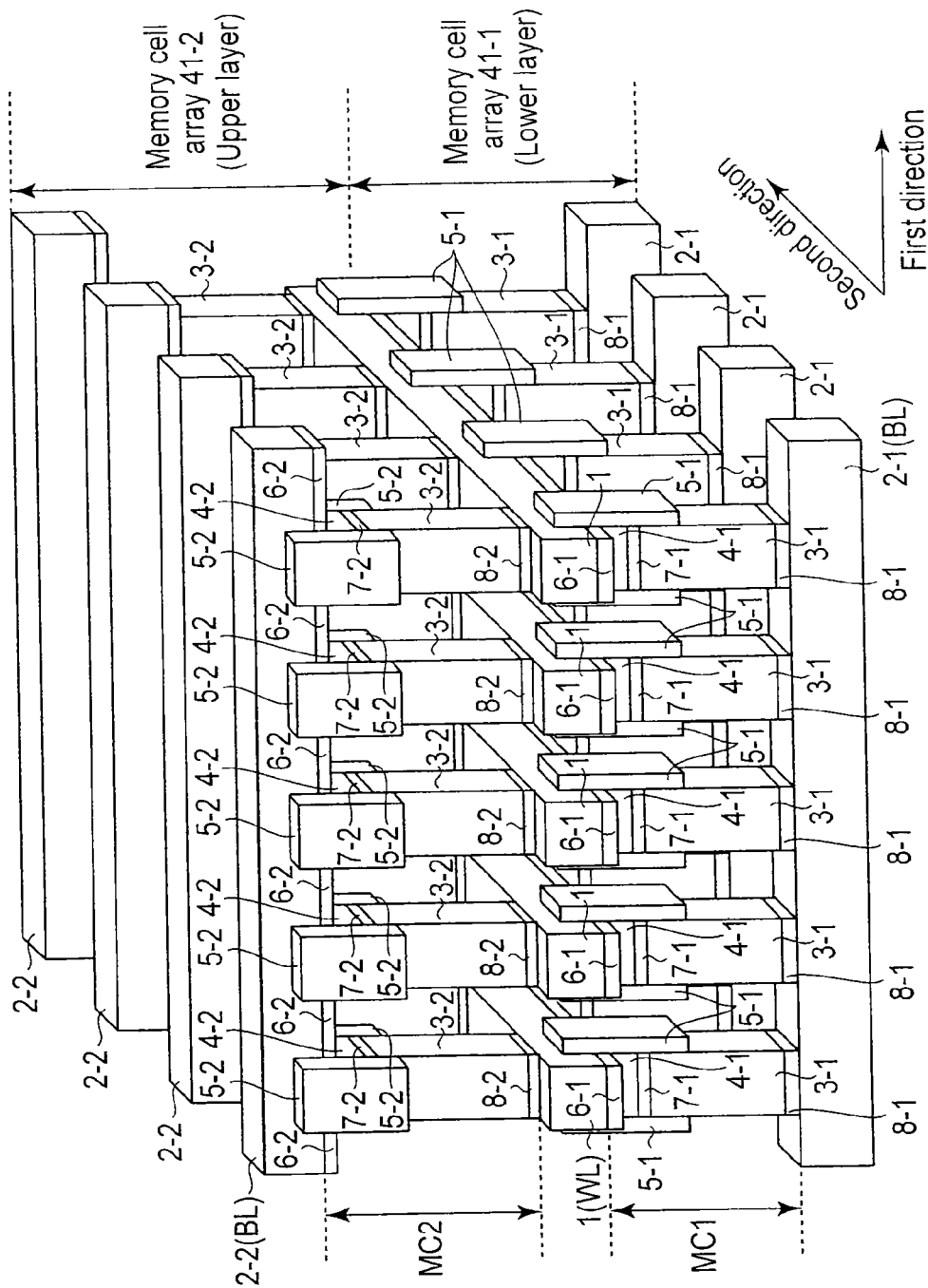
F I G. 57

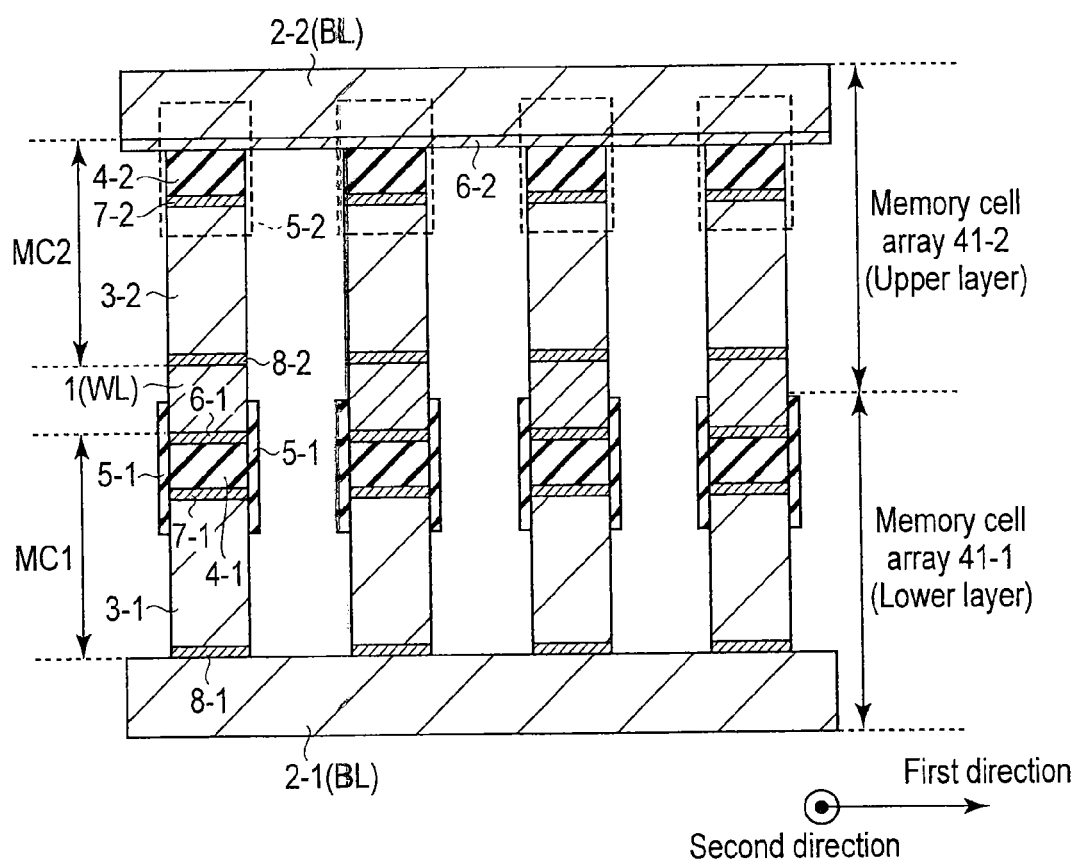
F I G. 5 8

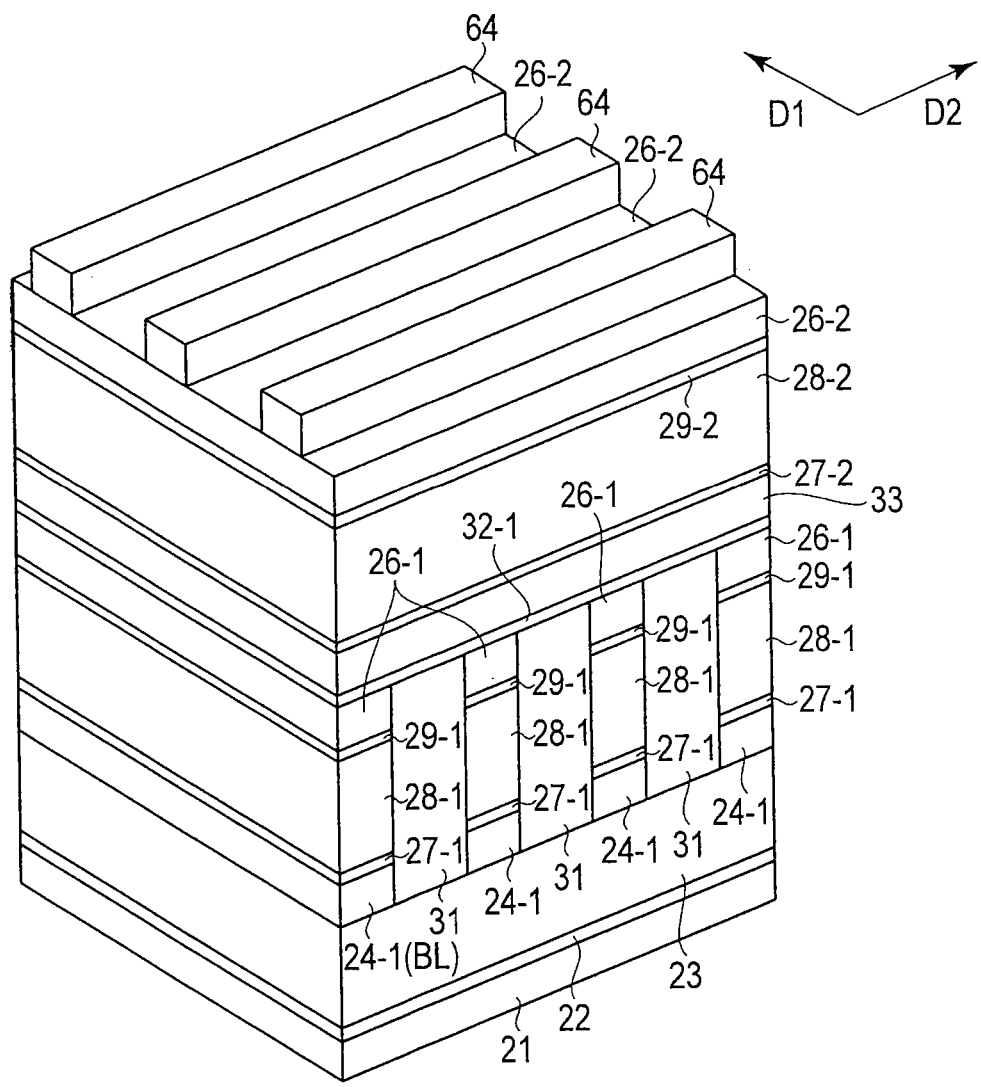
F I G. 59

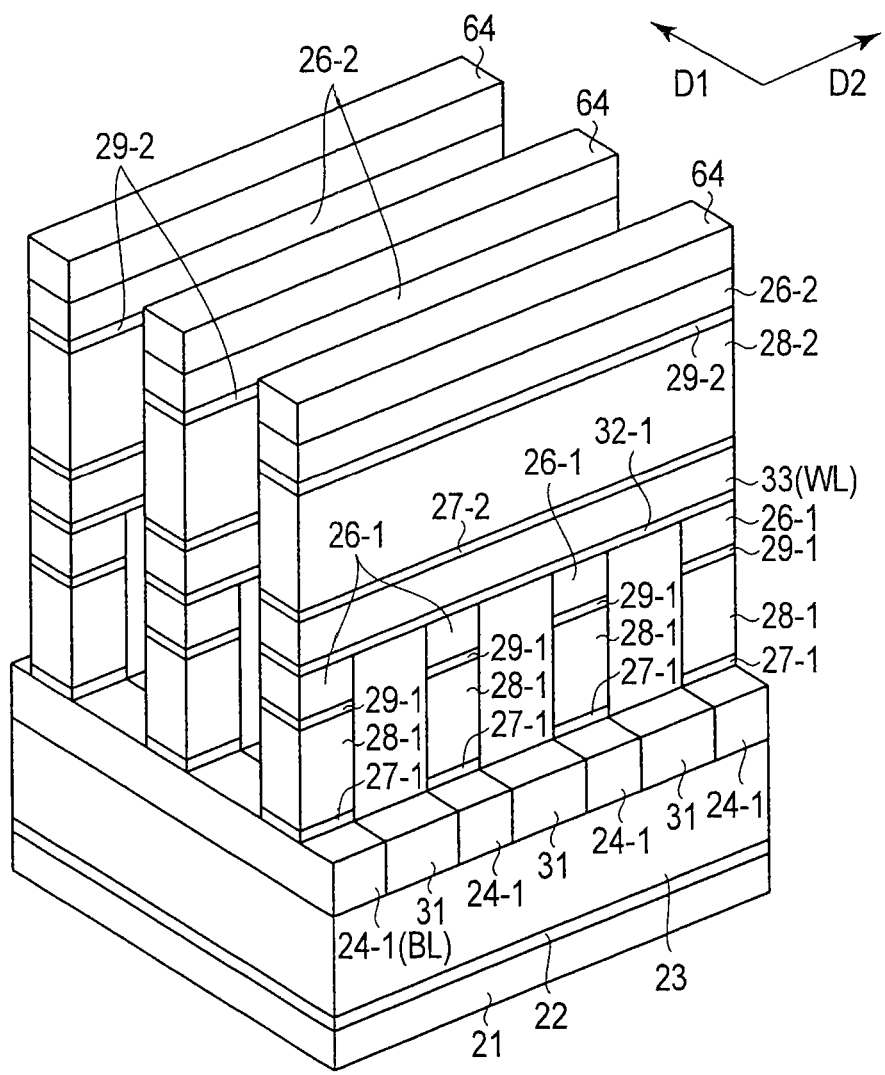
F I G. 6 0

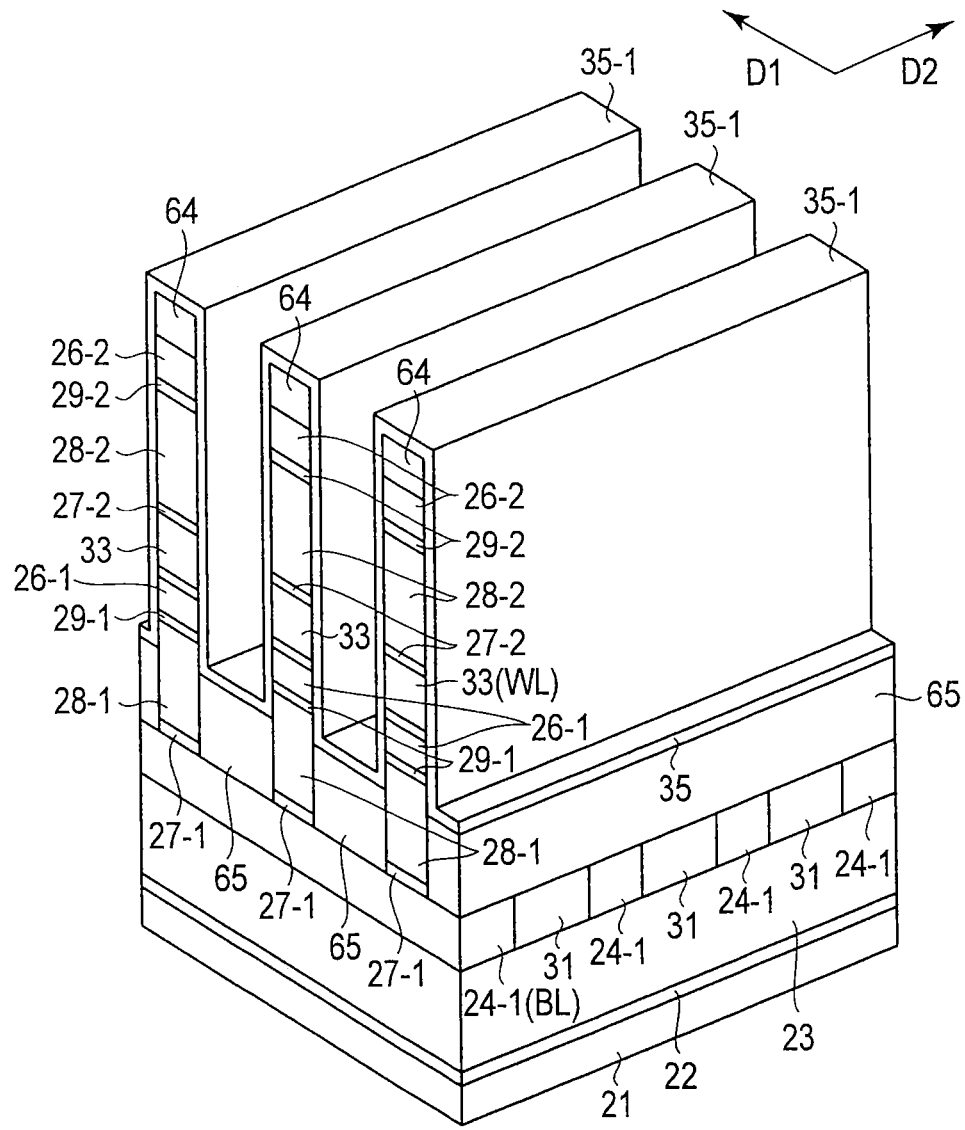
F I G. 6 1

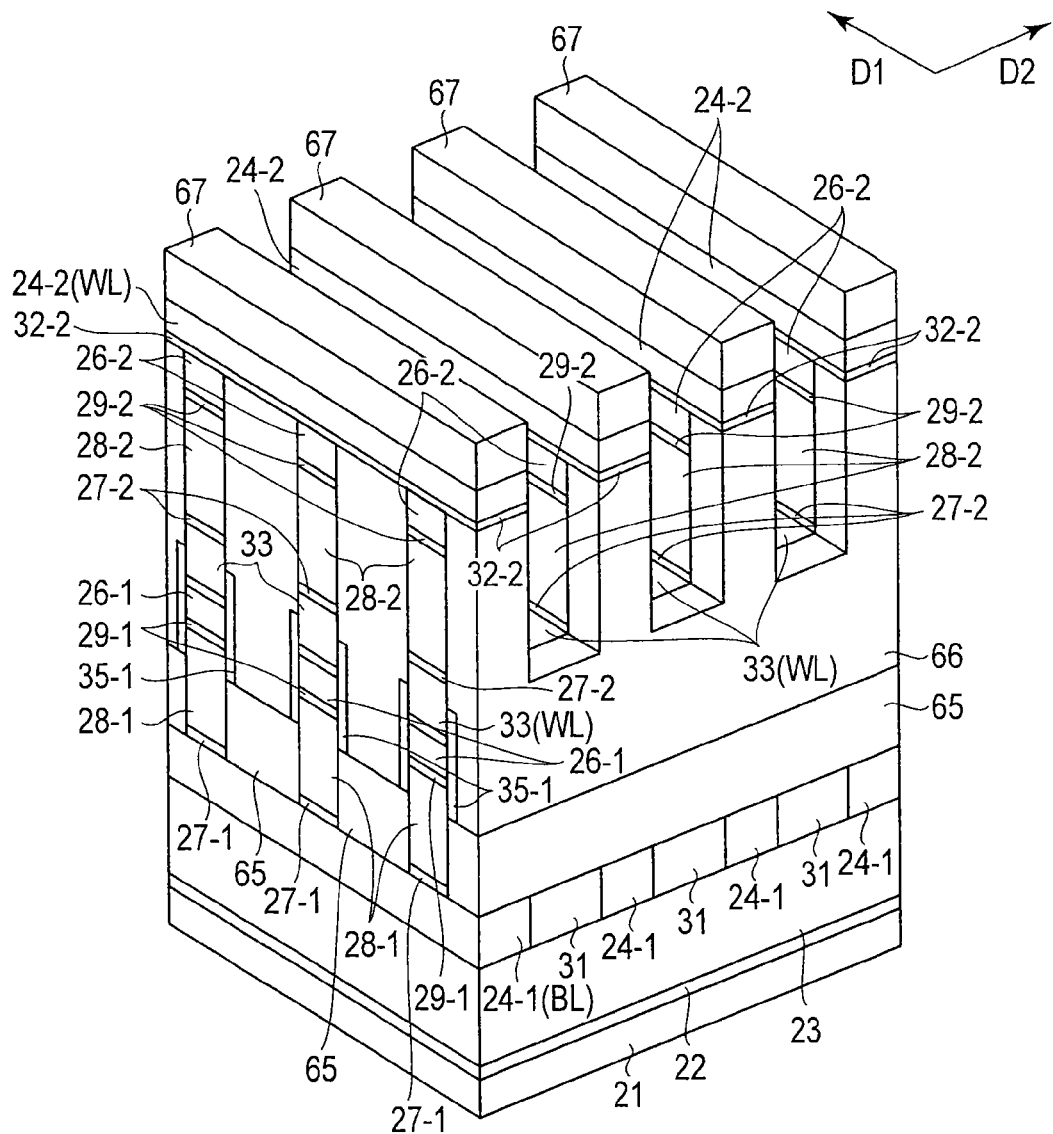
F I G. 6 4

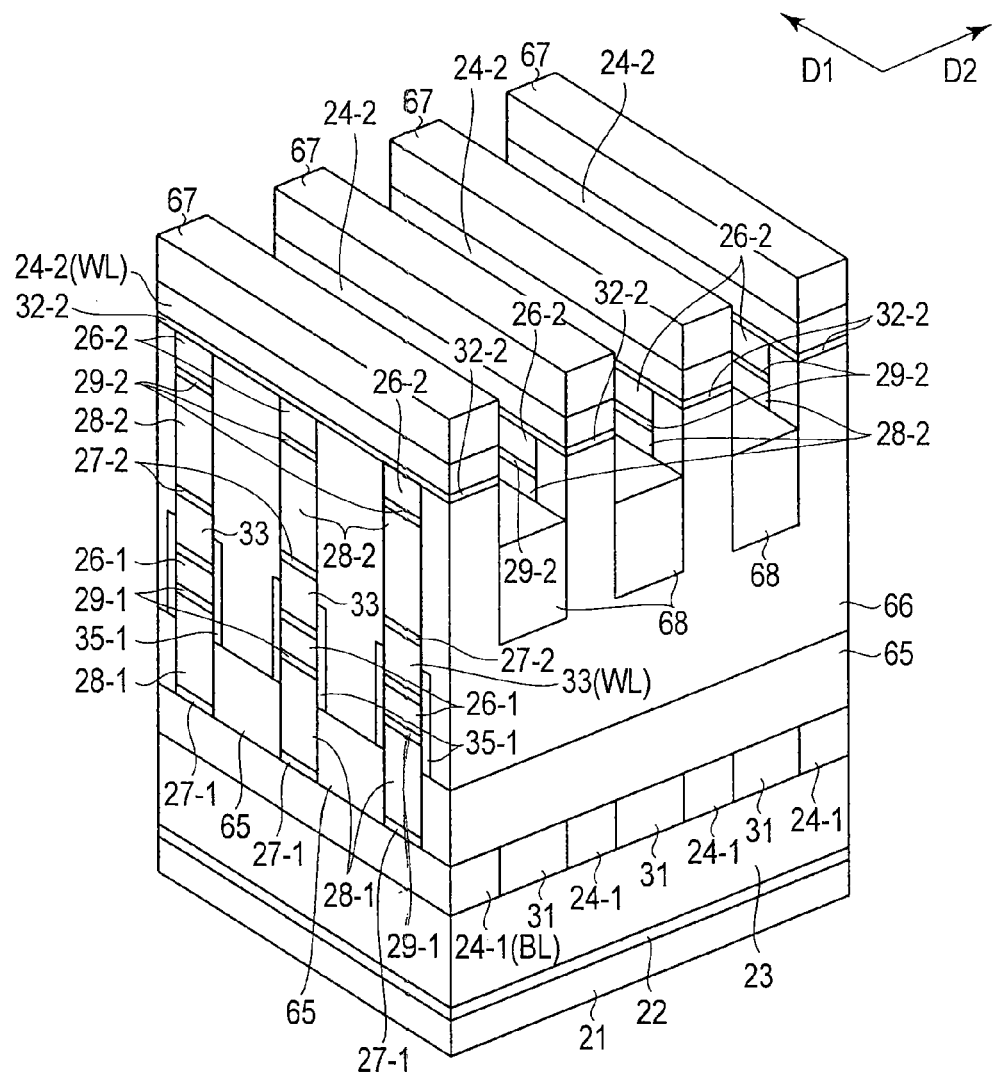
F I G. 65

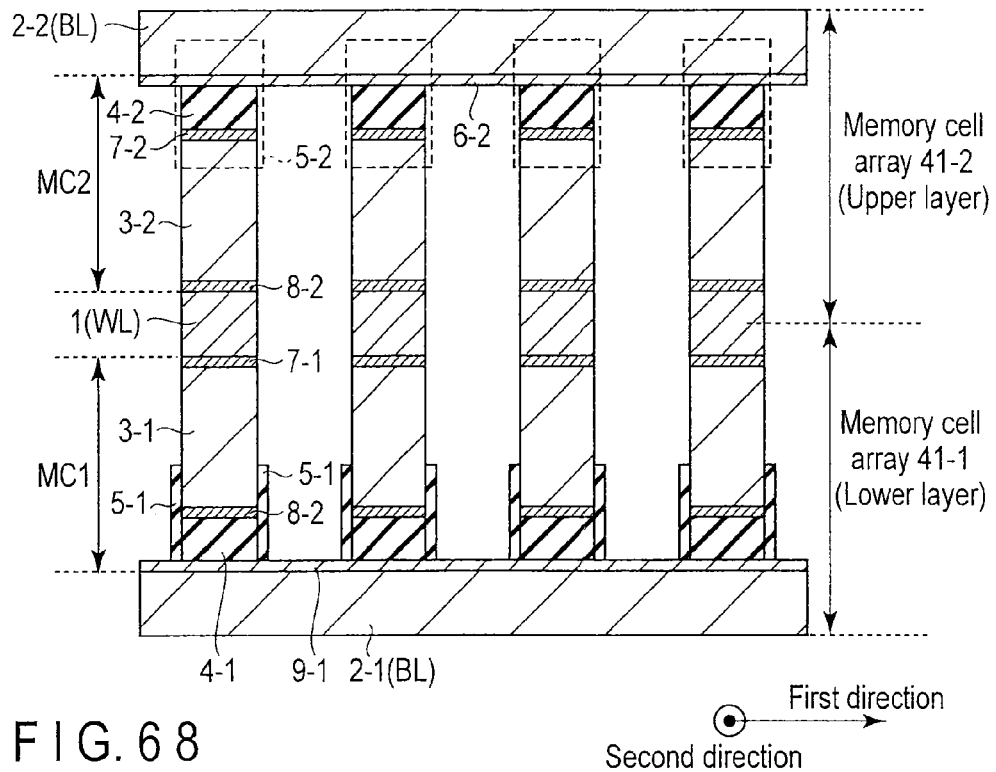
F I G. 6 8
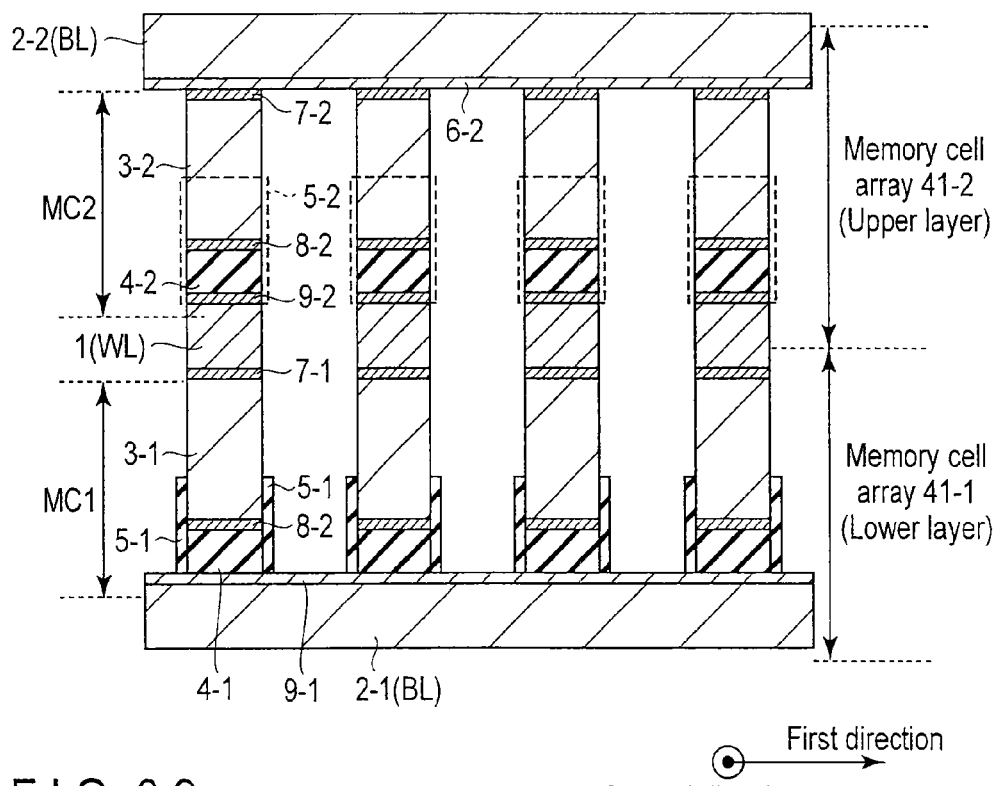
F I G. 6 9

MEMORY DEVICE AND FABRICATING METHOD THEREOF

CROSS-REFERENCE TO RELATED APPLICATIONS

The present application is a continuation of U.S. application Ser. No. 13/177,857, the entire contents of which are incorporated herein by reference.

FIELD

Embodiments described herein relate generally to a memory device and a fabricating method thereof.

BACKGROUND

In recent years, there has been suggested a memory called a resistive RAM (ReRAM), in which each of memory cells is formed with a non-ohmic element typified by a diode and a variable resistance material. The memory cells of the ReRAM do not use any MOSFET. Therefore, the memory cells are expected in that they enable the achievement of a high integration beyond a conventional trend.

BRIEF DESCRIPTION OF THE DRAWINGS

FIG. 1 and FIG. 2 are a perspective view and a sectional view of a memory device according to a first embodiment;

FIG. 3 to FIG. 10 are perspective views successively showing fabricating steps of the memory device according to the first embodiment;

FIG. 11 is a block diagram of the memory device according to the first embodiment;

FIG. 12 is a circuit diagram of a memory cell array according to the first embodiment;

FIG. 13 is an appearance view of the memory device according to the first embodiment;

FIG. 14 is a sectional view of a memory cell according to the first embodiment and a conventional memory cell;

FIG. 23 and FIG. 24 are a perspective view and a sectional view of a memory device according to a second embodiment;

FIG. 25 to FIG. 31 are perspective views successively showing fabricating steps of the memory device according to the second embodiment;

FIG. 32 and FIG. 33 are perspective views of memory devices according to modification examples of the second embodiment;

FIG. 34 is a perspective view of a memory device according to a third embodiment;

FIG. 35 to FIG. 42 are perspective views successively showing fabricating steps of the memory device according to the third embodiment;

FIG. 43 is a perspective view of a memory device according to a fourth embodiment;

FIG. 44 and FIG. 45 are a perspective view and a sectional view of a memory device according to a fifth embodiment;

FIG. 53 to FIG. 56 are sectional views of memory devices according to modification examples of the fifth embodiment;

FIG. 57 and FIG. 58 are a perspective view and a sectional view of a memory device according to a sixth embodiment;

FIG. 59 to FIG. 67 are perspective views successively showing fabricating steps of the memory device according to the sixth embodiment; and FIG. 68 and FIG. 69 are sectional views of a memory device according to a modification example of the sixth embodiment.

DETAILED DESCRIPTION

Figure 7:
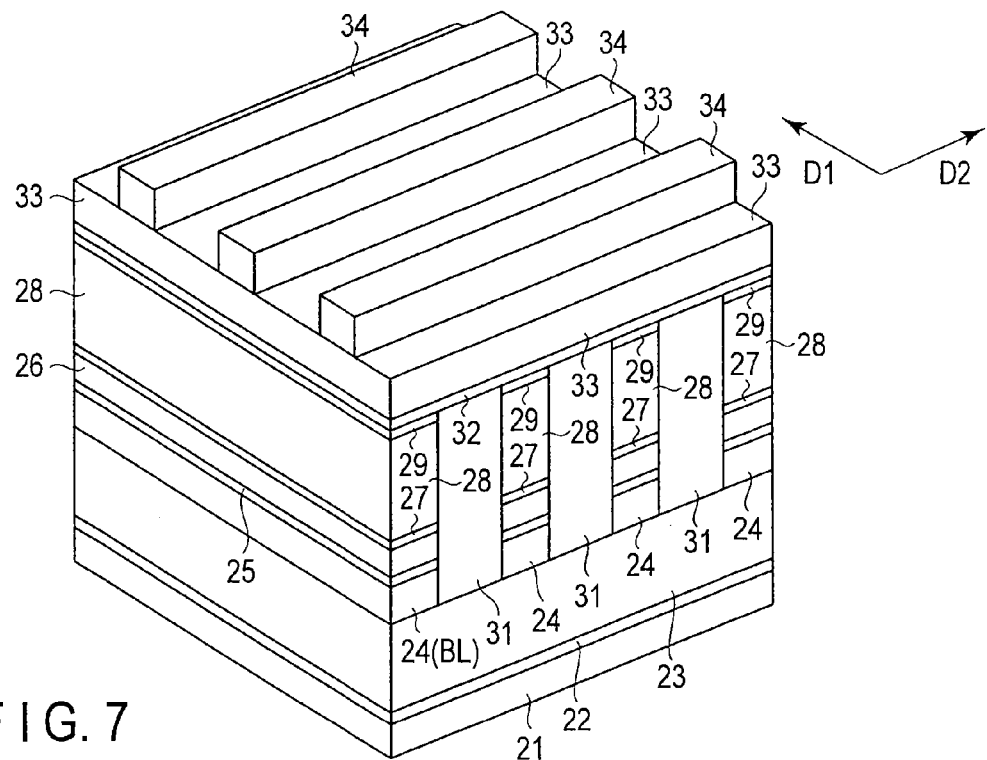

In general, according to one embodiment, a memory device includes: first interconnects; second interconnects; and a first memory cell. The first memory cell is located in an intersection of one of the first interconnects and one of the second interconnects. The first memory cell includes a first multilayer structure and a first variable resistance layer, the first multilayer structure including a first electrode, a first selector, and a first insulator which are stacked. The first selector and the first variable resistance layer are electrically connected in series between the one of the first interconnect and the one of the second interconnect. The first variable resistance layer is formed on a portion of a side surface of the first insulator to cover the portion without covering a residual portion.

[First Embodiment]

Hereinafter, a memory device according to a first embodiment and a fabricating method thereof will be described with respect to a ReRAM as an example.

1. Re: Structure of Memory Cell Array

FIG. 1 and FIG. 2 are a perspective view and a sectional view showing a constitution of a memory cell array of a semiconductor memory device according to the present embodiment.

As shown in the drawings, in the memory cell array, a plurality of row lines 1 and column lines 2 are provided. The plurality of column lines 2 are arranged in parallel along a first direction. The plurality of row lines 1 are arranged in parallel along a second direction which is orthogonal to the first direction. Moreover, in intersections of the row lines 1 and the column lines 2, memory cells MC are provided.

Each of the memory cells MC includes a selector 3, an insulator 4, electrode materials 6, 7, 8 and 9, and a variable resistance material 5 connected in series between each column line 2 and row line 1. More specifically, on each column line 2, there are sequentially stacked the electrode 9, the insulators 4, the electrodes 8, the selectors 3 and the electrodes 7 and 6, and the electrodes 6 are in contact with the row lines 1. In the present example, the electrodes 9 are formed along the column lines 2, and the electrodes 6 are formed along the row lines 1.

The variable resistance materials 5 are formed of, for example, $TiO_2$ as a main component. Moreover, the variable resistance materials 5 are provided on at least the side surfaces of the insulators 4, and formed to come in contact with the selectors 3 and the electrodes 9. It is to be noted that the row lines 1 and the column lines 2 will hereinafter be referred to as the word lines 1 and the bit lines 2, respectively, in the same manner as in usual MOS type memory cells. Moreover, in the present example, the variable resistance materials 5 are provided on two side surfaces facing each other in a direction along the bit lines 2 in the two sets of the facing side surfaces of a multilayer structure of each of the memory cells MC, but the variable resistance materials 5 are not provided on two side surfaces facing each other in a direction along the word lines 1.

As described above, the memory cells MC including the selectors 3 and the variable resistance materials 5 connected in series between the word lines 1 and the bit lines 2 are located in, for example, a matrix in the memory cell array. In the present structure, the word lines 1 and the bit lines 2 simply form a line and space pattern. Moreover, it is required that the word lines 1 and the bit lines 2 is in an orthogonally positional relation, but any fluctuation in the word line direction and the bit line direction does not have to be taken into consideration. Therefore, about a positioning accuracy in the memory cells during fabrication, it is not necessary to be remarkably nervous, and the fabrication can easily be performed. Furthermore, this structure is a high integration structure in which information of one bit can be stored in a region of $4F^2$.

It is to be noted that the variable resistance material 5 usually made of $TiO_2$ is a material whose resistance value transits between at least two resistance values of a low resistance state (LRS) and a high resistance state (HRS). It is known that the variable resistance material in the high resistance state, when a predetermined or higher voltage is applied thereto, transits to the low resistance state, and the variable resistance material in the low resistance state, when a predetermined or higher current flows therein, transits to the high resistance state. The variable resistance material 5 can be formed by a thin film including at least one of materials such as $ZnMn_2O_4$, $NiO$, $HfO$, $SrZrO_3$, $Pr_{0.7}Ca_{0.3}MnO_3$ and carbon, in addition to $TiO_2$.

Furthermore, each of the selectors 3 is a diode using a p-n junction of a semiconductor of silicon or the like, a tunnel element having a multilayer structure of metal-insulator-metal (MIM), or the like. Hereinafter, the selector 3 will be called the diode layer 3 or simply the diode 3 sometimes.

It is to be noted that FIG. 1 and FIG. 2 show several electrodes, and functions of the respective electrodes are as follows. The electrode 6 is a barrier layer for an interconnect material of the word line 1, and when tungsten (W) is used for the bit line 1, tungsten nitride (WN) is preferably used for the electrode 6. The electrode 7 is a barrier layer which accelerates the crystallization of Si for the diode layer 3 and prevents the diffusion of the interconnect material. Moreover, the electrode 7 is obtained by forming, for example, a stacked film of Ti and TiN, and then reacting Ti with Si by a heat treatment to form a stacked film of TiN and TiSi. The electrode 8 is a barrier layer which prevents high-concentration impurities of $p^+$ and $n^+$ regions of the diode layer 3 from being diffused in the insulator 4, and formed by using, for example, TiN as a material. The electrode 9 is made of an electrode material which is preferable for the resistance change of the variable resistance material 5, and formed by using metal-rich TiN as an example.

2. Re: Fabricating Method of Memory Cell Array

Next, a fabricating method of the memory cell array shown in FIG. 1 and FIG. 2 will be described with reference to FIG. 3 to FIG. 10. FIG. 3 to FIG. 10 are perspective views successively showing fabricating steps of a semiconductor memory device according to the present embodiment.

First, as shown in FIG. 3, for example, a usual CMOS circuit 22 which controls an operation of a ReRAM is formed on a silicon substrate 21, and next an interlayer insulator 23 is formed on the silicon substrate 21 to cover the CMOS circuit 22. The interlayer insulator 23 is formed by using, for example, $SiO_2$ as a material. Then, on the interlayer insulator 23, there are sequentially formed a bit line film 24, an electrode film 25, an insulator 26, an electrode film 27, a pin diode layer 28, an electrode film 29 and an etching mask layer 30. The bit line film 24, the electrode film 25, the insulator 26, the electrode film 27, the pin diode layer 28 and the electrode film 29 correspond to the bit line 2, the electrode film 9, the insulator 4, the electrode film 8, the diode layer 3 and the electrode film 7 described with reference to FIG. 1 and FIG. 2, respectively. As one example, the bit line film 24 is formed by using W as a material, the electrode film 25 is formed of TiN, the insulator 26 is formed of $SiO_2$, the electrode film 27 is formed of TiN, the pin diode layer 28 is formed of Si, the electrode film 29 is formed of a laminate film of Ti and TiN, and the etching mask layer 30 is formed of $SiO_2$. Afterward, a heat treatment which accelerates the above reaction between Ti and Si, and a heat treatment which accelerates the crystallization of the diode and the activation of impurities are performed. Then, by a lithography step, the etching mask layer 30 is patterned into a pattern of the bit lines 2. In consequence, a structure of FIG. 3 is obtained.

Next, as shown in FIG. 4, etching such as reactive ion etching (RIE) is performed by using the etching mask layer 30 as a mask, to pattern the electrode film 29, the diode layer 28, the electrode film 27, the insulator 26, the electrode film 25 and the bit line film 24 simultaneously. In consequence, the bit lines (BL) 24 having a stripe shape along a first direction (D1) are formed.

Next, as shown in FIG. 5, a coating type interlayer insulator 31 is formed on the interlayer insulator 23. In consequence, grooves generated in the step of FIG. 4 are buried with the interlayer insulator 31. Afterward, the upper surface of the interlayer insulator 31 is flattened.

Next, as shown in FIG. 6, the upper surface of the interlayer insulator 31 and the etching mask layer 30 are removed by, for example, a CMP process. In consequence, the upper surfaces of the electrode films 29 are exposed.

Next, as shown in FIG. 7, on the electrode films 29 and the interlayer insulators 31, an electrode film 32, a word line film 33 and etching mask layers 34 are sequentially formed. The electrode film 32 and the word line film 33 correspond to the electrode films 6 and the word lines 1 described with reference to FIG. 1 and FIG. 2. As one example, the electrode film 32, the word line film 33 and the etching mask layers 34 are formed by using WN, W and $SiO_2$ as materials, respectively. Continuously by the lithography step, the etching mask layer 34 is patterned into a pattern of the word lines 1. In consequence, a structure of FIG. 7 is obtained.

Figure 8:
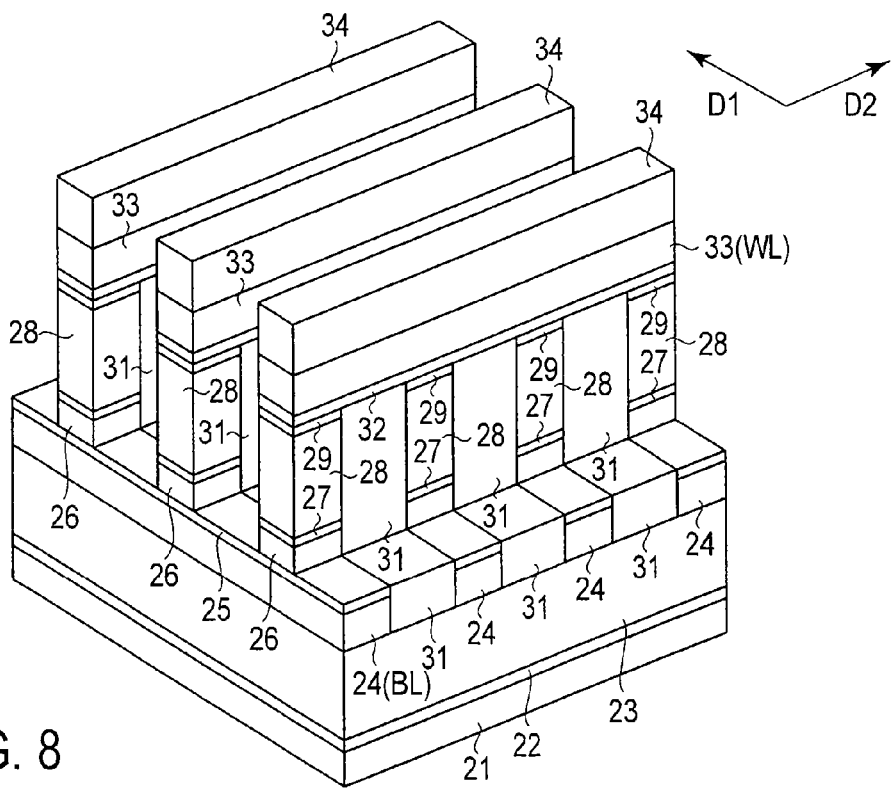

Next, as shown in FIG. 8, etching such as the reactive ion etching is performed by using the etching mask layer 34 as a mask, to pattern the word line film 33, the electrode film 32, the electrode film 29, the diode layer 28, the electrode film 27 and the insulator 26 simultaneously. In consequence, the word lines (WL) 33 having a stripe shape along a second direction (D2) are formed. Moreover, in the present step, the insulator 26, the electrode film 27, the diode layer 28 and the electrode film 29 are separated for each memory cell.

Figure 9:
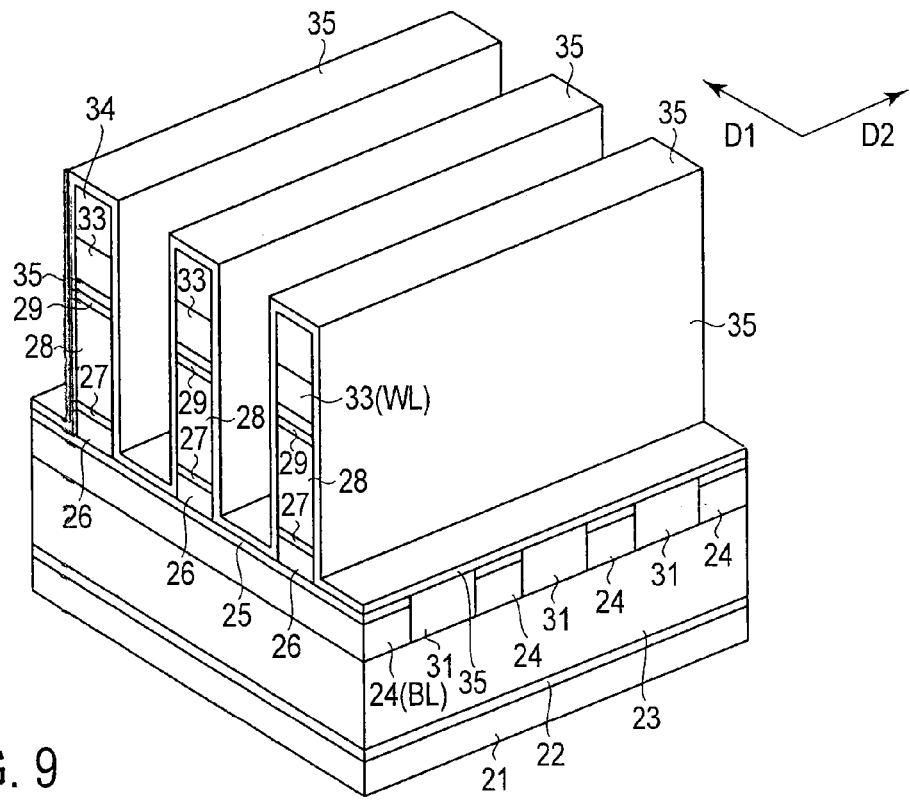

Next, as shown in FIG. 9, a variable resistance material 35 is formed into a film on the structure obtained as shown in FIG. 8 by, for example, an atomic layer deposition (ALD) process. The variable resistance material 35 corresponds to the variable resistance material 5 of FIG. 1 and FIG. 2. Moreover, a material thereof is, for example, $TiO_2$, and a film thickness thereof is, for example, about several nanometers.

Figure 10:
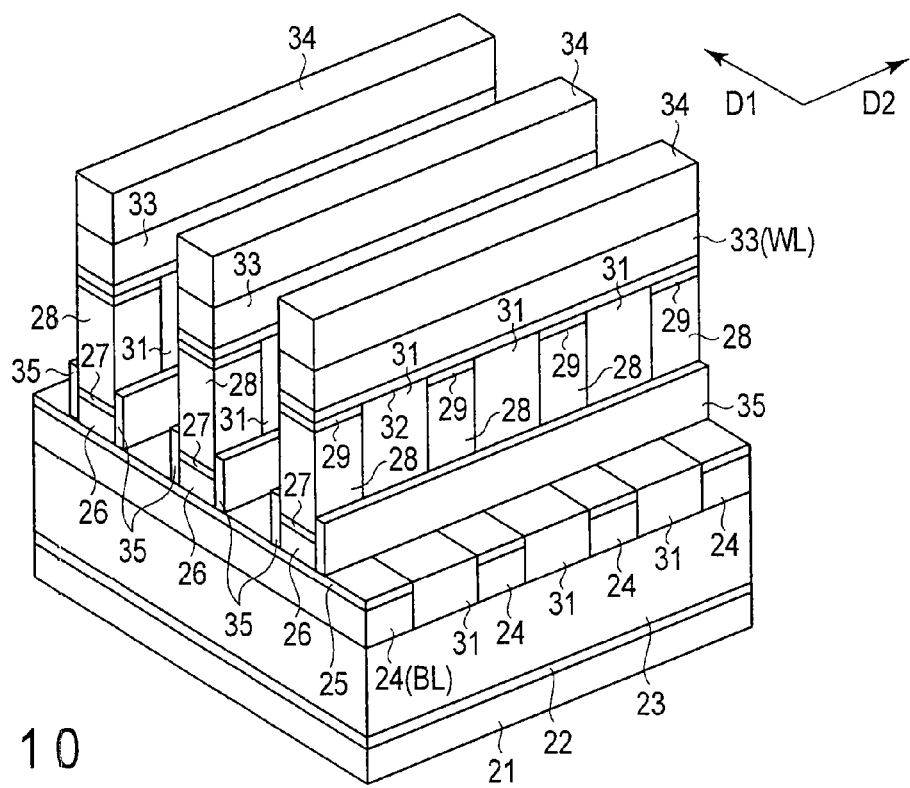

Next, as shown in FIG. 10, an etching-back step is performed to remove an upper portion of the variable resistance material 35. In this case, the variable resistance material 35 positioned between the adjacent memory cells in the first direction is also removed. In consequence, as shown in FIG. 10, the variable resistance material 35 is left on the side surfaces of the insulator 26 and the electrode film 27 and in such a manner as to come in contact with the diode layer 28 and the electrode film 25. Moreover, the variable resistance material 35 is also left on the side surfaces of the interlayer insulator 31 between the adjacent memory cells in the second direction.

Afterward, for example, a coating type interlayer insulator is formed on the whole surface, and buried in grooves generated by the processing of FIG. 10, and the upper surface of the interlayer insulator is flattened. When the memory cell array is provided with a multilayer structure, the above steps are repeated. Moreover, a passivation step is performed in the same manner as in a usual semiconductor device, and an interconnecting portion which becomes an input/output portion is further formed. Finally, so-called post-steps such as inspection and dicing are performed to complete a semiconductor memory device.

3. Re: The Overall Structure of Semiconductor Memory Device

Next, the overall structure of the semiconductor memory device according to the present embodiment will be described with reference to FIG. 11. FIG. 11 is a block diagram of the semiconductor memory device according to the present embodiment.

As shown, a semiconductor memory device 40 includes a memory cell array 41, a row decoder 42, a column decoder 43, a controller 44 and a power supply 45.

The memory cell array 41 has a structure described with reference to FIG. 1 and FIG. 2. FIG. 12 is an equivalent circuit diagram of the memory cell array 41. As shown, in the memory cell array 41, the memory cells MC each including the diode (the diode layer 3 of FIG. 1) and a variable resistance element (the variable resistance material 5 of FIG. 2) are arranged in a matrix. In each of the memory cells MC, a cathode of the diode is connected to one end of the variable resistance element. Moreover, the anodes of the diodes of the memory cells MC which are present in the same row are connected to the same word line WL, and the other ends of the variable resistance elements of the memory cells MC which are present in the same column are connected to the same bit line BL.

Return to FIG. 11 to continue the description. The row decoder 42 includes a word line selection unit and a word line driver. Moreover, the word line selection unit selects the word line WL on the basis of a row address received from the controller 44. Furthermore, the word line driver applies, to the selected word line and the unselected word line, a voltage required to read, write or erase data.

The column decoder 43 includes a bit line selection unit and a bit line driver. Moreover, the bit line selection unit selects the bit line BL on the basis of a column address received from the controller 44. Furthermore, the bit line driver applies, to the selected bit line and the unselected bit line, the voltage required to read, write or erase the data.

The controller 44 controls an operation of the whole semiconductor memory device 40. Moreover, as described above, the controller transmits necessary addresses to the row decoder 42 and the column decoder 43. Furthermore, when the data is written, the controller 44 instructs the row decoder 42 and the column decoder 43 to apply a necessary voltage, in order to change a resistance state of the variable resistance element of the selected memory cell MC. Moreover, when the data is read, the controller instructs the row decoder 42 and the column decoder 43 to apply the necessary voltage, in order to detect the resistance value of the variable resistance element of the selected memory cell MC as a memory state of the memory cell MC.

The power supply 45 generates a predetermined voltage set required to read, write and erase the data. More specifically, the power supply 45 generates a bias voltage VSW of the selected word line and a bias voltage VUW of the unselected word line, to supply the voltages to the row decoder 42. Furthermore, the power supply 45 generates a bias voltage VSB of the selected bit line and a bias voltage VUB of the unselected word line, to supply this voltage to the column decoder 43. In consequence, for example, when the data is written, a large potential difference is generated between the selected word line and the selected bit line, and the resistance state of the variable resistance element is transited. Moreover, when the data is read, in a range in which the transition of the resistance state does not occur, the potential difference is generated between the selected word line and the selected bit line, and a current flowing through the bit line or the word line is detected.

FIG. 13 is an appearance view of the semiconductor memory device according to the present embodiment. As shown, a CMOS circuit 52 (corresponding to the CMOS circuit 22) including an interconnect layer by a usually used process is formed on a silicon substrate 51 (corresponding to the silicon substrate 21). Moreover, on the CMOS circuit 52, a layer 53 including a plurality of memory cell portions 54 (corresponding to the interlayer insulator 23 and upper layers above the film) is formed. Each of the memory cell portions 54 of FIG. 13 corresponds to the memory cell array 41 of FIG. 11 and FIG. 12, and interconnects are formed by, for example, a design rule of 24 nm. Moreover, a portion called a peripheral circuit in a usual memory, including the decoders 42 and 43 and the controller 44 of FIG. 11, is included in the CMOS circuit 52 of FIG. 13.

It is to be noted that the CMOS circuit 52 excluding portions for connecting to the memory cell portions 54 can be designed and prepared by, for example, a design rule of 90 nm which is more relaxing than the memory cell portions 54. Moreover, the layer 53 includes portions for electrically connecting to the CMOS circuit 52 around each of the memory cell portions 54, and unit blocks including the memory cell portions 54 and the peripheral connecting portions are arranged in the matrix. Furthermore, in the layer 53, through holes are formed, and in ends of the layer 53, there are formed input/output portions 55 of the present device including terminals electrically coupled with input/output portions of the CMOS circuit 52 via these through holes.

According to such a structure, a function corresponding to a protection film of the CMOS circuit 52 can be performed by insulators formed in the memory cell portions 54. On the other hand, the memory cell portions 54 and the CMOS circuit 52 coupled each other in a vertical direction to the a substrate surface, which enables the shortening of an operation time or the noticeable increase of the number of simultaneously readable/writable cells without involving the increase of chip areas. It is to be noted that the input/output portions 55 of the device are bonded to a lead frame in a packaging step in the same manner as in a usual semiconductor device.

4. Effect of the Present Embodiment

As described above, according to the present embodiment, there is provided a semiconductor memory device which requires less consumption power. Hereinafter, the present effect will be described.

In recent years, a circuit pattern of an LSI element has increasingly been miniaturized with the high integration of a semiconductor device. This miniaturization of the pattern requires not only the decrease of a line width but also the enhancement of a dimensional or positional accuracy of the pattern. This also applies to the memory device. As to the memory device, it has continuously been requested that in memory cells formed by making full use of an accurate processing technology, a predetermined amount of a charge required for storage is held in a smaller region.

Heretofore, various memories such as a DRAM, an SRAM and a flash memory have been fabricated. All these memories hold the predetermined amount of the charge to store data. Therefore, with the miniaturization of the pattern, there are strict restrictions on fluctuations of the memory cells and the like. In consequence, a large burden is also imposed on a lithography technology which forms these patterns, which becomes a factor to raise a lithography step cost. Moreover, the lithography step cost occupies a large part of the present mass production cost. Therefore, the above burden on the lithography step becomes a product cost raising factor as it is.

On the other hand, in recent years, there has been suggested a memory called a ReRAM, in which each of memory cells is formed by a non-ohmic element typified by a diode and a variable resistance material. This ReRAM does not have to use any MOSFET in the memory cell, and hence it has been expected that high integration beyond a conventional trend can be achieved.

However, a current required to change a resistance state of the variable resistance material of the ReRAM is comparatively large in a ratio thereof with respect to a sectional area of the material, and it is difficult to save a consumption current. Furthermore, a voltage drop due to a resistance of an interconnect in a memory cell array increases, or a balance between the current and a driving current of the non-ohmic element breaks, so that an additional driving voltage is required. In consequence, a circuit voltage needs to be raised, and there is present a problem that it becomes further difficult to save the consumption power.

However, according to the structure of the present embodiment, the above problem can be solved. This respect will be described with reference to FIG. 14. FIG. 14 is a sectional view of the memory cell of the ReRAM, and shows a structure according to the present embodiment and a conventional structure.

First, the conventional structure will be described. As shown, a variable resistance material (a variable resistance element) VR and a diode are stacked on a bit line BL (or a word line WL). Moreover, these layers are processed and formed by a lithography step. Therefore, a sectional area of the variable resistance material VR has a limitation owing to the lithography step, and it is difficult to set, for example, a width W1 of the shown variable resistance material VR to be smaller than an about predetermined width determined by the lithography step. Therefore, the sectional area of each memory cell seen from a current flowing through the memory cell (a shown arrow) is comparatively large, a current flowing during the writing of the data or a leak current becomes large, and it is also difficult to save the current.

In this respect, according to the structure of the present embodiment shown in FIG. 14, an insulator is disposed in a portion where the variable resistance material VR has been disposed in the conventional structure, and the variable resistance material VR is provided on the side surfaces of this insulator. That is, the variable resistance material VR is provided along the side surfaces of a multilayer structure patterned in the lithography step, and electrically comes in contact with electrodes or interconnects on and under the insulator.

Moreover, when a satisfactorily isotropic film forming method typified by atomic layer deposition (ALD) is used, the variable resistance material VR can homogeneously be formed with a uniform film thickness. Therefore, one side (a width in a perspective direction of FIG. 14) of a section of the variable resistance material 5 with respect to a current path is determined by lithography processing, but the other side (W2) is determined by the film thickness during film formation. Therefore, W2 does not depend on a lithography processing dimension, and can be set to a remarkably small value of several nanometers or less.

Moreover, according to the present embodiment, the variable resistance material 5 is formed only on one of two sets of side surfaces of the multilayer structure of each memory cell MC facing each other, and is not formed on the other set thereof. More specifically, as an example in the present embodiment, the variable resistance material 5 is provided on two side surfaces facing each other in a direction along the bit lines 2, and is not provided on two side surfaces facing each other in a direction along the word lines 1. Therefore, as compared with a case where the variable resistance material 5 is formed to surround the whole periphery of the multilayer structure, the sectional area of the variable resistance material 5 with respect to the current path can be decreased.

In consequence, according to the structure of the present embodiment, the sectional area of the variable resistance material VR can noticeably be decreased as compared with the conventional constitution, and the current required for the resistance change of the variable resistance material VR can noticeably be saved. In consequence, a consumption power amount can be decreased, and additionally, the voltage drop due to the wiring resistance or the voltage required for the diode can be suppressed. Therefore, a circuit voltage can be suppressed, and the consumption power of chips can be saved.

Specifically, in the conventional structure, when a length of the one side of the section of the memory cell multilayer structure is 24 nm, about 4.0 V and 22 μA have been required for a combination of the variable resistance material and the diode, to change the memory cell from the low resistance state to the high resistance state. However, according to the structure of the present embodiment, the state can be changed with about 3.0 V and 4 μA.

Moreover, a dielectric breakdown voltage of each of the insulators 4 is preferably set to be larger than the voltage required for the state change of the variable resistance material VR. In consequence, short-circuit between the diode and the interconnect due to the dielectric breakdown of the insulator 4 can be suppressed, and it is possible to prevent a situation where any desirable voltage cannot be applied to the variable resistance material VR.

In consequence, according to the present embodiment, the sectional area of the variable resistance material can be decreased, and the consumption current can be saved, independently of the lithography processing limitation. Therefore, it is possible to provide a memory device which requires less consumption power and can highly be integrated.

It is to be noted that as shown in FIG. 14, a barrier layer is required between the diode and the variable resistance material VR in the conventional structure. This is because a component element forming the diode and a component element forming the variable resistance material VR mutually diffuse owing to the current flowing through the cell, or the like, and a primary function of the diode or the variable resistance material VR is prevented from being impaired. Moreover, an electrode having a work function which is different from that of an n$^+$ type Si is preferably used sometimes so that the variable resistance material VR sufficiently exerts the function of the variable resistance material, and in this case, the barrier layer is preferably also provided with this function. In the structure of the present embodiment, however, it is preferable in view of the work function to use n$^+$ type silicon as the electrode material of the variable resistance material VR. Furthermore, the mutual diffusion of Si and TiO$_2$ does not remarkably occur, and hence any barrier layer is not required.

5. Modification Examples of the Present Embodiment

The above embodiment can be modified into various structures. Hereinafter, various modification examples will be described. However, the embodiment can be modified into a modification example which is different from the examples described hereinafter.

5.1 First Example

Figure 15:
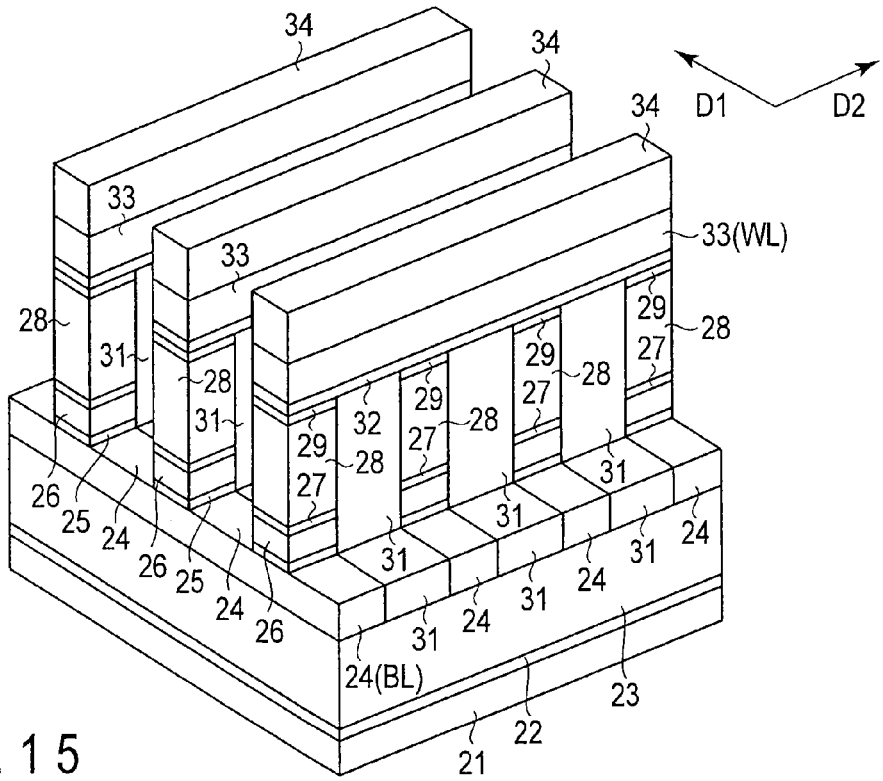
FIG. 15 to FIG. 22 are perspective views showing fabricating steps of memory devices according to modification examples of the first embodiment.
Figure 16:
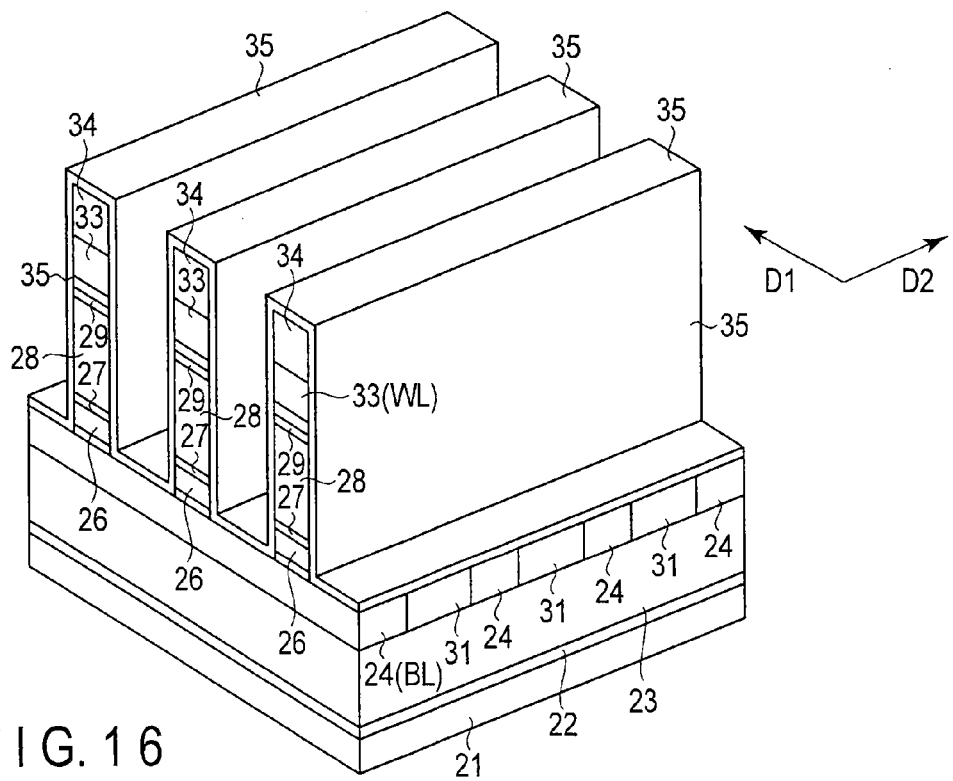
Figure 17:
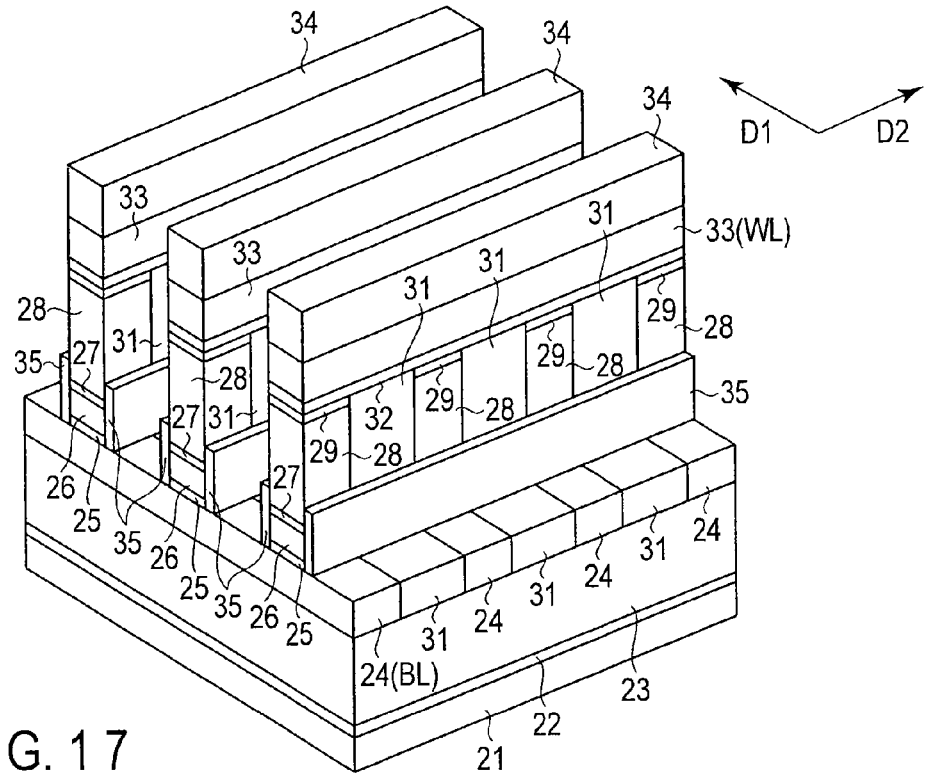

First, a first example will be described with reference to FIG. 15 to FIG. 17. FIG. 15 to FIG. 17 are perspective views successively showing fabricating steps of a memory cell array according to the first example. In the present example, an electrode film 25 is separated for each memory cell.

First, after obtaining the above constitution of FIG. 7, a step of FIG. 8 is performed. In this case, the electrode films 25 are also patterned as shown in FIG. 15. In consequence, a bit line film 24 is exposed. Next, as shown in FIG. 16, a variable resistance material 35 is formed as described with reference to FIG. 9. Afterward, as shown in FIG. 17, part of the variable resistance material 35 is removed as described with reference to FIG. 11. In this way, the variable resistance material 35 may directly come in contact with the bit line film 24.

5.2 Second Example

Figure 18:
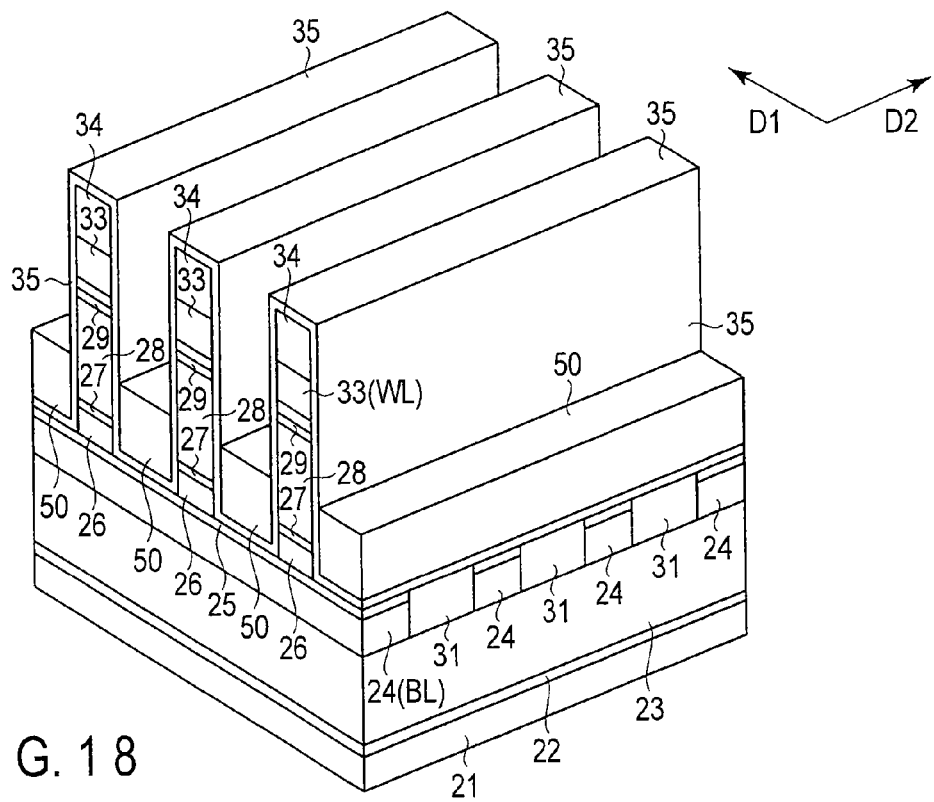
Figure 19:
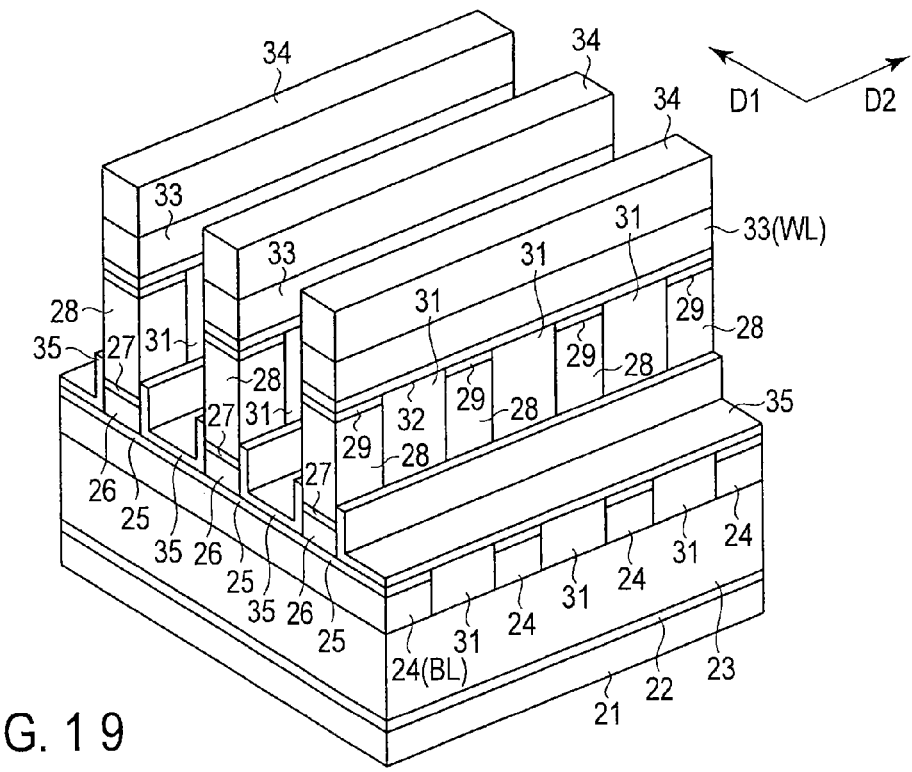

Next, a second example will be described with reference to FIG. 18 and FIG. 19. FIG. 18 and FIG. 19 are perspective views successively showing fabricating steps of a memory cell array according to the second example. In the present examples, variable resistance materials disposed adjacent to each other in a first direction are connected to each other.

First, after obtaining the above structure of FIG. 9, as shown in FIG. 18, an insulator 50 is formed on a variable resistance material 35 between multilayer structures of the memory cells. Next, as shown in FIG. 19, a step described with reference to FIG. 10 is performed, and then the insulator 50 is removed. In the present example, the etching of the variable resistance materials 35 is performed in a state where part of the materials 35 is protected by the insulator 50. Therefore, the variable resistance material 35 remains between the multilayer structures. Even in such a structure, the variable resistance material 35 has a high resistance, and any problem does not occur in an actual operation.

5.3 Third Example

Figure 20:
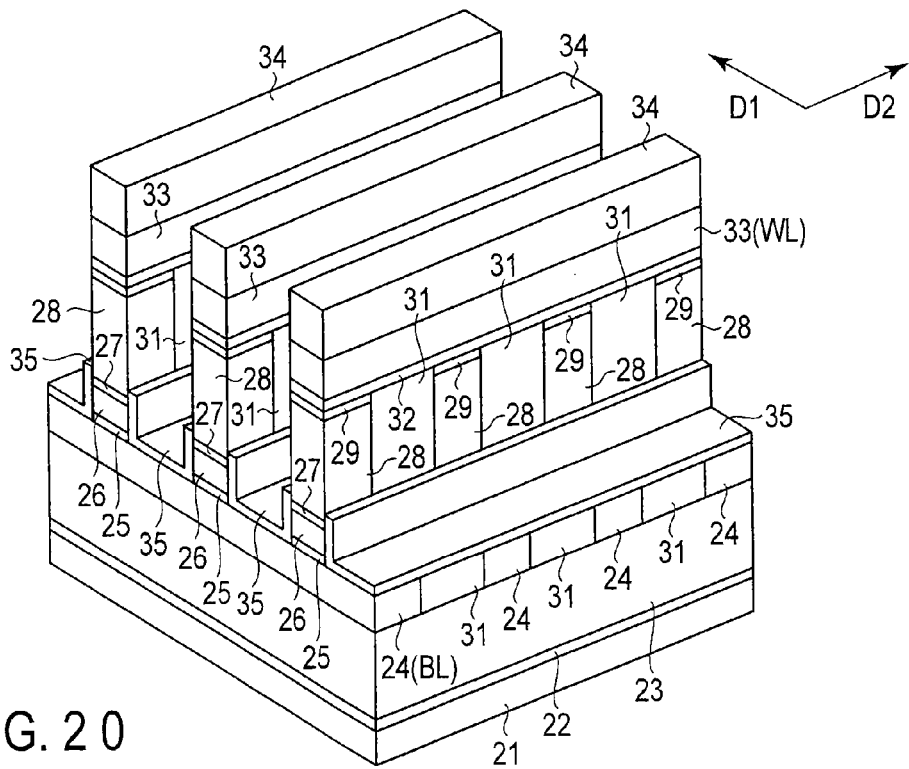

Next, a third example will be described with reference to FIG. 20. FIG. 20 is a perspective view of a memory cell array according to the third example. The present example is a combination of the above first and second examples.

As shown, while separating an electrode film 25 for each memory cell, a variable resistance material 35 disposed adjacent to the film in a first direction may be connected to the film. The present constitution is obtained by performing a step of FIG. 18 after a step of FIG. 16.

5.4 Fourth Example

Figure 21:
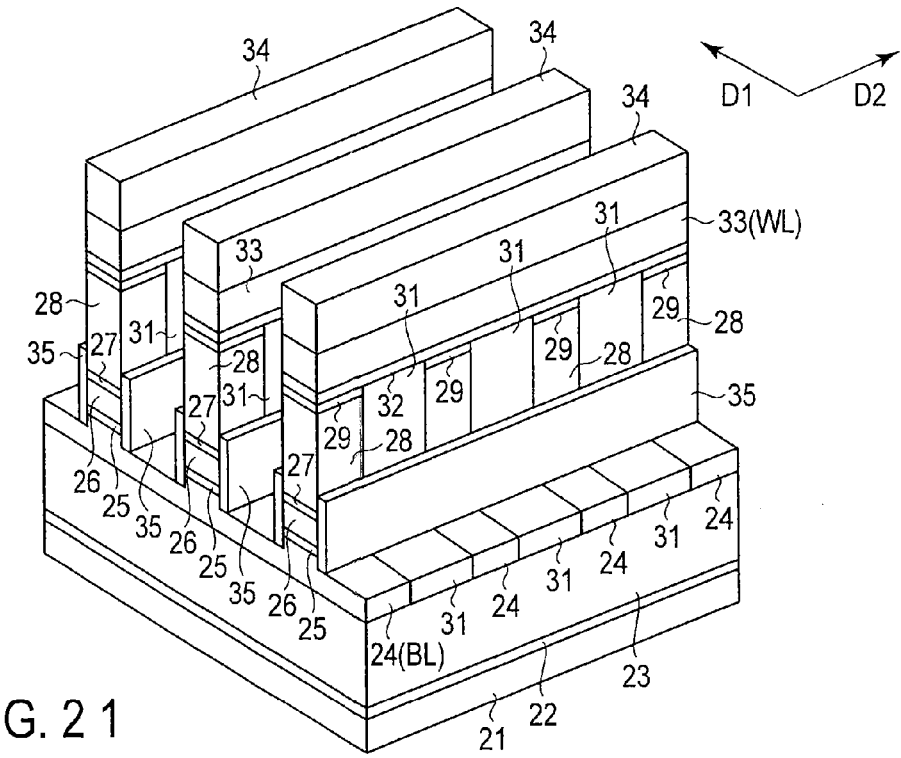

Next, a fourth example will be described with reference to FIG. 21. FIG. 21 is a perspective view of a memory cell array according to the fourth example. In the present example, in the first embodiment, part of the upper surface of a bit line film 24 is etched.

As shown, in an etching step of FIG. 8, not only an electrode film 25 but also part of the upper surface of the bit line film 24 may be etched. In consequence, the upper surface of the bit line film 24 between memory cells becomes lower than a contact surface between the electrode film 25 and the bit line film 24. Moreover, a variable resistance material 35 comes in contact with the side surfaces of the bit line film 24 in a stepped portion of the bit line film 24.

5.5 Fifth Example

Figure 22:
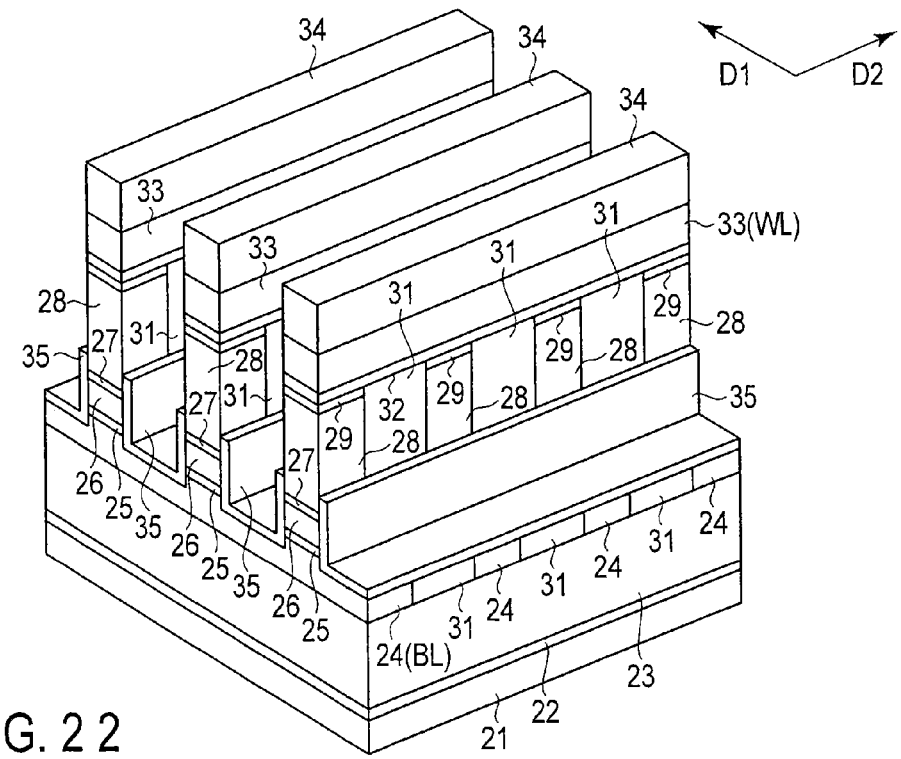

Next, a fifth example will be described with reference to FIG. 22. FIG. 22 is a perspective view of a memory cell array according to the fifth example. The present example is a combination of the above second example and fourth example.

As shown, while etching the upper surface of a bit line film 24, a variable resistance material 35 disposed adjacent to the film in a first direction may be connected thereto. The present structure is obtained by etching part of the upper surface of the bit line film 24 in the step of FIG. 8, and then performing the step of FIG. 18.

[Second Embodiment]

Next, a memory device according to a second embodiment and a fabricating method thereof will be described. The present embodiment has a structure in which in the above first embodiment, positions of diodes 3 and variable resistance materials 5 are replaced. That is, the diodes 3 are connected to bit lines 2 and the variable resistance materials 5 are connected to word lines 1. Another structure is similar to the first embodiment, and hence an only respect that is different from the first embodiment will be described.

1. Re: Structure of Memory Cell Array

FIG. 23 and FIG. 24 are a perspective view and a sectional view showing a structure of a memory cell array of a semiconductor memory device according to the present embodiment.

As shown, each of memory cells MC includes a selector 3, an insulator 4, electrode materials 6, 7 and 8, and a variable resistance material 5 connected in series between a bit line 2 and a word line 1. More specifically, on the bit lines 2, the electrodes 8, the selectors 3, the electrodes 7, the insulators 4 and the electrodes 6 are sequentially stacked, and the electrodes 6 is in contact with the word lines 1. In the present example, the electrodes 6 are provided along the word lines 1. Moreover, the variable resistance material 5 covers at least the side surfaces of the insulators 4. Moreover, the variable resistance material 5 is provided between at least the word lines 1 to the selectors 3 along the side surfaces of multilayer structures of the memory cells. Also in the present embodiment, the variable resistance material 5 is provided on two side surfaces facing each other in a first direction (the direction along the bit lines 2), and is not provided on two side surfaces facing each other in a second direction (the direction along the word lines 1), in the two sets of the facing side surfaces of the multilayer structure of the memory cell MC.

2. Re: Fabricating Method of Memory Cell Array

Next, a fabricating method of the memory cell array shown in FIG. 23 and FIG. 24 will be described with reference to FIG. 25 to FIG. 31. FIG. 25 to FIG. 31 are perspective views successively showing fabricating steps of a semiconductor memory device according to the present embodiment.

First, as shown in FIG. 25, on an interlayer insulator 23, there are sequentially formed a bit line film 24, an electrode film 27, a pin diode layer 28, an electrode film 29, an insulator 26 and an etching mask layer 30. Then, by a lithography step, the etching mask layer 30 is patterned into a pattern of the bit lines 2. In consequence, a structure of FIG. 25 is obtained.

Next, as shown in FIG. 26, etching such as reactive ion etching (RIE) is performed by using the etching mask layer 30 as a mask, and the insulator 26, the electrode film 29, the diode layer 28, the electrode film 27 and the bit line film 24 are simultaneously patterned. In consequence, the bit lines (BL) 24 having a stripe shape along a first direction (D1) are formed. Afterward, on the interlayer insulator 23, an interlayer insulator 31 is formed to be buried between multilayer structures of the memory cells, and the upper surface of the interlayer insulator 31 is flattened.

Next, as shown in FIG. 27, the upper surface of the interlayer insulator 31 and the etching mask layer 30 are removed by, for example, a CMP process or the like. In consequence, the upper surface of the insulator 26 is exposed.

Next, as shown in FIG. 28, an electrode film 32, a word line film 33 and an etching mask layer 34 are sequentially formed on the insulator 26 and the interlayer insulator 31. Continuously by the lithography step, the etching mask layer 34 is patterned into a pattern of the word lines 1. Afterward, etching such as the reactive ion etching is performed by using the etching mask layer 34 as a mask, and the word line film 33, the electrode film 32, the insulator 26, the electrode film 29, the diode layer 28 and the electrode film 27 are simultaneously patterned. In consequence, the word lines (WL) 33 having a stripe shape along a second direction (D2) are formed. Moreover, by the present step, the insulator 26, the electrode film 27, the diode layer 28 and the electrode film 29 are separated for each memory cell.

Next, as shown in FIG. 29, an insulator 51 is buried between the multilayer structures of the memory cells obtained by the step of FIG. 28. Then, the upper surface of the insulator 51 is removed. The upper surface of the insulator 51 is removed to match a lower end of a variable resistance material formed later. Therefore, by the present step, the word lines 33, the electrode film 32, the insulator 26, the electrode film 29 and a part of the diode layer 28 are exposed as shown in FIG. 29.

Next, as shown in FIG. 30, a variable resistance material 35 is formed into a film on the structure obtained in FIG. 29, for example, by ALD.

Next, as shown in FIG. 31, an etching-back step is performed to remove an upper portion of the variable resistance material 35. In this case, the variable resistance material 35 positioned between the adjacent memory cells in the first direction is also removed. In consequence, as shown in FIG. 31, the variable resistance material 35 remains between the side surface of each of the word lines 33 and the side surface of the diode layer 28. Moreover, the variable resistance material 35 also remains on the side surface of the interlayer insulator 31 between the adjacent memory cells in the second direction.

Afterward, for example, a coating type interlayer insulator is formed on the whole surface, and a semiconductor memory device is completed by steps which are similar to the first embodiment.

3. Effect of the Present Embodiment

As described above, the structure described in the first embodiment can be applied to a case where positions of a variable resistance material and a diode are reversed.

4. Modification Examples of the Present Embodiment

The present embodiment can be modified into various structures. Hereinafter, various modification examples will be described. However, the embodiment can be modified to modification examples which are different from the examples described hereinafter.

4.1 First Example

First, a first example will be described with reference to FIG. 32. FIG. 32 is a perspective view of a memory cell array according to the first example. As shown, electrode films 27 of memory cells may be connected to each other. The present structure is obtained, when the electrode film 27 is not etched in the step of FIG. 28.

4.2 Second Example

Next, a second example will be described with reference to FIG. 33. FIG. 33 is a perspective view of a memory cell array according to a second example. As shown, variable resistance materials 35 disposed adjacent to each other in a first direction may be connected to each other in the same manner as in the second example of the first embodiment. The present structure is obtained by performing etching while protecting each variable resistance material 35 between memory cells by, for example, an insulator in FIG. 30.

4.3 Another Example

Another modification example is also enabled. For example, the example may be a combination of the above first and second examples. That is, in the structure of FIG. 32, variable resistance materials 35 disposed adjacent to each other in a first direction may be connected to each other. Moreover, part of the upper surfaces of bit lines 24 may be removed in the step of FIG. 28 in the same manner as in the fourth example of the first embodiment. Furthermore, while removing part of the upper surfaces of the bit lines 24, the variable resistance materials 35 disposed adjacent to each other in the first direction may be connected to each other in the same manner as in the fifth example of the first embodiment.

[Third Embodiment]

Next, a memory device according to a third embodiment and a fabricating method thereof will be described. The present embodiment has a structure in which in the above first embodiment, directions of word lines 1 and bit lines 2 are replaced. That is, the word lines 1 are provided along a first direction, and the bit lines 2 are provided along a second direction. Another structure is similar to the first embodiment, and hence an only respect that is different from the first embodiment will be described.

1. Re: Structure of Memory Cell Array

FIG. 34 is a perspective view showing a structure of a memory cell array of a semiconductor memory device according to the present embodiment.

As shown, a basic structure of the present embodiment is similar to the structure described in the first embodiment with reference to FIG. 1 and FIG. 2. The embodiment is different from the first embodiment in the following respects. That is, word lines 1 and bit lines 2 are provided along a first direction and a second direction, respectively;

a variable resistance material 5 is provided on two side surfaces facing each other in a direction along the word lines 1, and is not provided on two side surfaces facing each other in a direction along the bit lines 2, in the two sets of the facing side surfaces of a multilayer structure of each memory cell MC;

an electrode layer 9 is separated for each memory cell; and the upper surface of the bit line 2 between the memory cells is lower than an interface between each of the bit lines 2 and the electrode layer 9, and as high as a lower end of the variable resistance material 5.

2. Re: Fabricating Method of Memory Cell Array

Next, a fabricating method of the memory cell array shown in FIG. 34 will be described with reference to FIG. 35 to FIG. 42. FIG. 35 to FIG. 42 are perspective views successively showing fabricating steps of a semiconductor memory device according to the present embodiment.

First, as shown in FIG. 35, a bit line film 24, an electrode film 25, an insulator 26, an electrode film 27, a diode layer 28, an electrode film 29 and an etching mask layer 52 are sequentially formed on an interlayer insulator 23. Then, by a lithography step, the etching mask layer 52 is patterned into a pattern of the bit lines 2. In consequence, a structure of FIG. 35 is obtained.

Figure 36:
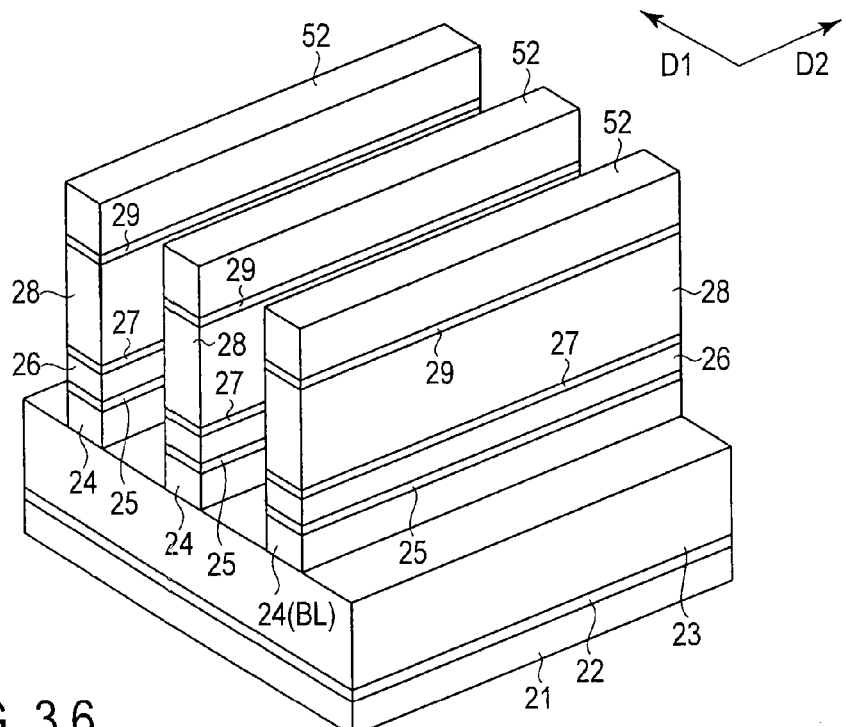

Next, as shown in FIG. 36, etching such as reactive ion etching is performed by using the etching mask layer 52 as a mask, and the electrode film 29, the diode layer 28, the electrode film 27, the insulator 26, the electrode film 25 and the bit line film 24 are simultaneously patterned. In consequence, the bit lines (BL) 24 having a stripe shape along a second direction are formed.

Figure 37:
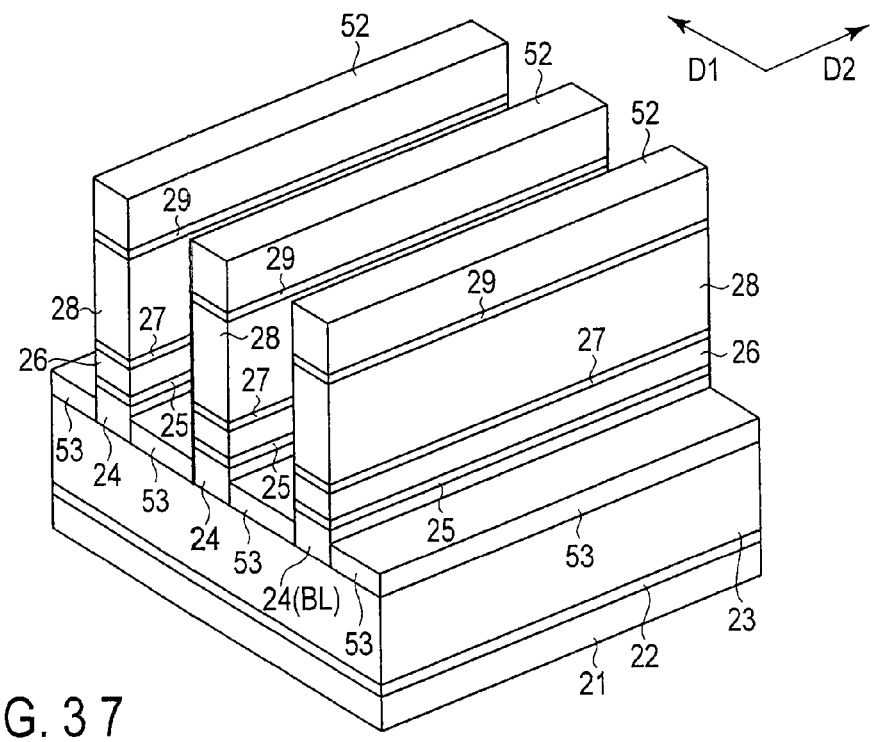

Next, as shown in FIG. 37, an insulator 53 is buried between multilayer structures formed in the step of FIG. 36. The insulator 53 is left between the multilayer structures so that the whole side surfaces of at least the insulator 26 are exposed (in the present example, at least part of the bit lines 24 is exposed).

Figure 38:
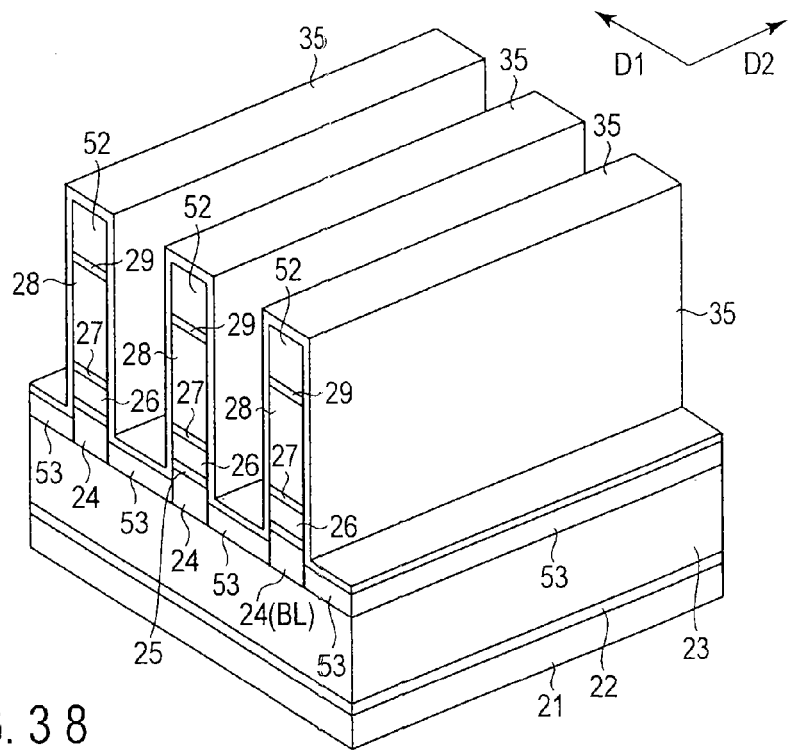

Next, as shown in FIG. 38, a variable resistance material 35 is formed into a film on the structure obtained in FIG. 37 by, for example, ALD.

Figure 39:
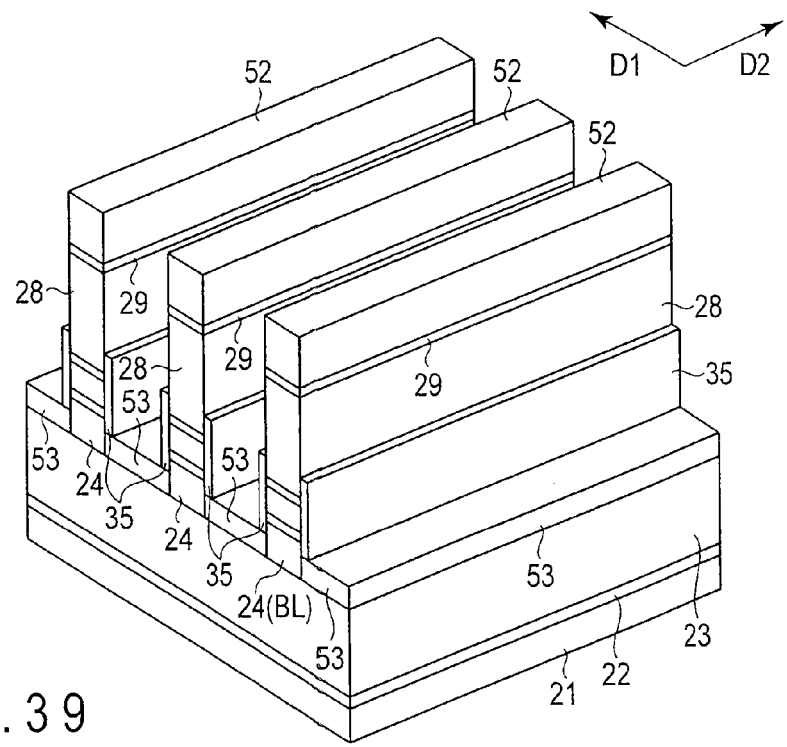

Next, as shown in FIG. 39, an etching-back step is performed to remove an upper portion of the variable resistance material 35. In this case, the variable resistance material 35 positioned between the adjacent memory cells in the first direction is also removed.

Figure 40:
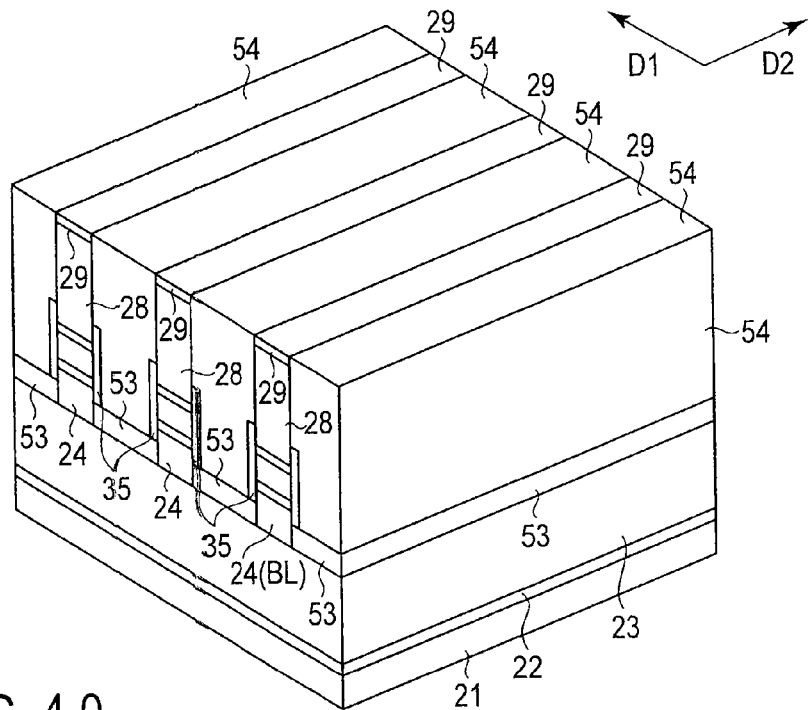

Next, as shown in FIG. 40, an interlayer insulator 54 is formed on the interlayer insulator 23 so as to cover the multilayer structures of the memory cells, and the upper surface of the interlayer insulator 54 is flattened. Moreover, the upper surface of the interlayer insulator 54 and the etching mask layer 52 are removed by, for example, a CMP process or the like. In consequence, the upper surface of the electrode film 29 is exposed.

Figure 41:
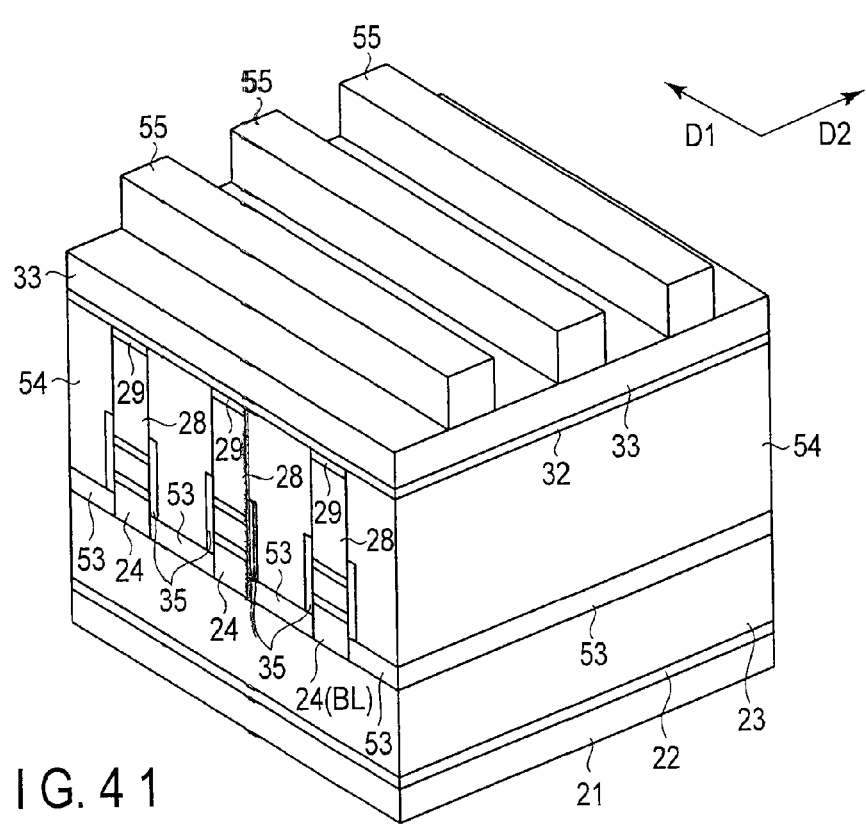

Next, as shown in FIG. 41, an electrode film 32, a word line film 33 and an etching mask layer 55 are sequentially formed on the electrode film 29 and the interlayer insulator 54. Continuously by the lithography step, the etching mask layer 55 is patterned into a pattern of the word lines 1.

Next, as shown in FIG. 42, etching such as reactive ion etching is performed by using the etching mask layer 55 as a mask, and the word line film 33, the electrode film 32, the electrode film 29, the diode layer 28, the electrode film 27, the insulator 26 and the electrode film 25 are simultaneously patterned. In consequence, the word lines (WL) 33 having a stripe shape along a first direction (D2) are formed. Moreover, by the present step, the electrode film 25, the insulator 26, the electrode film 27, the diode layer 28 and the electrode film 29 are separated for each memory cell. Moreover, according to the present step, the variable resistance material 35 is also separated for each memory cell.

Afterward, for example, a coating type interlayer insulator is formed on the whole surface, and a semiconductor memory device is completed by steps which are similar to those of the first embodiment.

3. Effect of the Present Embodiment

As described above, the structure described in the first embodiment can be applied to a case where the directions of the word lines and the bit lines are reversed.

4. Modification Examples of the Present Embodiment

The present embodiment can be modified into various structures. Hereinafter, various modification examples will be described. However, the embodiment can be modified into modification examples which are different from the examples described hereinafter.

For example, in the above embodiment, the variable resistance material 35 between the adjacent memory cells in the second direction is entirely removed in the etching step of FIG. 42. Therefore, the upper surface of the bit line 24 between the memory cells is lower than an interface between the bit line 24 and the electrode film 25. However, this etching step may be stopped at the upper surface of the bit line 24. In this case, part of the variable resistance material 35 remains on the side surfaces of the bit line 24 between the memory cells. That is, the variable resistance materials 35 may be connected to each other between the adjacent memory cells in the second direction. Moreover, this etching step may be stopped at the upper surface of the electrode film 25. In this case, the variable resistance materials 25 are connected to each other between the adjacent memory cells in the second direction.

[Fourth Embodiment]

Next, a memory device according to a fourth embodiment and a fabricating method thereof will be described. The present embodiment has a structure in which in the above second embodiment, directions of word lines 1 and bit lines 2 are replaced. That is, the word lines 1 are provided along a first direction, and the bit lines 2 are provided along a second direction. Another structure is similar to the first embodiment, and hence an only respect that is different from the first embodiment will be described hereinafter.

1. Re: Structure of Memory Cell Array

FIG. 43 is a perspective view showing a structure of a memory cell array of a semiconductor memory device according to the present embodiment.

As shown, a basic structure of the present embodiment is similar to the structure described in the second embodiment with reference to FIG. 23 and FIG. 24. The embodiment is different from the second embodiment in the following respects. That is, the word lines 1 and the bit lines 2 are provided along the first direction and the second direction, respectively; and a variable resistance material 5 is provided on two side surfaces facing each other in a direction along the word lines 1, and is not provided on two side surfaces facing each other in a direction along the bit lines 2, in the two sets of the facing side surfaces of a multilayer structure of each memory cell MC.

2. Re: Fabricating Method of Memory Cell Array

A memory cell array according to the present embodiment can be fabricated by combining the above fabricating steps of the second embodiment with the fabricating steps of the third embodiment. For example, the structure of FIG. 25 of the second embodiment is first obtained. In this case, the mask material 52 of FIG. 35 of the third embodiment is formed in place of the mask material 30. Then, a patterning step is performed as shown in FIG. 36. Afterward, a variable resistance material 35 is formed by the steps of FIG. 29 to FIG. 31, and then the patterning steps of FIG. 40 to FIG. 42 are performed.

3. Effect of the Present Embodiment

As described above, the constitution described in the second embodiment can be applied to a case where the directions of the word lines and the bit lines are reversed.

4. Modification Examples of the Present Embodiment

The present embodiment can be modified into various structures. The embodiment can be modified into modification examples which are similar to the example described in the second embodiment with reference to, for example, FIG. 33 or the like.

[Fifth Embodiment]

Next, a memory device according to a fifth embodiment and a fabricating method thereof will be described. The present embodiment has a structure in which two layers of memory cell arrays 41 described in the above first embodiment with reference to FIG. 12 are stacked.

1. Re: Structure of Memory Cell Array

FIG. 44 and FIG. 45 are a perspective view and a sectional view showing a structure of a memory cell portion 54 of a semiconductor memory device according to the present embodiment.

As shown, the memory cell portion 54 includes two stacked memory cell arrays 41-1 and 41-2. The first-layer memory cell array 41-1 has a structure which is similar to that described in the second embodiment with reference to FIG. 23 and FIG. 24. Moreover, the second-layer memory cell array 41-2 has a structure which is similar to a structure in which bit lines 2 and word lines 1 are replaced as described in the third embodiment with reference to FIG. 34. Furthermore, the two memory cell arrays 41-1 and 41-2 share the word lines 1.

Hereinafter, suffix "1" is attached to reference numerals of layers in the first-layer memory cell array 41-1, and suffix "2" is attached to reference numerals of layers in the second-layer memory cell array 41-2, with the proviso that any suffix is not attached to the reference numerals of the layers shared by the two memory cell arrays 41-1 and 41-2.

Variable resistance elements of memory cells MC1 and MC2 of the memory cell arrays 41-1 and 41-2 are connected to shared word lines 1, and diodes thereof are connected to bit lines 2-1 and 2-2 associated with the memory cell arrays 41-1 and 41-2, respectively. Moreover, a variable resistance material 5 having a function of the variable resistance element is formed between diode layers 3-1 to diodes 3-2 on side walls of multilayer structures of MC1 and MC2. Therefore, the variable resistance material 5 covers at least the side surfaces of insulators 4-1 and 4-2, the side surfaces of electrode films 7-1, 6-1, 9-2 and 8-2 and the side surfaces of the word lines 1. It is to be noted that in the present example, the variable resistance material 5 is formed on two side surfaces of the multilayer structures of the memory cells MC1 and MC2 facing each other in a direction along the bit lines 2-1 and 2-2, and is not formed on two side surfaces thereof facing each other in a direction along the word lines 1.

2. Re: Fabricating Method of Memory Cell Array

Next, a fabricating method of the memory cell array shown in FIG. 44 and FIG. 45 will be described with reference to FIG. 46 to FIG. 52. FIG. 46 to FIG. 52 are perspective views successively showing fabricating steps of a semiconductor memory device according to the present embodiment.

Figure 46:
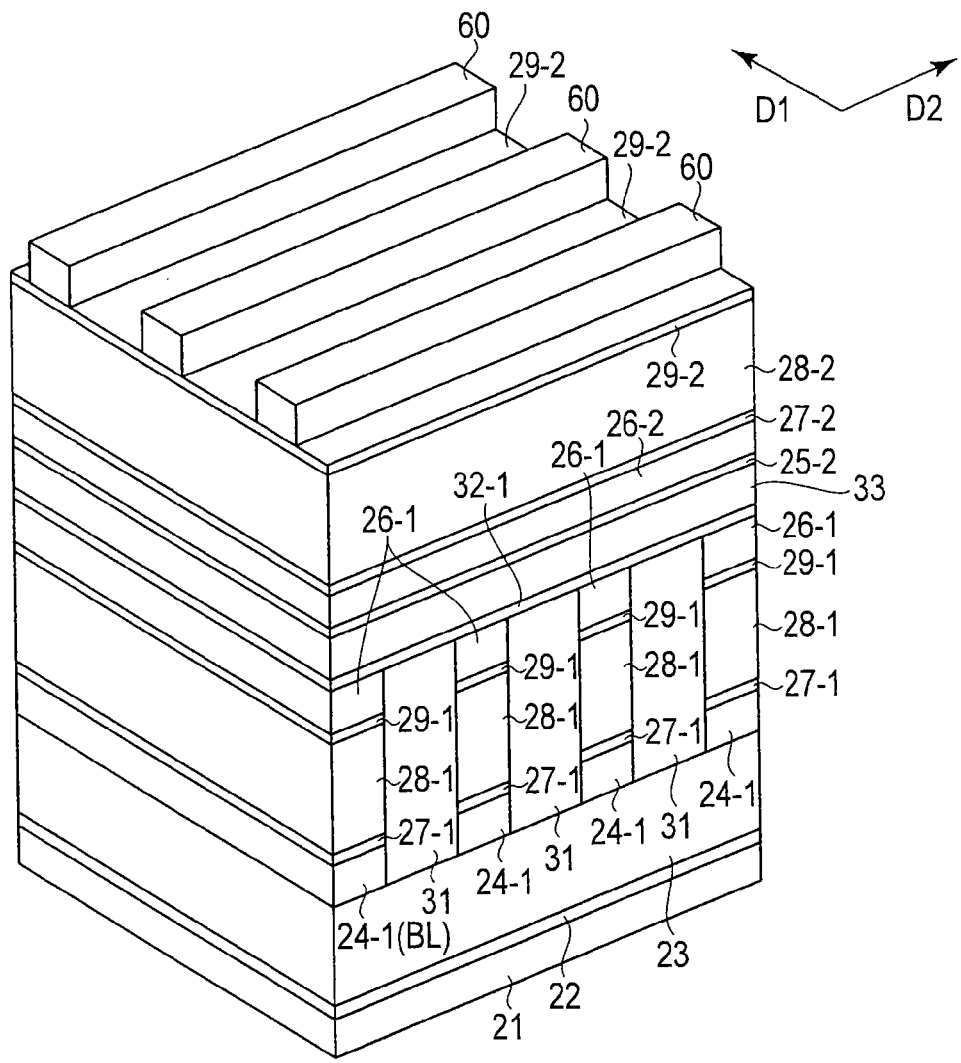
FIG. 46 to FIG. 52 are perspective views successively showing fabricating steps of the memory device according to the fifth embodiment.

First, the structure of FIG. 27 is obtained by the steps described in the second embodiment. Afterward, as shown in FIG. 46, an electrode film 32-1, a word line film 33, an electrode film 25-2, an insulator 26-2, an electrode film 27-2, a diode layer 28-2, an electrode film 29-2 and an etching mask layer 60 are sequentially formed on an insulator 26-1 and an insulator 31. Then, by a lithography step, the etching mask layer 60 is patterned into a pattern of the word lines 1. In consequence, a structure of FIG. 46 is obtained.

Figure 47:
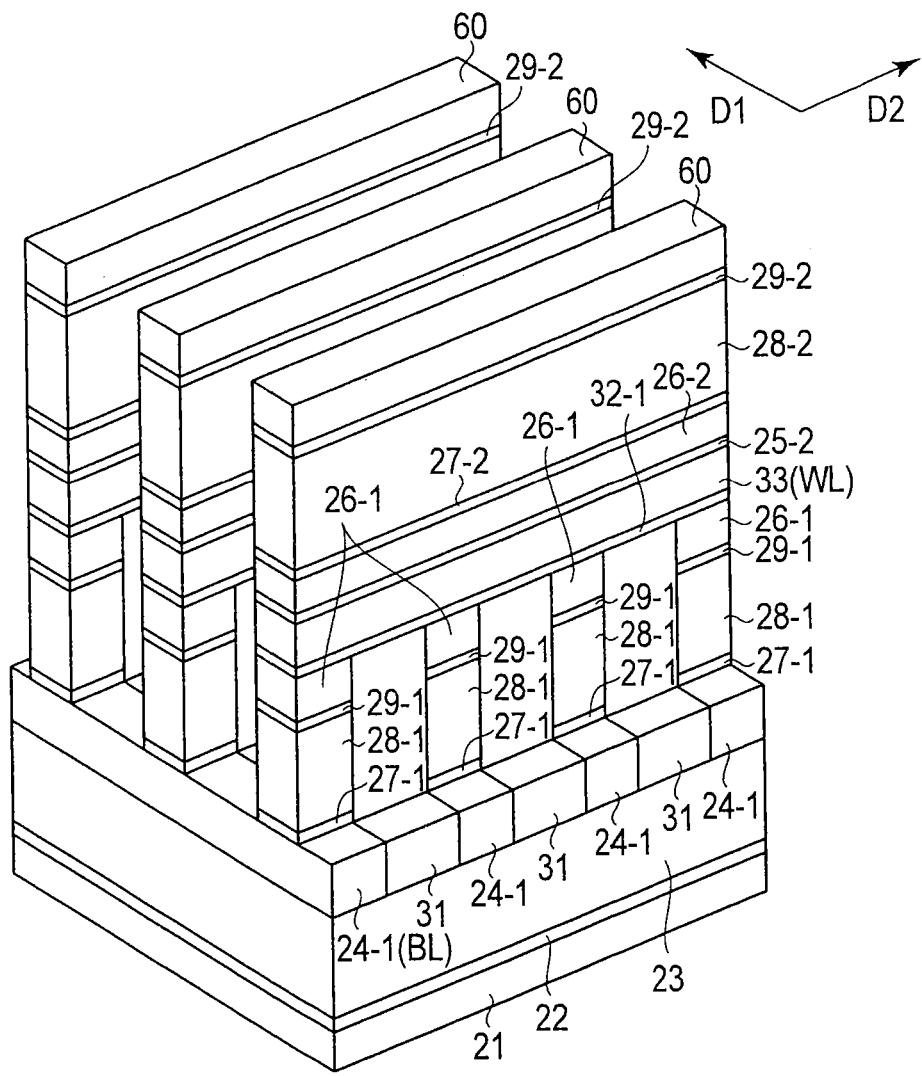

Next, as shown in FIG. 47, etching such as reactive ion etching is performed by using the etching mask layer 60 as a mask, and the electrode film 29-2, the diode layer 28-2, the electrode film 27-2, the insulator 26-2, the electrode film 25-2, the word line film 33, the electrode film 32-1, the insulator 26-1, an electrode film 29-1, a diode layer 28-1 and an electrode film 27-1 are simultaneously patterned. In consequence, the word lines (WL) 33 having a stripe shape along a second direction are formed. Moreover, the insulator 26-1, the electrode film 29-1, the diode layer 28-1 and the electrode film 27-1 are separated for each memory cell MC1.

Figure 48:
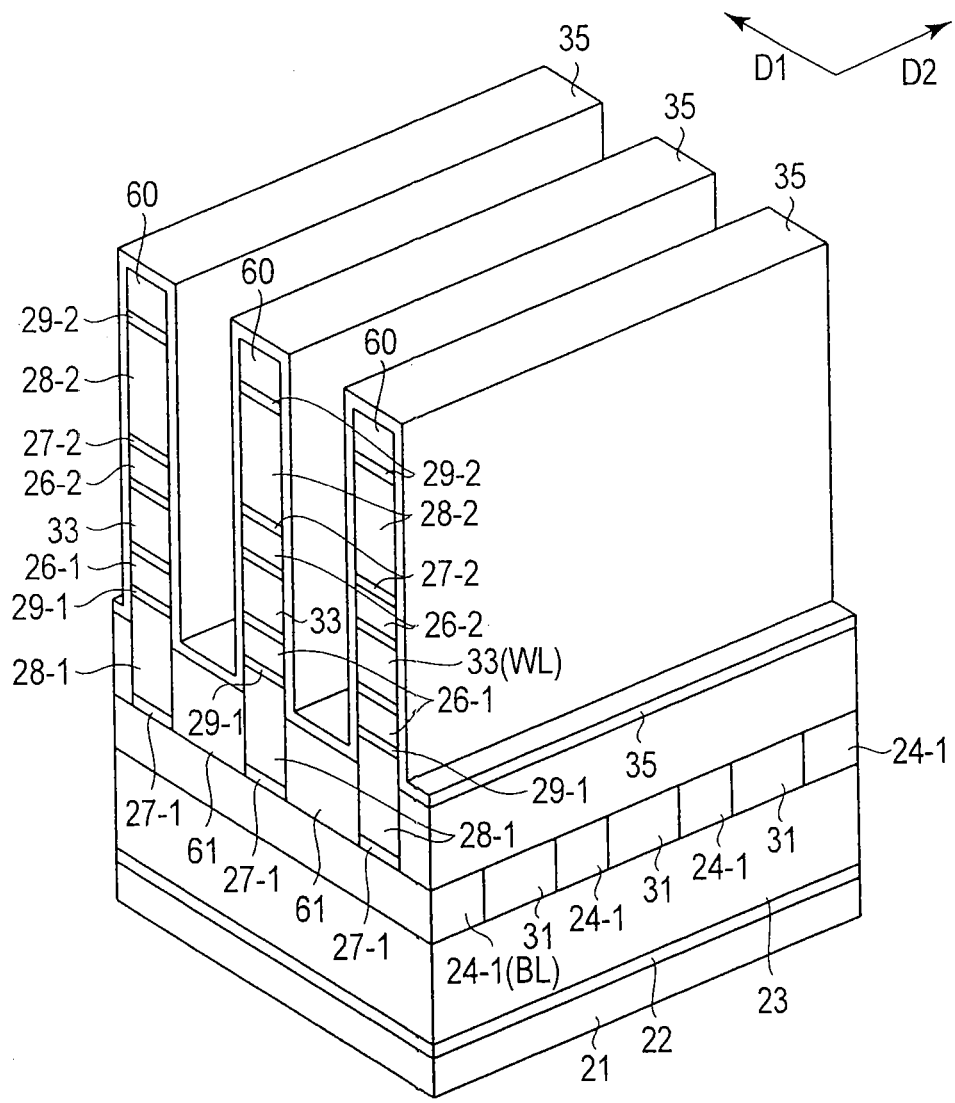

Next, as shown in FIG. 48, an insulator 61 is buried between multilayer structures formed in the step of FIG. 47. The insulator 61 is left between the multilayer structures of the memory cells MC1 so as to expose an upper portion of the diode layer 28-1. Afterward, a variable resistance material 35 is formed into a film on the whole surface by, for example, ALD.

Figure 49:
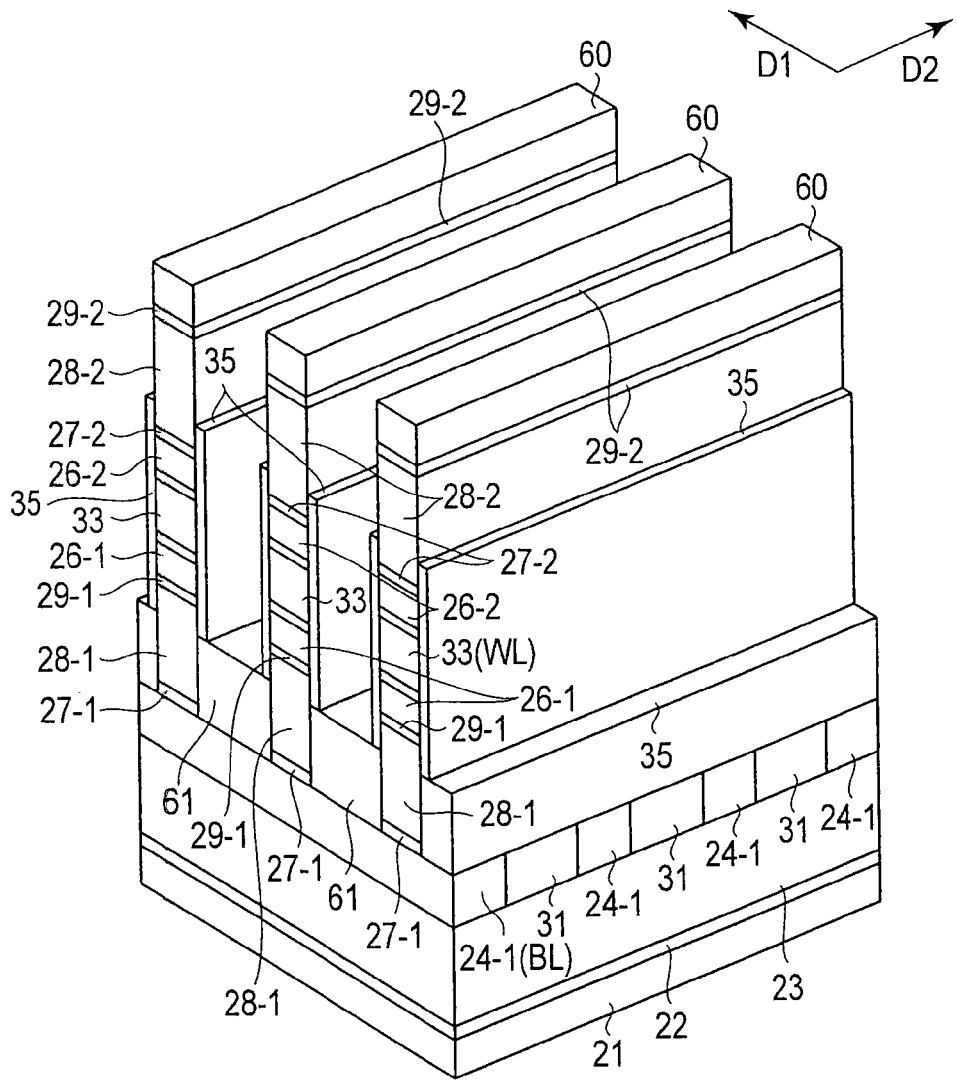

Next, as shown in FIG. 49, an etching-back step is performed to remove an upper portion of the variable resistance material 35. In this case, the variable resistance material 35 positioned between the adjacent memory cells MC1 in a first direction is also removed. Moreover, the variable resistance material 35 is left between the diode layer 28-1 and the diode layer 28-2.

Figure 50:
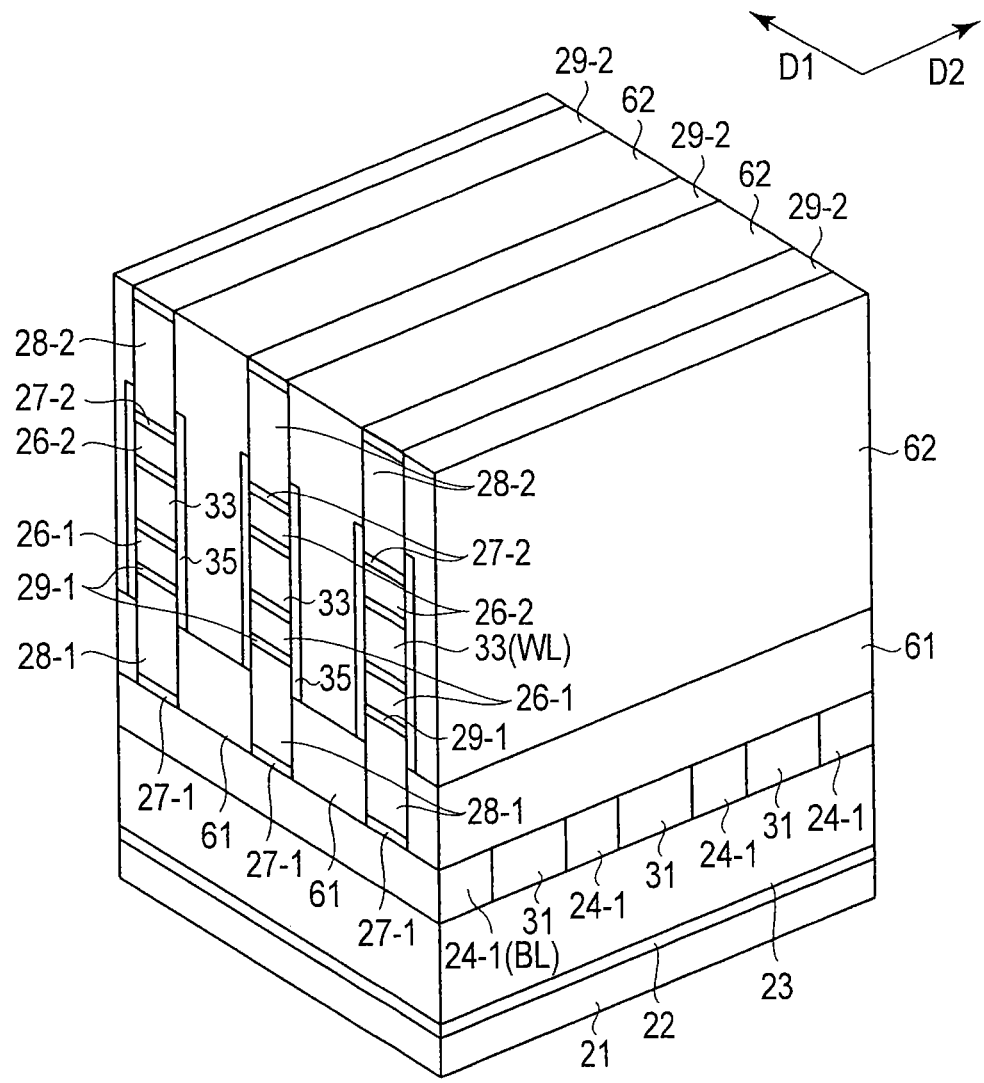

Next, as shown in FIG. 50, an interlayer insulator 62 is formed on the interlayer insulator 61 so as to cover the multilayer structures of the memory cells MC1 and MC2, and the upper surface of the interlayer insulator 62 is flattened. Then, the upper surface of the interlayer insulator 62 and the etching mask layer 60 are removed by, for example, a CMP process or the like. In consequence, the upper surface of the electrode film 29-2 is exposed.

Figure 51:
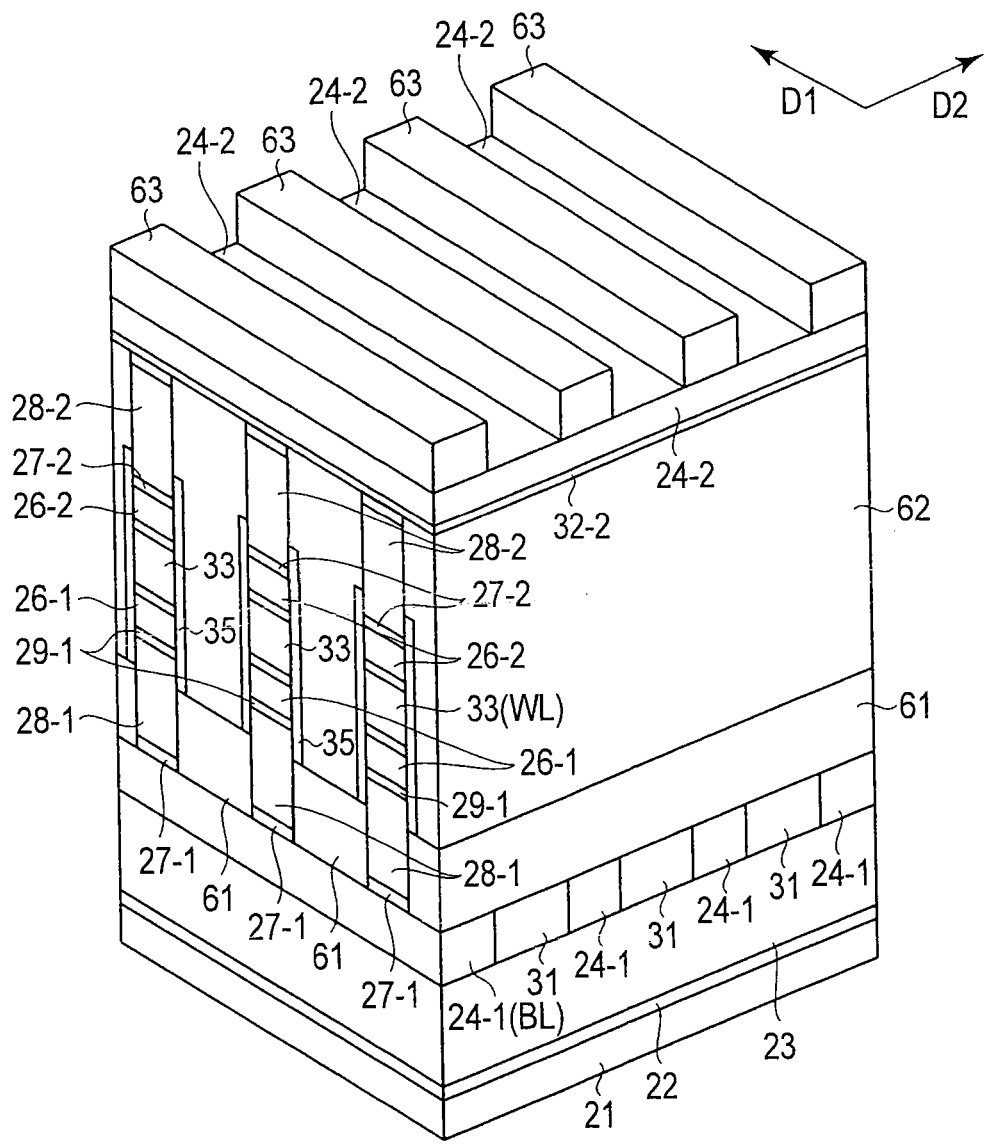

Next, as shown in FIG. 51, an electrode film 32-2, a bit line film 24-2 and an etching mask layer 63 are sequentially formed on the electrode film 29-2 and the interlayer insulator 62. Continuously by the lithography step, the etching mask layer 63 is patterned into a pattern of the bit lines 2-2.

Figure 52:
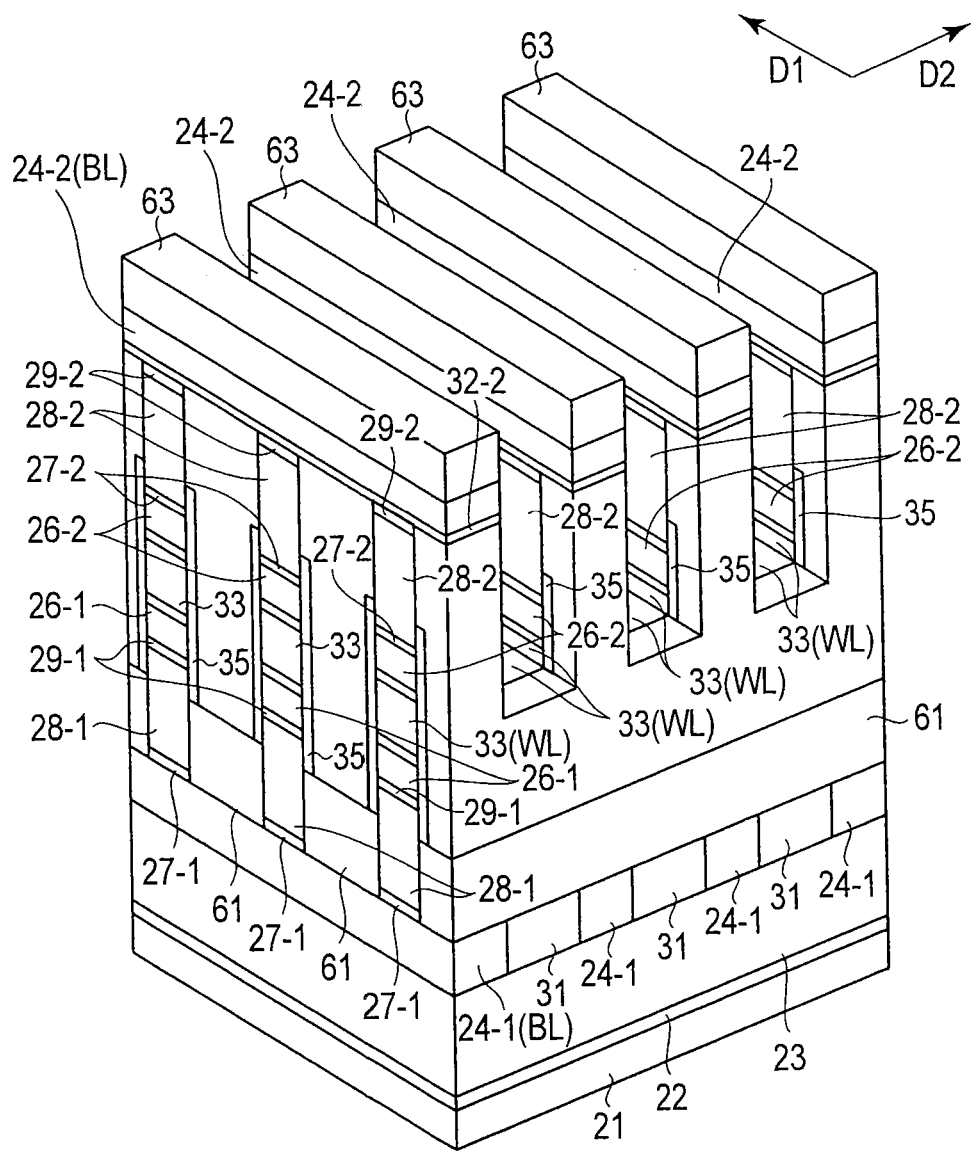

Next, as shown in FIG. 52, etching such as reactive ion etching is performed by using the etching mask layer 63 as a mask, and the bit line film 24-2, the electrode film 32-2, the electrode film 29-2, the diode layer 28-2, the electrode film 27-2, the insulator 26-2, the electrode film 25-2 and the upper surfaces of the word line film 33 are simultaneously patterned. In consequence, the bit lines 24-2 having a stripe shape along the first direction (D2) are formed. Moreover, by the present step, the electrode film 25-2, the insulator 26-2, the electrode film 27-2, the diode layer 28-2 and the electrode film 29-2 are separated for each memory cell MC2. Moreover, by the present step, the variable resistance material 35 is also separated for each memory cell MC2. Additionally, in the memory cell MC1, the variable resistance material 35 is connected to the adjacent variable resistance material in the word line direction.

Afterward, for example, a coating type interlayer insulator is formed on the whole surface, and a semiconductor memory device is completed by steps which are similar to those of the first embodiment.

3. Effect of the Present Embodiment

As described above, the structure described in the above embodiments can be applied to a structure including a plurality of stacked memory cell arrays.

Moreover, according to the present embodiment, the layers included in the two memory cell arrays 41-1 and 41-2 are simultaneously patterned. More specifically, as described with reference to FIG. 46 and FIG. 47, after patterning the layers of the lower-layer memory cell array 41-1 in the first direction, the layers of the upper-layer memory cell array 41-2 are formed. Afterward, the memory cell arrays 41-1 and 41-2 are simultaneously patterned in the second direction. Therefore, a fabricating process can easily be performed.

Furthermore, in the present embodiment, the variable resistance materials 35 of the two memory cell arrays 41-1 and 41-2 can simultaneously be formed as described with reference to FIG. 48 and FIG. 49. Therefore, the number of the fabricating steps can be decreased.

4. Modification Examples of the Present Embodiment

The present embodiment can be modified into various structures. FIG. 53 to FIG. 55 are sectional views of memory cell portions 54 according to modification examples of the present embodiment.

For example, as shown in FIG. 53, the surface of each bit line film 24-1 may be etched in the step of FIG. 47. Moreover, as shown in FIG. 54, each variable resistance material 35 may be formed between one bit line 24-1 and the other bit line BL2. In this case, in the multilayer structures of two memory cells MC1 and MC2, the whole two side surfaces of the cells facing each other in a direction along the bit lines 24 are covered with the variable resistance material 35. The present structure is obtained by forming the variable resistance material 35 without forming any insulator 61 in, for example, FIG. 48.

It is to be noted that FIG. 54 shows an example in which the upper surface of the bit line 24-1 between the memory cells MC1 is etched. Needless to say, the upper surface of the bit line does not have to be etched sometimes. Moreover, the variable resistance material 35 on the bit line 24-1 may be removed in another example.

Moreover, as shown in FIG. 55, the variable resistance material 35 on the insulator 61 may be left in the step of FIG. 49. The present structure can be formed by etching back the variable resistance material 35 while protecting a region to be left with a mask material in FIG. 49.

Furthermore, in the present example, there has been described the example in which two memory cell arrays 41-1 and 41-2 are stacked. However, as shown in the sectional view of the memory cell portion 54 shown in FIG. 56, three or more memory cell arrays may be stacked. In this case, as structures of the memory cells MC1, MC2, . . . , any of the structures described in the above embodiments may be employed. Even in this case, the variable resistance material 35 can simultaneously be processed in two memory cell arrays.

[Sixth Embodiment]

Next, a memory device according to a sixth embodiment and a fabricating method thereof will be described. In the present embodiment, two layers of memory cell arrays are stacked in the same manner as in the fifth embodiment, and the embodiment relates to an example different from the fifth embodiment. More specifically, the embodiment relates to an example in which a variable resistance material 35 is processed for each memory cell array.

1. Re: Structure of Memory Cell Array

FIG. 57 and FIG. 58 are a perspective view and a sectional view showing a structure of a memory cell portion 54 of a semiconductor memory device according to the present embodiment.

As shown, the memory cell portion 54 includes two stacked memory cell arrays 41-1 and 41-2. The first-layer memory cell array 41-1 has a structure which is similar to the structure described in the second embodiment with reference to FIG. 23 and FIG. 24. Moreover, the second-layer memory cell array 41-2 corresponds to a structure in which the structure of FIG. 23 and FIG. 24 is rotated by 90° in a semiconductor substrate plane. In other words, the structure is similar to a structure in which bit lines 2 and word lines 1 are replaced in the fourth embodiment described with reference to FIG. 43. Moreover, the two memory cell arrays 41-1 and 41-2 share the word lines 1.

In the present embodiment, a diode of a memory cell MC1 and a variable resistance element of a memory cell MC2 are connected to bit lines 2-1 and 2-2 associated with memory cells MC1 and MC2, respectively. Moreover, a variable resistance element of the memory cell MC1 and a diode of the memory cell MC2 are connected to the shared word line 1. Furthermore, a variable resistance material 5-1 of the memory cell MC1 is formed between the word line 1 and a diode 3-1 on a side wall of a multilayer structure of the memory cell MC1. Therefore, the variable resistance material 5-1 covers at least the side surface of an insulator 4-1 and the side surfaces of electrode films 7-1 and 6-1. A variable resistance material 5-2 of the memory cell MC2 is formed between a bit line 2-2 and a diode 3-2 on a side wall of a multilayer structure of the memory cell MC2. Therefore, the variable resistance material 5-1 covers at least the side surface of an insulator 4-2 and the side surfaces of electrode films 7-2 and 6-2.

The variable resistance material 5-1 is formed on two side surfaces of the multilayer structure of the memory cell MC1 facing each other in a direction along the bit lines 2-1 and 2-2, and is not formed on two side surfaces facing each other in a direction along the word lines 1. Conversely, the variable resistance material 5-2 is formed on two side surfaces of the multilayer structure of the memory cell MC2 facing each other in a direction along the word lines 1, and is not formed on two side surfaces facing each other in a direction along the bit lines 2-1 and 2-2.

Moreover, the variable resistance materials 5-1 are connected to each other between the memory cells MC1 adjacent to each other in the direction along the word lines 1. Conversely, the variable resistance materials 5-2 are connected to each other between the memory cells MC2 adjacent to each other in the direction along the bit lines 2-1 and 2-2.

It is to be noted that FIG. 58 shows a section of part of a multilayer structure of the memory cells MC1 and MC2. Therefore, in this sectional view, any variable resistance material 5-2 is not seen, but the insulator 4-2 and the electrode films 6-2 and 7-2 seen in this sectional view are covered with the variable resistance materials 5-2 positioned on the sides depicted as closer to, and as farther from the viewer of FIG. 58.

2. Re: Fabricating Method of Memory Cell Array

Next, a fabricating method of the memory cell array shown in FIG. 57 and FIG. 58 will be described with reference to FIG. 59 to FIG. 67. FIG. 59 to FIG. 67 are perspective views successively showing fabricating steps of a semiconductor memory device according to the present embodiment.

First, the structure of FIG. 27 is obtained by the step described in the second embodiment. Afterward, as shown in FIG. 59, an electrode film 32-1, a word line film 33, an electrode film 27-2, a diode layer 28-2, an electrode film 29-2, an insulator 26-2 and an etching mask layer 64 are sequentially formed on an insulator 26-1 and an insulator 31. Then, by a lithography step, the etching mask layer 64 is patterned into a pattern of the word lines 1. In consequence, a structure of FIG. 59 is obtained.

Next, as shown in FIG. 60, etching such as reactive ion etching is performed by using the etching mask layer 60 as a mask, and the insulator 26-2, the electrode film 29-2, the diode layer 28-2, the electrode film 27-2, the word line film 33, the electrode film 32-1, an insulator 26-1, an electrode film 29-1, a diode layer 28-1 and an electrode film 27-1 are simultaneously patterned. In consequence, the word lines (WL) 33 having a stripe shape along a second direction are formed. Moreover, the insulator 26-1, the electrode film 29-1, the diode layer 28-1 and the electrode film 27-1 are separated for each memory cell MC1.

Next, as shown in FIG. 61, an insulator 65 is buried between the multilayer structures formed in the step of FIG. 60. The insulator 65 is left between the multilayer structures of the memory cells MC1 so that upper portions of the diode layers 28-1 are exposed. Afterward, a variable resistance material 35-1 is formed into a film on the whole surface by, for example, ALD.

Figure 62:
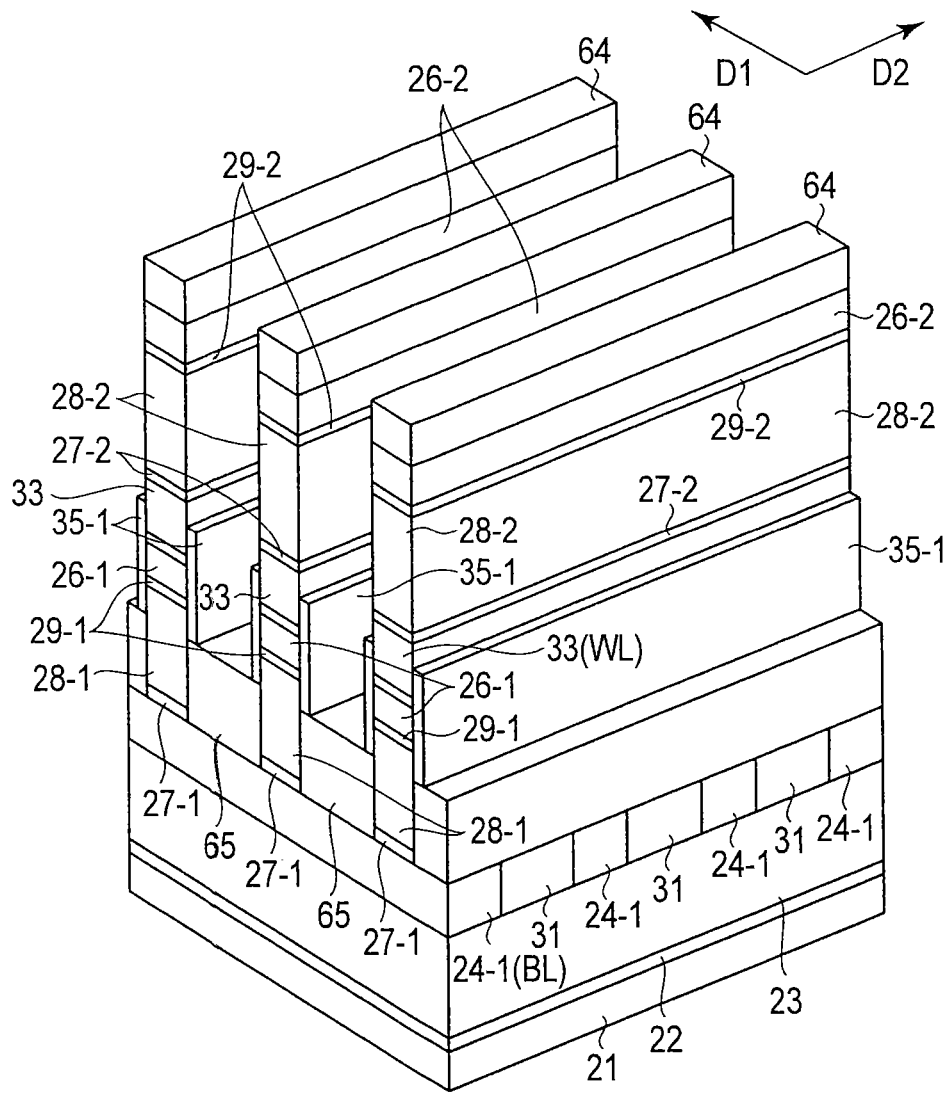

Next, as shown in FIG. 62, an etching-back step is performed to remove an upper portion of the variable resistance material 35-1. In this case, the variable resistance material 35-1 positioned between the adjacent memory cells MC1 in the first direction is also removed. Then, the variable resistance materials 35-1 are left from the diode layers 28-1 to the word lines 33. Moreover, by the present etching-back step, side walls of the diode layers 28-2, the electrode films 29-2 and the insulators 26-2 are exposed.

Figure 63:
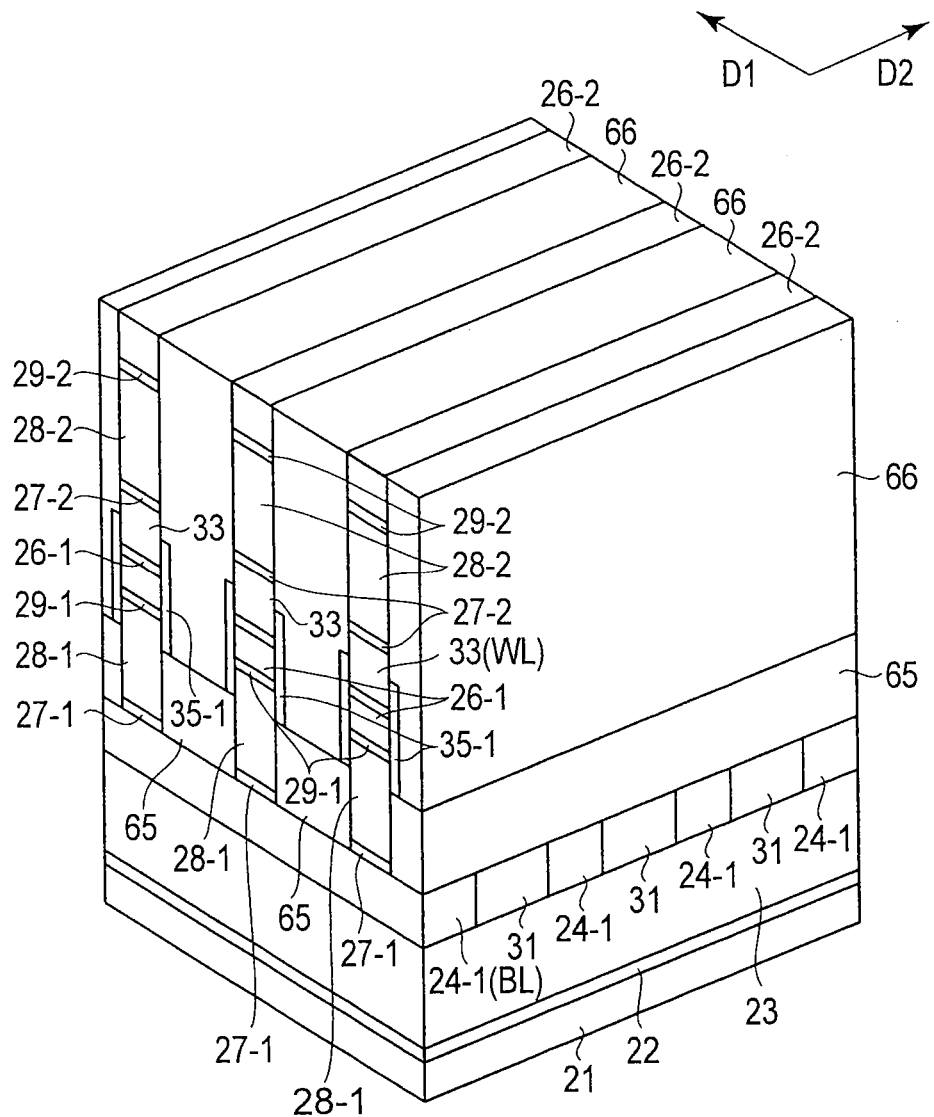

Next, as shown in FIG. 63, interlayer insulators 66 are formed on the insulators 65 so as to cover the multilayer structures of the memory cells MC1 and MC2, and the upper surfaces of the interlayer insulators 66 are flattened. Then, the upper surfaces of the interlayer insulators 66 and the etching mask layer 64 are removed by, for example, a CMP process or the like. In consequence, the upper surfaces of the insulators 26-2 are exposed.

Next, as shown in FIG. 64, on the insulators 26-2 and the interlayer insulators 66, an electrode film 32-2, a bit line film 24-2 and an etching mask layer 67 are sequentially formed. Continuously by the lithography step, the etching mask layer 67 is patterned into a pattern of bit lines 2-2. Afterward, etching such as reactive ion etching is performed by using the etching mask layer 67 as a mask, to simultaneously pattern the bit line film 24-2, the electrode film 32-2, the insulator 26-2, the electrode film 29-2, the diode layer 28-2 and the electrode film 27-2. In this case, for example, the word lines 33 have a function of an etching stopper. In consequence, the bit lines 24-2 having a stripe shape along a first direction D2. Moreover, by the present step, the insulator 26-2, the electrode film 29-2, the diode layer 28-2 and the electrode film 27-2 are separated for each memory cell MC2.

Next, a variable resistance material 35-2 of the memory cell MC2 is formed by a step similar to the step of FIG. 61 and FIG. 62. That is, first as shown in FIG. 65, an insulator 68 is buried between the multilayer structures of the memory cells MC2 formed in the step of FIG. 64. The insulator 68 is left between the multilayer structures of the memory cells MC2 so as to expose upper portions of the diode layers 28-2.

Figure 66:
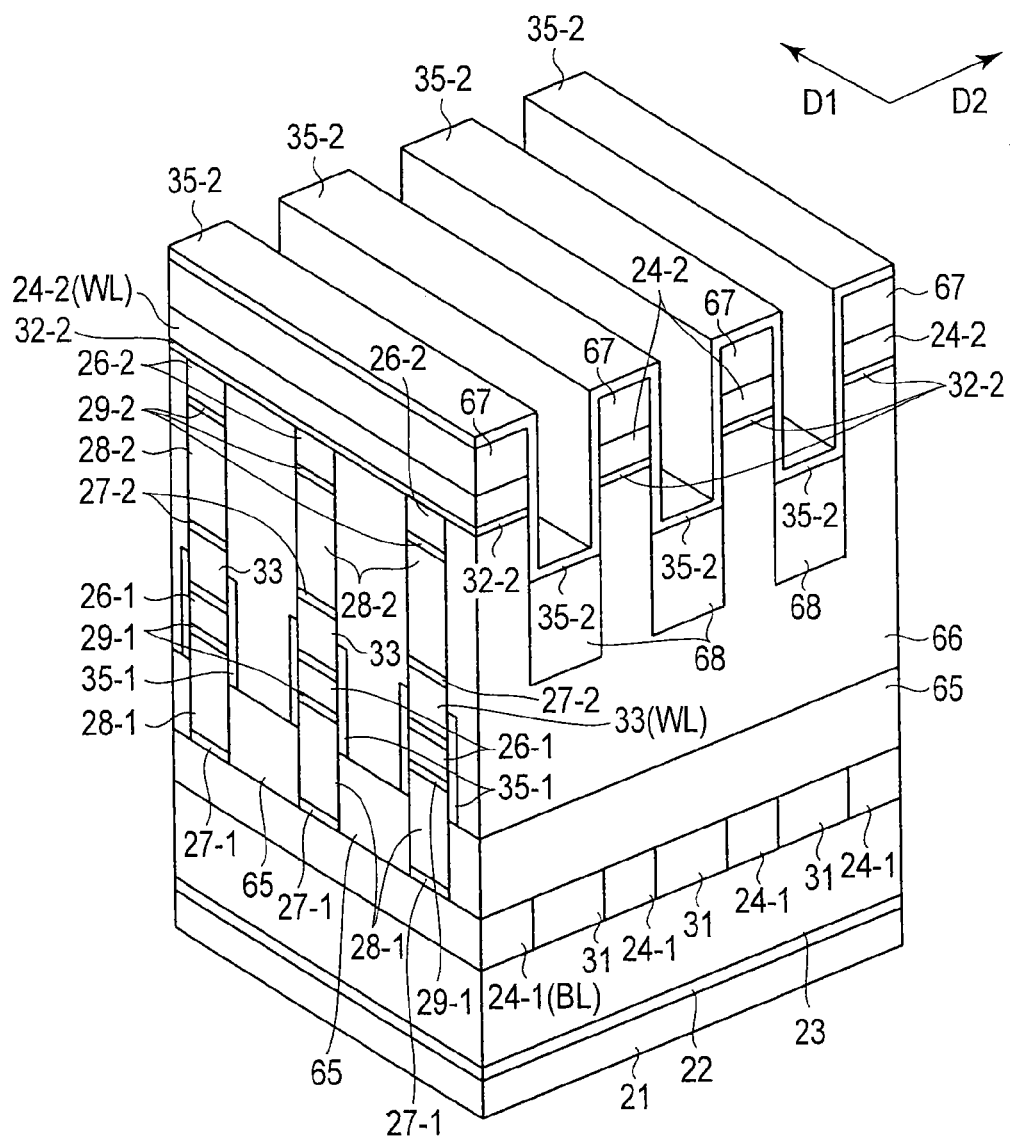

Next, as shown in FIG. 66, the variable resistance material 35-2 is formed into a film on the whole surface by, for example, ALD.

Figure 67:
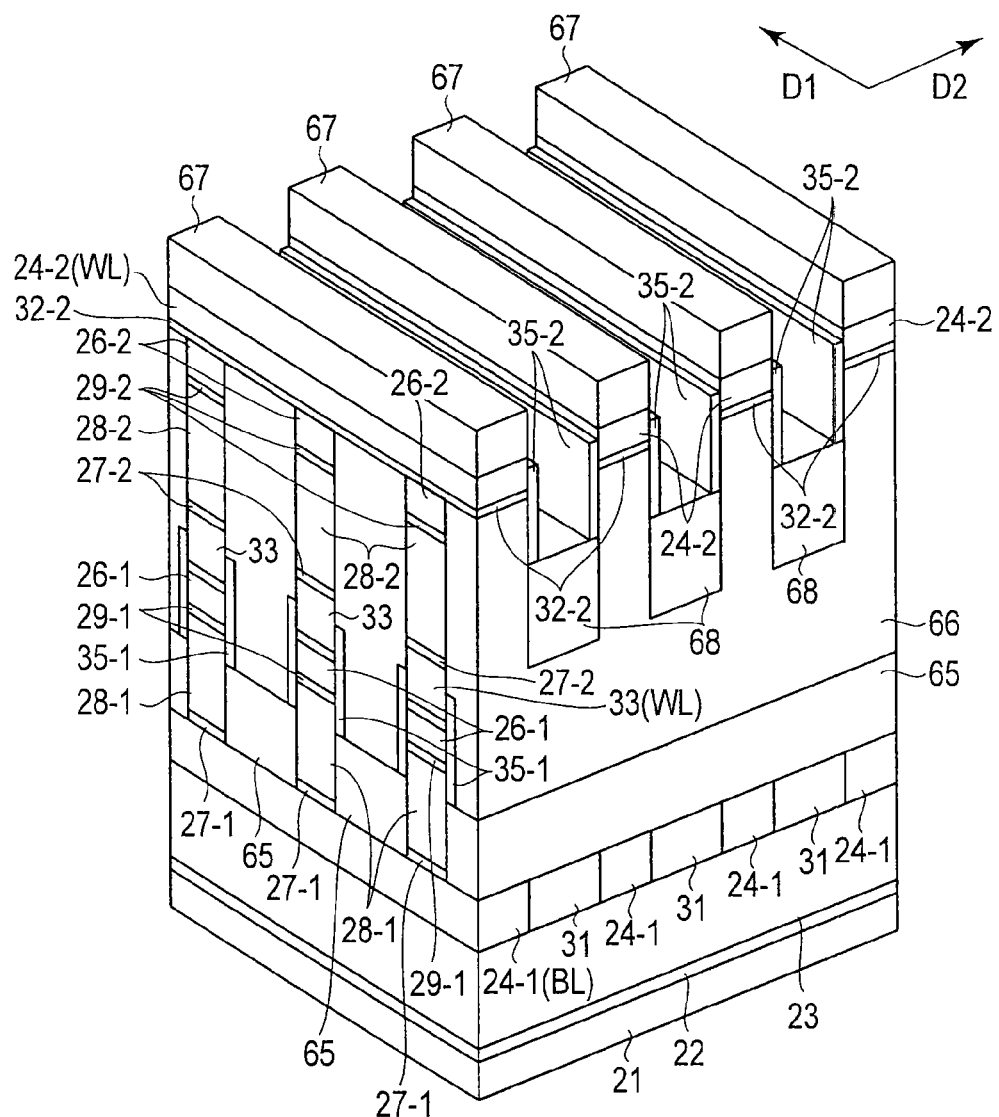

Next, as shown in FIG. 67, an etching-back step is performed to remove an upper portion of the variable resistance material 35-2. In this case, the variable resistance material 35-2 positioned between the adjacent memory cells MC2 in the second direction is also removed. Then, the variable resistance material 35-2 is left from the diode layer 28-2 to the bit line film 24-2. Afterward, for example, a coating type interlayer insulator is formed on the whole surface, and a semiconductor memory device is completed by a step similar to that of the first embodiment.

3. Effect of the Present Embodiment

As described above, also in the present embodiment, layers included in the two memory cell arrays 41-1 and 41-2 are simultaneously patterned. Therefore, a fabricating process can be simplified.

Moreover, in the present embodiment, the variable resistance materials 35-1 and 35-2 of the memory cell arrays 41-1 and 41-2 are formed in separate steps, respectively. In consequence, the variable resistance material 35-1 is formed on the side surfaces facing each other in the direction along the bit lines 2, and the variable resistance material 35-2 is formed on the side surfaces facing each other in the direction along the word lines 1. In the present method, a stacking positional relation between the insulator 26-1 or 26-2 and the diode layer 28-1 or 28-2 is determined only as one relation. That is, the insulator 26-1 or 26-2 is present above the diode layer 28-1 or 28-2, and both the insulator and the diode layer are simultaneously processed. Therefore, a dimensional conversion difference between upper portions of the diode layers 28-1 and 28-2 during processing can be prevented from being different from that between lower portions of the layers (or this can be avoided).

4. Modification Examples of the Present Embodiment

The present embodiment can be modified into various constitutions. For example, in the same manner as in FIG. 53, the surface of the bit line film 24-1 may be etched. Moreover, in the same manner as in FIG. 55, the variable resistance materials 35 between the memory cells MC1 and between the memory cells MC2 may be left.

Moreover, a connection between the diode and the variable resistance element in the memory cell MC1 or MC2 is arbitrary. A structure shown in FIG. 68 and FIG. 69 may be formed. FIG. 68 and FIG. 69 are sectional views of a memory cell portion 54. FIG. 68 shows a structure in which in the structure described above with reference to FIG. 57 and FIG. 58, the connection between the variable resistance element and the diode of the memory cell MC1 is reversed. Moreover, FIG. 69 shows a structure in which in the structure of FIG. 57 and FIG. 58, the connection between the variable resistance element and the diode is inverted in both the memory cells MC1 and MC2.

Furthermore, as described with reference to FIG. 56, three or more memory cell arrays may be stacked. In this case, as the structure of the memory cells MC1, MC2, . . . , any one of the structures described in the above embodiments may be employed. In this case, when the variable resistance material 35 is formed on two side surfaces facing each other in the direction along the bit lines in the odd-numbered (a first layer, a third layer, a fifth layer, . . . ) memory cell arrays, the variable resistance material 35 is formed on two side surfaces facing each other in the direction along the word lines in the even-numbered (a second layer, a fourth layer, a sixth layer, . . . ) memory cell arrays and vice versa.

[Modification Examples and the Like]

As described above, a memory device according to one of the above first to sixth embodiments includes a plurality of first interconnects located in parallel (WL1 or BL2@FIG. 1), a plurality of second interconnects located in parallel (BL2 or WL1@FIG. 1), and a first memory cell (MC@FIG. 2) located in an intersection of one of the first interconnects and one of the second interconnects. The first memory cell includes a first multilayer structure and a first variable resistance layer (the variable resistance layer 5@FIG. 1, 2), the first multilayer structure including a first electrode (the electrode 7 or 8@FIG. 1, 2), a first selector (the diode 3@FIG. 1, 2) and a first insulator (the insulator 4@FIG. 1, 2) which are stacked. Moreover, the first selector and the first variable resistance layer are electrically connected in series between the one of the first interconnects and the one of the second interconnects. Moreover, the first variable resistance layer is formed on a portion of a side surface of the first insulator to cover the portion without covering a residual portion.

Moreover, in the above constitution, the second interconnects (WL1@FIG. 1-2, 23-24) may be positioned higher than the first interconnects (BL2@FIG. 1-2, 23-24), and the first variable resistance layer (the variable resistance layer 5@FIG. 1, 2, 23-24) may be formed on a first side surface pair of the first multilayer structure without being formed on a second side surface pair. Moreover, the first side surface pair may include side surfaces facing each other in a direction along the first interconnects (BL2@FIG. 1-2, 23-24), and the second side surface pair may include side surfaces facing each other in a direction along the second interconnects (WL1@FIG. 1-2, 23-24).

Moreover, in the above constitution, the second interconnects (WL1@FIG. 1-2, 23-24) may be positioned higher than the first interconnects (BL2@FIG. 1-2, 23-24), and the first variable resistance layer (the variable resistance layer 5@FIG. 34, 43) may be formed on a first side surface pair of the first multilayer structure without being formed on a second side surface pair. Moreover, the first side surface pair may include side surfaces facing each other in a direction along the second interconnects (WL1@FIG. 34, 43), and the second side surface pair may include side surfaces facing each other in a direction along the first interconnects (BL2@FIG. 34, 43).

Moreover, the above constitution may further include a plurality of third interconnects (BL2-2@FIG. 44, 57) located in parallel, the third interconnects being in parallel with the first interconnects (BL2-1@FIG. 44, 57); and a second memory cell (MC2@FIG. 44, 57) located in an intersection of the one of the second interconnects (WL1@FIG. 44, 57) and one of the third interconnects (BL2-2@FIG. 44, 57). Moreover, the second memory cell may include a second multilayer structure and a second variable resistance layer (the variable resistance layer 5-2@FIG. 44, 57), the second multilayer structure including a second electrode (the electrode 7-2@FIG. 44, 57), a second selector (the diode 3-2@FIG. 44, 57), and a second insulator (the insulator 4-2@FIG. 44, 57) which are stacked. In this case, the second selector and the second variable resistance layer may be electrically connected in series between the one of the second interconnects (WL1@FIG. 44, 57) and the one of the third interconnects (BL2-2@FIG. 44, 57). The second variable resistance layer may be formed on a portion of a side surface of the second insulator to cover the portion without covering a residual portion.

In the present constitution, the first variable resistance layer (the variable resistance layer 5-1@FIG. 57) may be formed on a first side surface pair of the first multilayer structure without being formed on a second side surface pair. The second variable resistance layer (the variable resistance layer 5-2@FIG. 57) may be formed on a second side surface pair of the second multilayer structure without being formed on a first side surface pair. Here, the first side surface pairs of the first and second multilayer structures may include side surfaces facing each other in one of a first direction and a second direction (the direction Dl along BL), and the second side surface pairs of the first and second multilayer structures may include side surfaces facing each other in the other direction (direction D2 along WL@FIG. 57). Moreover, the first direction may be along the first and third interconnects (BL2-1, 2-2@FIG. 57), and the second direction may be along the second interconnects (WL1@FIG. 57).

The embodiment is not limited to the configuration described above, and can variously be modified. For example, in all the examples described above, the bit lines may be replaced with the word lines.

Moreover, in the first and second embodiments, after obtaining the structure of FIG. 4, a variable resistance material may be formed before performing the step of FIG. 5. In this case, the variable resistance material is formed on two side surfaces facing each other in the word line direction. Furthermore, in the third and fourth embodiments, the variable resistance material may be formed after the step of FIG. 42. In this case, the variable resistance material is formed on two side surfaces facing each other in the bit line direction.

Furthermore, in the first to fourth and sixth embodiments, the variable resistance material may be formed on the whole two side surfaces of the multilayer structure of the memory cell MC as in the example of FIG. 54. Moreover, as described in part of the embodiments, the variable resistance material 35 may be connected in common between the adjacent memory cells in the first direction, or may be connected in common between the adjacent memory cells in the second direction. Even if the variable resistance materials 35 are continuously provided, any problem does not occur in actual use, as long as a space between the materials is larger than a portion having the strongest electric field during writing (SET) and erasing (RESET) data, and "forming." In the present embodiment, the portion having the strongest electric field is a side wall portion of each insulator 4. However, the variable resistance material 35 in this portion has a film thickness of several nanometers, a space between the adjacent memory cells is usually 10 nm or more, and hence any problem does not occur. It is to be noted that the "forming" is a treatment for forming the variable resistance material 35. More specifically, the forming is a treatment of applying a high voltage to this insulator to impart variable resistance characteristics to the insulator. According to the present treatment, the insulator performs a function of the variable resistance material.

Moreover, in the above embodiments, the insulator 4 may be interposed between the adjacent memory cells MC in a direction different from the direction in which the two side surfaces provided with the variable resistance materials face each other. For example, in the second embodiment, the insulator 26 may be formed in the step of FIG. 28 in place of the step of FIG. 25. In the present structure, the insulator 26 has a stripe shape along the second direction in the same manner as in the electrode film 29 and the word lines 33. Even in this case, the insulator 26 does not perform a function of a current path of each memory cell MC, and hence any problem does not occur in practical use.

Moreover, the bit lines do not have to cross the word lines at right angles, as long as the lines have different directions. Moreover, a sectional shape of the multilayer structure of each memory cell is not limited to a quadrangular shape, and the section may have another shape such as a polygonal shape or a circular shape. Even in this case, the variable resistance material 35 may be formed only in part of the insulator 4, and each diode may be connected to the first or second interconnect via the variable resistance material. Furthermore, the connecting relation between the diode and the variable resistance element is not limited to the relation described above, and directions of an anode and a cathode of each diode can appropriately be selected.

Furthermore, in the above embodiment, specific examples of the material of each layer have been described, but another material may appropriately be used, and the fabricating steps can be replaces if possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A memory device comprising:
a plurality of first interconnects located in parallel;
a plurality of second interconnects located in parallel; and
a first memory cell located in an intersection of one of the first interconnects and one of the second interconnects,
wherein the first memory cell includes a first multilayer structure and a first variable resistance layer, the first multilayer structure including a first electrode, and a first insulator which are stacked, the first electrode and the first variable resistance layer are electrically connected in series between the one of the first interconnect and the one of the second interconnect, and the first variable resistance layer is formed on a portion of a side surface of the first insulator to cover the portion without covering a residual portion.

2. The device according to claim 1, wherein the second interconnects are positioned higher than the first interconnects, the first variable resistance layer is formed on a first side surface pair of the first multilayer structure without being formed on a second side surface pair, the first side surface pair including side surfaces facing each other in a direction along the first interconnects, the second side surface pair including side surfaces facing each other in a direction along the second interconnects.

3. The device according to claim 1, wherein the second interconnects are positioned higher than the first interconnects, the first variable resistance layer is formed on a first side surface pair of the first multilayer structure without being formed on a second side surface pair, the first side surface pair including side surfaces facing each other in a direction along the second interconnects, the second side surface pair including side surfaces facing each other in a direction along the first interconnects.

4. The device according to claim 1, further comprising:

a plurality of third interconnects located in parallel, the third interconnects being in parallel with the first interconnects; and a second memory cell located in an intersection of the one of the second interconnects and one of the third interconnects, wherein the second memory cell includes a second multilayer structure and a second variable resistance layer, the second multilayer structure including a second electrode, and a second insulator which are stacked, the second electrode and the second variable resistance layer are electrically connected in series between the one of the second interconnects and the one of the third interconnects, and the second variable resistance layer is formed on a portion of a side surface of the second insulator to cover the portion without covering a residual portion.

5. The device according to claim 4, wherein the first variable resistance layer is formed on a first side surface pair of the first multilayer structure without being formed on a second side surface pair, the second variable resistance layer is formed on a second side surface pair of the second multilayer structure without being formed on a first side surface pair, the first side surface pairs of the first and second multilayer structures including side surfaces facing each other in one of a first direction and a second direction, the first direction being along the first and third interconnects, the second direction being along the second interconnects, and the second side surface pairs of the first and second multilayer structures including side surfaces facing each other in another direction.

6. The device according to claim 1, wherein a breakdown voltage of the first insulator with respective to a stacking direction is higher than a voltage required to change a resistance state of the first variable resistance layer.

7. The device according to claim 1, wherein the first variable resistance layer is formed by atomic layer deposition.

8. The device according to claim 1, further comprising:

a first selection unit configured to select one of the first interconnects;

a second selection unit configured to select one of the second interconnects;

a first driver configured to apply a first voltage and a second voltage to selected one of the first interconnects and unselected one of the first interconnects;

a second driver configured to apply a third voltage and a fourth voltage to selected one of the second interconnects and unselected one of the second interconnects; and a controller configured to control a data writing operation into the first memory cell and a data reading operation from the first memory cell, the controller setting the first to fourth voltages to voltages for data writing to change a resistance of the variable resistance layer of the selected first memory cell in the data writing operation, the controller setting the first to fourth voltages to voltages for data reading to detect a resistance, as the memory state, of the variable resistance layer of the selected first memory cell in the data read operation.

9. The device according to claim 1, wherein the first multilayer structure includes a second electrode, the first insulator, and the first electrode which are sequentially stacked, the first electrode is contacted with the one of the second interconnects, and the first variable resistance layer is continuously formed between the first electrode and the second electrode.

10. The device according to claim 1, wherein the first multilayer structure includes a second electrode, the first insulator, and the first electrode which are sequentially stacked, the second electrode is contacted with the one of the second interconnects, and the first variable resistance layer is continuously formed between the first electrode and the second electrode.

* * * * *